(12) United States Patent
Nishikawa et al.

(10) Patent No.: US 10,741,535 B1
(45) Date of Patent: Aug. 11, 2020

(54) BONDED ASSEMBLY CONTAINING MULTIPLE MEMORY DIES SHARING PERIPHERAL CIRCUITRY ON A SUPPORT DIE AND METHODS FOR MAKING THE SAME

(71) Applicant: SANDISK TECHNOLOGIES LLC, Addison, TX (US)

(72) Inventors: Masatoshi Nishikawa, Nagoya (JP); Hardwell Chibvongodze, Hiratsuka (JP)

(73) Assignee: SANDISK TECHNOLOGIES LLC, Addison, TX (US)

( * ) Notice: Subject to any disclaimer, the term of this patent is extended or adjusted under 35 U.S.C. 154(b) by 0 days.

(21) Appl. No.: 16/275,668

(22) Filed: Feb. 14, 2019

(51) Int. Cl.
*H01L 25/065* (2006.01)
*G11C 16/04* (2006.01)
(Continued)

(52) U.S. Cl.
CPC .............. *H01L 25/18* (2013.01); *G11C 16/16* (2013.01); *G11C 16/26* (2013.01); *H01L 23/5226* (2013.01); *H01L 23/5283* (2013.01); *H01L 23/5383* (2013.01); *H01L 23/5386* (2013.01); *H01L 24/03* (2013.01); *H01L 24/09* (2013.01); *H01L 24/16* (2013.01); *H01L 24/48* (2013.01); *H01L 24/73* (2013.01);
(Continued)

(58) Field of Classification Search
None
See application file for complete search history.

(56) References Cited

U.S. PATENT DOCUMENTS

| 5,555,519 A | 9/1996 | Takashima et al. |
| 5,915,167 A | 6/1999 | Leedy |

(Continued)

FOREIGN PATENT DOCUMENTS

| CN | 1218960 | 6/1999 |
| CN | 109075170 A | 12/2018 |
| WO | WO2018071143 A2 | 4/2018 |

OTHER PUBLICATIONS

Endoh, T. et al., "Novel Ultra High Density Flash Memory with a Stacked-Surrounding Gate Transistor (S-GT) Structured Cell," IEDM Proc., pp. 33-36, (2001).

(Continued)

*Primary Examiner* — Robert K Carpenter
(74) *Attorney, Agent, or Firm* — The Marbury Law Group, PLLC

(57) ABSTRACT

A first memory die includes an array of first memory stack structures and first bit lines. A second memory die includes an array of second memory stack structures and second bit lines electrically connected to a respective subset of the second drain regions. A support die is provided, which includes a peripheral circuitry for operating the array of first memory stack structures and the array of second memory stack structures. The peripheral circuitry includes a plurality of sense amplifiers configured to make switchable electrical connections to a set of bit lines selected from the first bit lines and the second bit lines. The first memory die is bonded to the support die, and the second memory die is bonded to the first memory die. The peripheral circuitry in the support die may be shared between the first memory die and the second memory die.

14 Claims, 36 Drawing Sheets

(51) Int. Cl.

| | | |
|---|---|---|
| *H01L 23/00* | (2006.01) | |
| *H01L 25/18* | (2006.01) | |
| *H01L 27/11582* | (2017.01) | |
| *H01L 27/11565* | (2017.01) | |
| *H01L 27/11573* | (2017.01) | |
| *H01L 27/1157* | (2017.01) | |
| *H01L 23/522* | (2006.01) | |
| *H01L 23/528* | (2006.01) | |
| *H01L 23/538* | (2006.01) | |
| *G11C 16/16* | (2006.01) | |
| *G11C 16/26* | (2006.01) | |
| *H01L 27/11519* | (2017.01) | |
| *H01L 27/11524* | (2017.01) | |
| *H01L 27/11526* | (2017.01) | |
| *H01L 27/11556* | (2017.01) | |

(52) U.S. Cl.
CPC .... *H01L 27/1157* (2013.01); *H01L 27/11565* (2013.01); *H01L 27/11573* (2013.01); *H01L 27/11582* (2013.01); *H01L 27/11519* (2013.01); *H01L 27/11524* (2013.01); *H01L 27/11526* (2013.01); *H01L 27/11556* (2013.01); *H01L 2224/73207* (2013.01)

(56) References Cited

U.S. PATENT DOCUMENTS

| | | | |
|---|---|---|---|
| 5,917,744 | A | 6/1999 | Kirihata et al. |
| 5,966,315 | A | 10/1999 | Muller et al. |
| 6,829,154 | B1 | 12/2004 | Kang |
| 8,760,957 | B2 | 6/2014 | Lee et al. |
| 9,633,742 | B2 | 4/2017 | Desai et al. |
| 9,786,681 | B1 | 10/2017 | Ariyoshi |
| 9,853,038 | B1 | 12/2017 | Cui |
| 9,935,050 | B2 * | 4/2018 | Dunga ................ H01L 27/2481 |
| 9,985,098 | B2 | 5/2018 | Matsumoto et al. |
| 10,008,570 | B2 | 6/2018 | Yu et al. |
| 10,020,363 | B2 | 7/2018 | Ogawa et al. |
| 10,115,681 | B1 | 10/2018 | Ariyoshi |
| 2013/0258772 | A1 | 10/2013 | Lee et al. |
| 2015/0078080 | A1 | 3/2015 | Lee |
| 2015/0193299 | A1 | 7/2015 | Hyun et al. |
| 2015/0371925 | A1 | 12/2015 | Thimmegowda et al. |
| 2016/0012903 | A1 | 1/2016 | Desai et al. |
| 2017/0287926 | A1 | 10/2017 | Ariyoshi |
| 2017/0294377 | A1 | 10/2017 | Dunga et al. |
| 2018/0122904 | A1 | 5/2018 | Matsumoto et al. |
| 2018/0122905 | A1 | 5/2018 | Ogawa et al. |
| 2018/0122906 | A1 | 5/2018 | Yu et al. |
| 2018/0151497 | A1 | 5/2018 | Makala et al. |
| 2019/0043836 | A1 | 2/2019 | Fastow et al. |

OTHER PUBLICATIONS

U.S. Appl. No. 15/873,101, filed Jan. 17, 2018, SanDisk Technologies LLC.
U.S. Appl. No. 15/892,648, filed Feb. 9, 2018, SanDisk Technologies LLC.
U.S. Appl. No. 15/902,169, filed Feb. 22, 2018, SanDisk Technologies LLC.
U.S. Appl. No. 15/928,340, filed Mar. 22, 2018, SanDisk Technologies LLC.
U.S. Appl. No. 15/928,407, filed Mar. 22, 2018, SanDisk Technologies LLC.
U.S. Appl. No. 15/950,505, filed Apr. 11, 2018, SanDisk Technologies LLC.
U.S. Appl. No. 15/950,616, filed Apr. 11, 2018, SanDisk Technologies LLC.
U.S. Appl. No. 15/960,267, filed Apr. 24, 2018, SanDisk Technologies LLC.
U.S. Appl. No. 15/979,885, filed May 15, 2018, SanDisk Technologies LLC.
U.S. Appl. No. 16/142,644, filed Sep. 26, 2018, SanDisk Technologies LLC.
U.S. Appl. No. 16/213,180, filed Dec. 7, 2018, SanDisk Technologies LLC.
U.S. Appl. No. 16/213,382, filed Dec. 7, 2018, SanDisk Technologies LLC.
U.S. Appl. No. 16/231,752, filed Dec. 24, 2018, SanDisk Technologies LLC.
U.S. Appl. No. 16/242,216, filed Jan. 8, 2019, SanDisk Technologies LLC.
U.S. Appl. No. 16/243,469, filed Jan. 9, 2019, SanDisk Technologies LLC.
U.S. Appl. No. 16/248,923, filed Jan. 16, 2019, SanDisk Technologies LLC.
U.S. Appl. No. 16/249,423, filed Jan. 16, 2019, SanDisk Technologies LLC.
U.S. Appl. No. 16/255,413, filed Jan. 23, 2019, SanDisk Technologies LLC.
U.S. Appl. No. 16/269,301, filed Feb. 6, 2019, SanDisk Technologies LLC.
U.S. Appl. No. 16/274,687, filed Feb. 13, 2019, SanDisk Technologies LLC.
Notification of Transmittal of the International Search Report and Written Opinion of the International Search Authority or International Patent Application No. PCT/US2019/062903, dated Mar. 15, 2020, 11 pages.
Notification of Transmittal of the International Search Report and Written Opinion of the International Search Authority or International Patent Application No. PCT/US2019/062573, dated Mar. 9, 2020, 9 pages.

\* cited by examiner

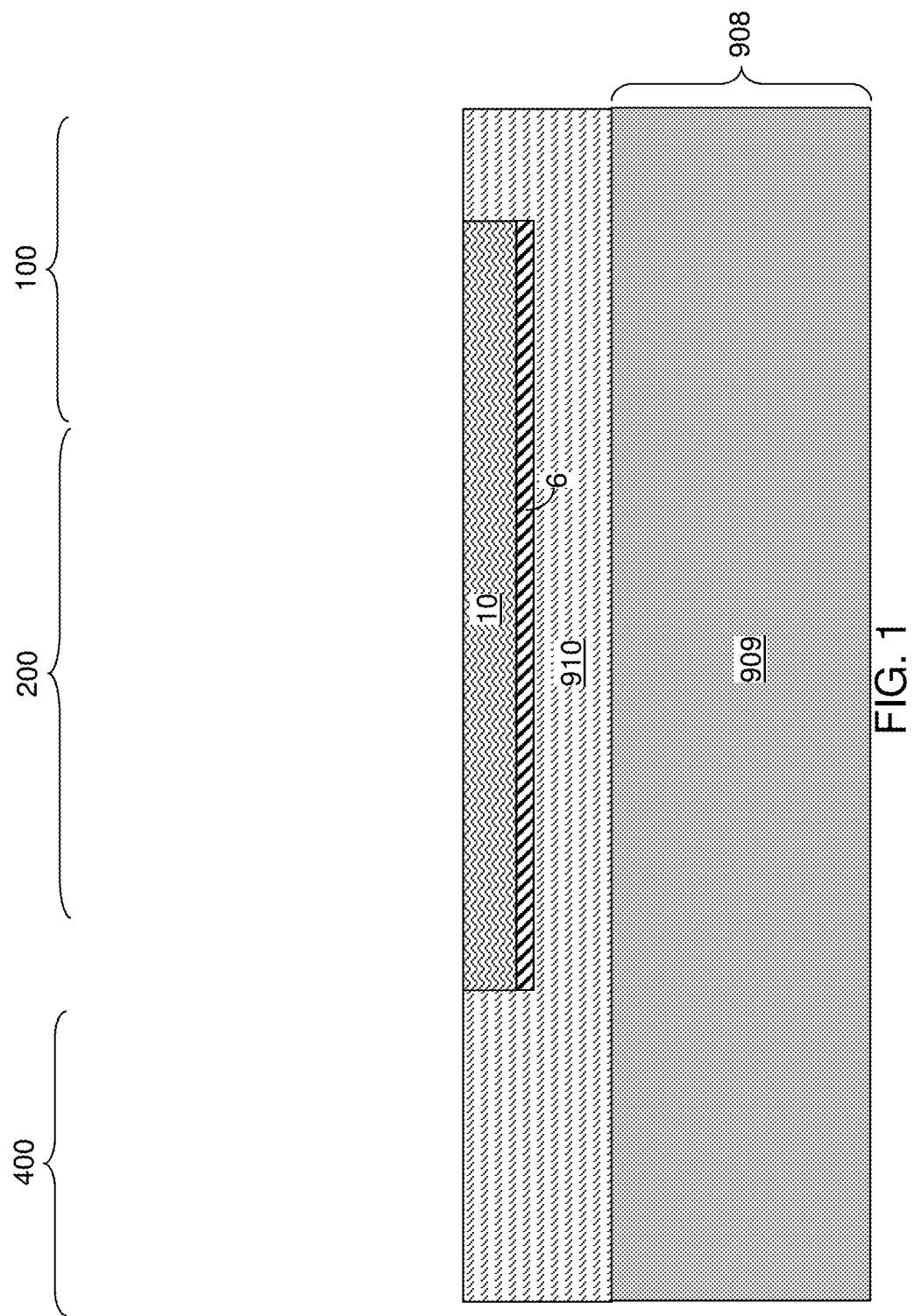

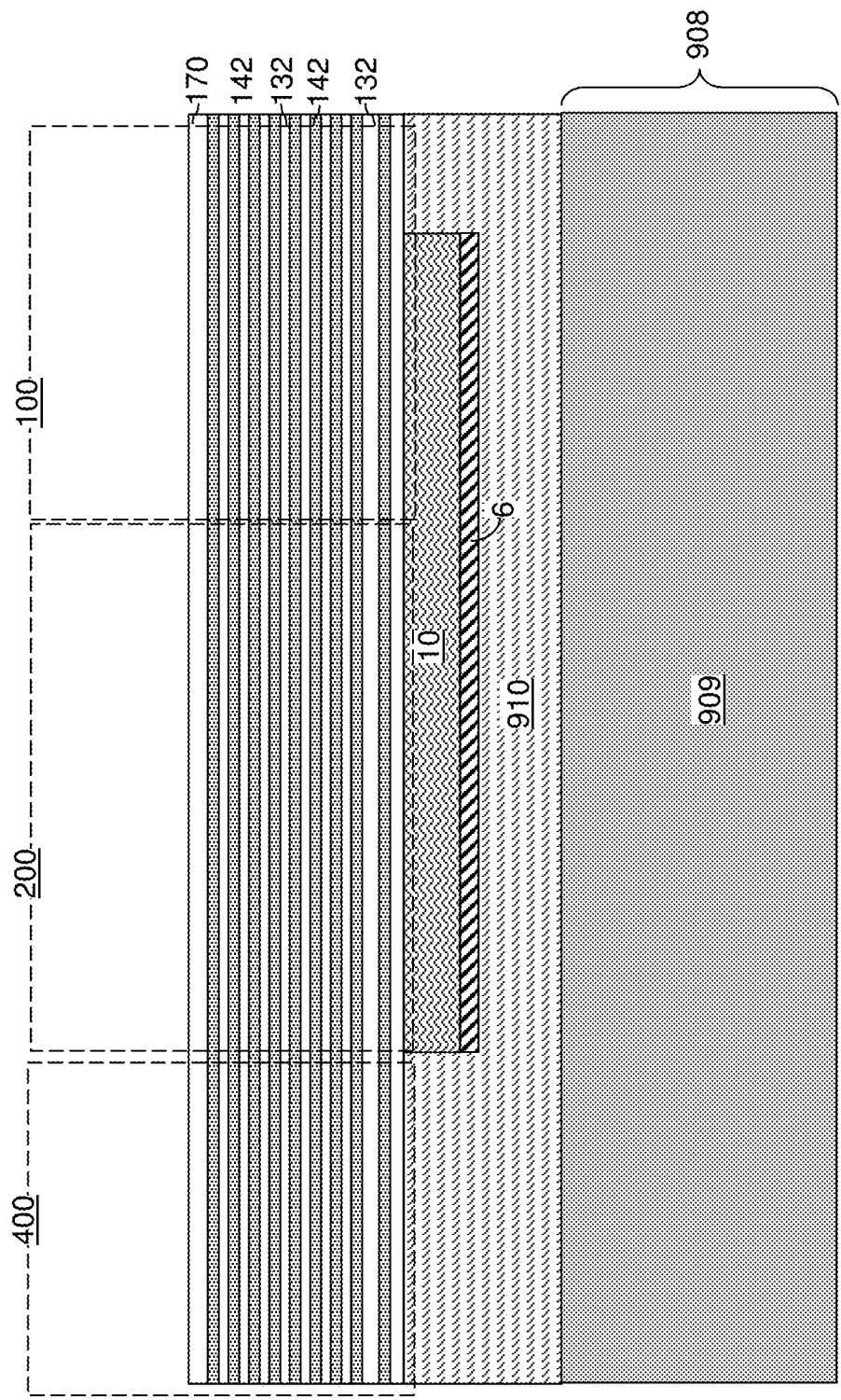

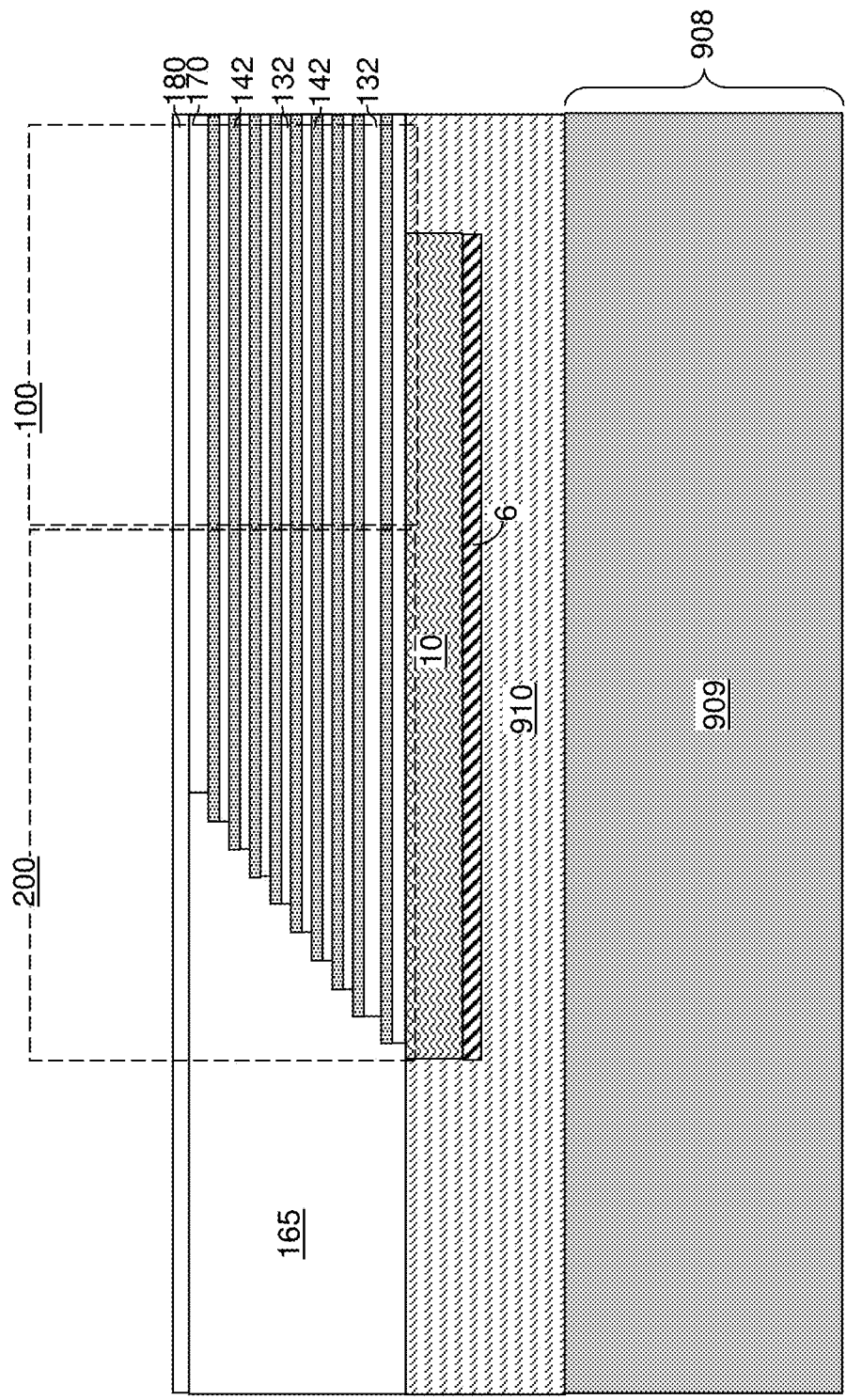

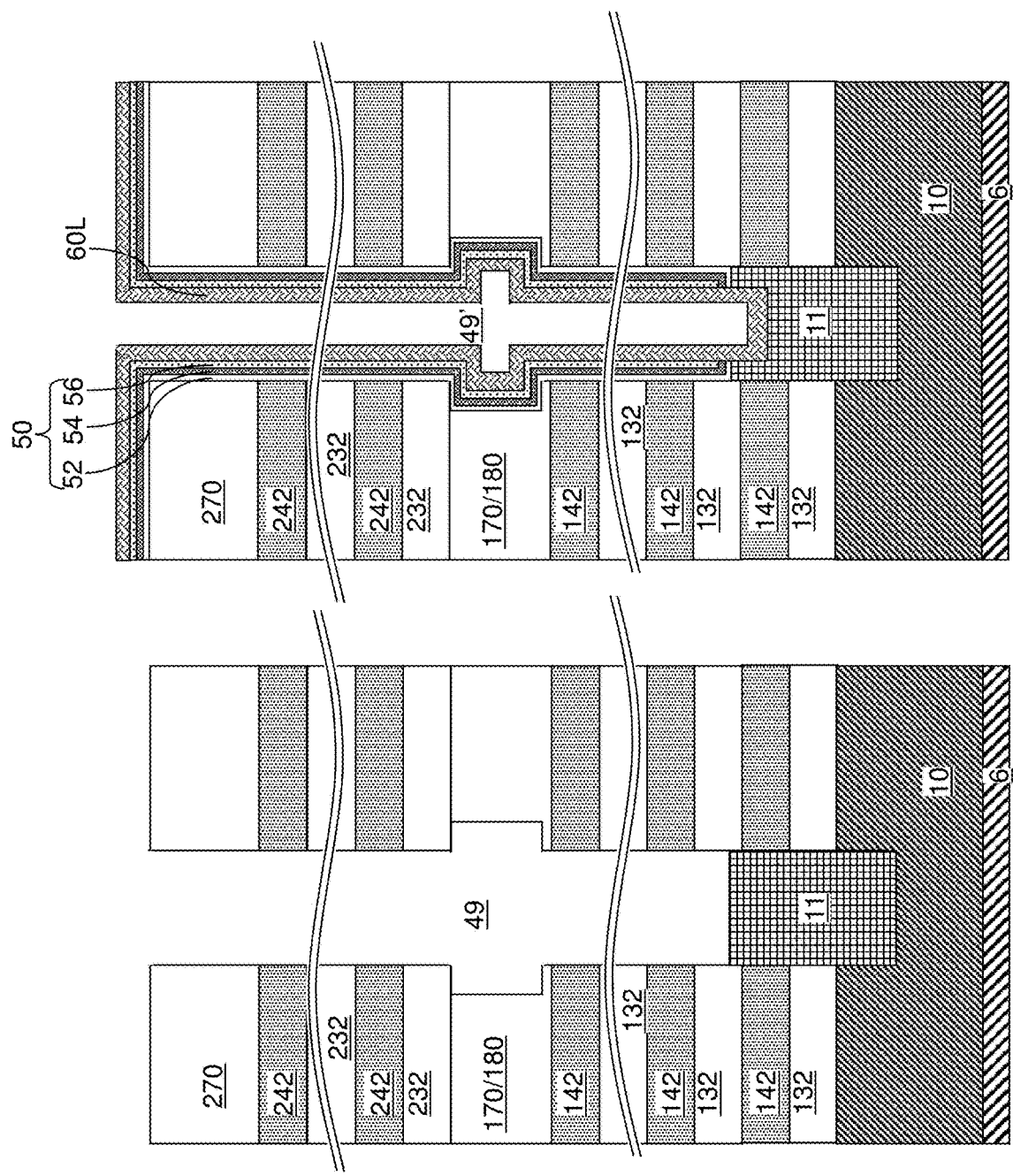

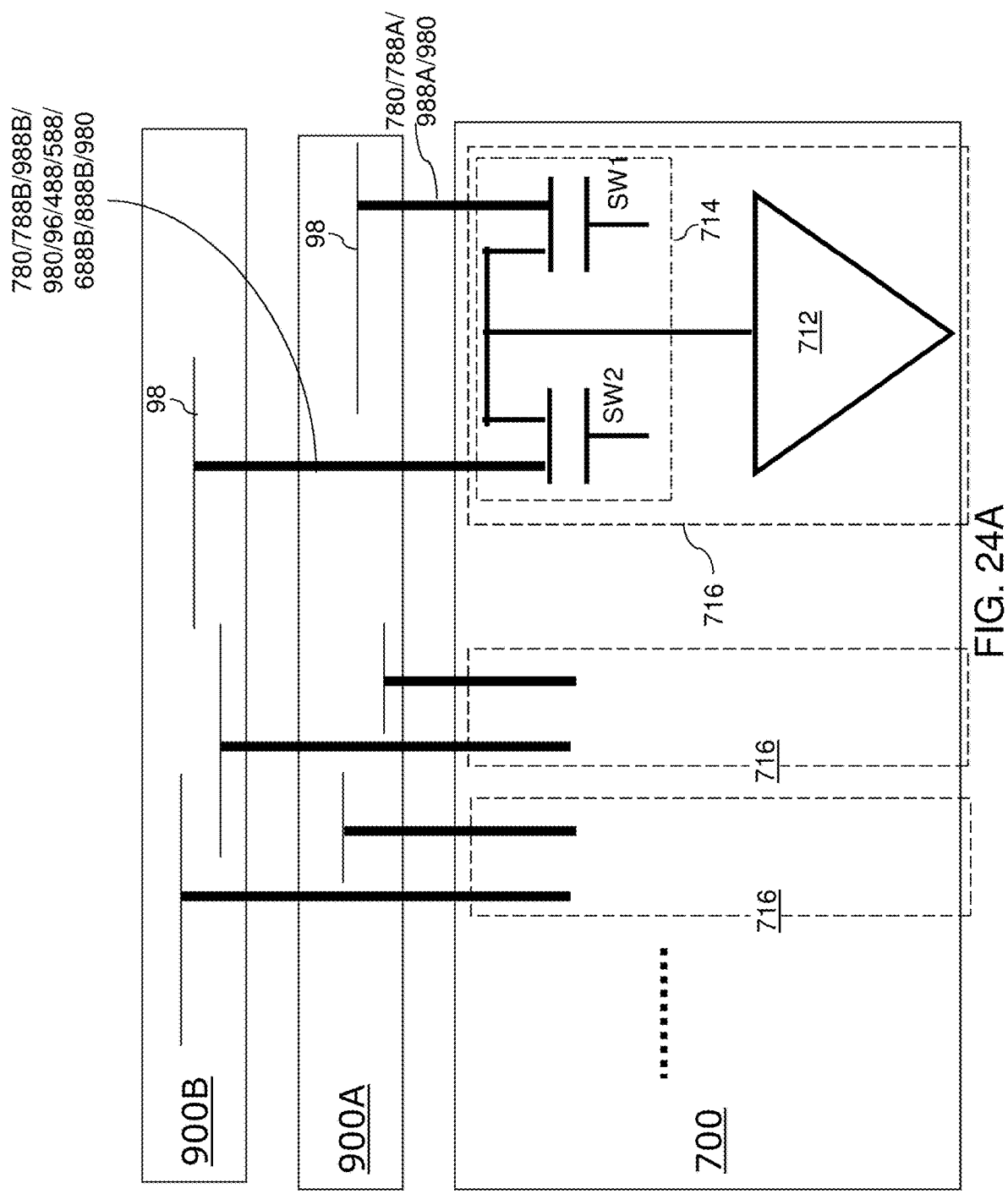

BONDED ASSEMBLY CONTAINING MULTIPLE MEMORY DIES SHARING PERIPHERAL CIRCUITRY ON A SUPPORT DIE AND METHODS FOR MAKING THE SAME

FIELD

The present disclosure relates generally to the field of semiconductor devices, and particularly to a bonded assembly including multiple memory dies and a support die including a shared peripheral circuitry to methods for forming the same.

BACKGROUND

A three-dimensional memory device including three-dimensional vertical NAND strings having one bit per cell is disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to an embodiment of the present disclosure, a bonded assembly is provided, which comprises: a first memory die including an array of first memory stack structures extending through a first alternating stack of first insulating layers and first electrically conductive layers, first drain regions contacting an end portion of each first vertical semiconductor channel in the first memory stack structures, and first bit lines electrically connected to a respective subset of the first drain regions; a second memory die including an array of second memory stack structures extending through a second alternating stack of second insulating layers and second electrically conductive layers, second drain regions contacting an end portion of each second vertical semiconductor channel in the second memory stack structures, and second bit lines electrically connected to a respective subset of the second drain regions; and a support die comprising a peripheral circuitry for operating the array of first memory stack structures and the array of second memory stack structures, wherein the peripheral circuitry comprises a plurality of sense amplifiers, wherein each of the plurality of sense amplifiers includes an input node connected to a respective first switch transistor configured to connect with a respective one of the first bit lines in the first memory die and connected to a respective second switch transistor configured to connect with a respective one of the second bit lines in the second memory die, wherein the first memory die is bonded to the support die, and the second memory die is bonded to the first memory die.

According to another embodiment of the present disclosure, a method of operating the bonded assembly of the present disclosure is provided, which comprises: turning on a set of transistor switches selected from a first set of the first switch transistors and a second set of the second switch transistors, wherein one set of bit lines selected from a set of the first bit lines and a set of the second bit lines is electrically connected to the plurality of sense amplifiers; and performing an operation selected from a programming operation, a sense operation, and an erase operation to memory elements accessed by the selected set of bit lines.

According to yet another embodiment of the present disclosure, a method of forming a bonded assembly is provided, which comprises: providing a first memory die, wherein the first memory die includes an array of first memory stack structures extending through a first alternating stack of first insulating layers and first electrically conductive layers, first drain regions contacting an end portion of each first vertical semiconductor channel in the first memory stack structures, and first bit lines electrically connected to a respective subset of the first drain regions; providing a second memory die, wherein the second memory die includes an array of second memory stack structures extending through a second alternating stack of second insulating layers and second electrically conductive layers, second drain regions contacting an end portion of each second vertical semiconductor channel in the second memory stack structures, and second bit lines electrically connected to a respective subset of the second drain regions; providing a support die, wherein the support die comprises a peripheral circuitry for operating the array of first memory stack structures and the array of second memory stack structures, wherein the peripheral circuitry comprises a plurality of sense amplifiers, wherein each of the plurality of sense amplifiers includes an input node connected to a respective first switch transistor and connected to a respective second switch transistor; bonding the first memory die to the support die; and bonding the second memory die to the first memory die, wherein: each of the first switch transistors is electrically connected to a respective one of the first bit lines in the first memory die; and each of the second switch transistors is electrically connected to a respective one of the second bit lines in the second memory die.

BRIEF DESCRIPTION OF THE DRAWINGS

FIG. 1 is a vertical cross-sectional view of an exemplary structure after formation of a source-side dielectric material layer and a doped semiconductor layer on a semiconductor substrate according to a first embodiment of the present disclosure.

FIG. 2 is a vertical cross-sectional view of the exemplary structure after formation of a first-tier alternating stack of first insulting layers and first spacer material layers according to the first embodiment of the present disclosure.

FIG. 3 is a vertical cross-sectional view of the exemplary structure after patterning a first-tier staircase region, a first stepped dielectric material portion, and an inter-tier dielectric layer according to the first embodiment of the present disclosure.

FIGS. 9A-9D illustrate sequential vertical cross-sectional views of a memory opening during formation of a memory opening fill structure according to the first embodiment of the present disclosure.

FIG. 24A is a schematic view of electrical connections between the support die, the first memory die, and the second memory die in the exemplary bonded assembly of FIG. 23.

DETAILED DESCRIPTION

Figure 4A:
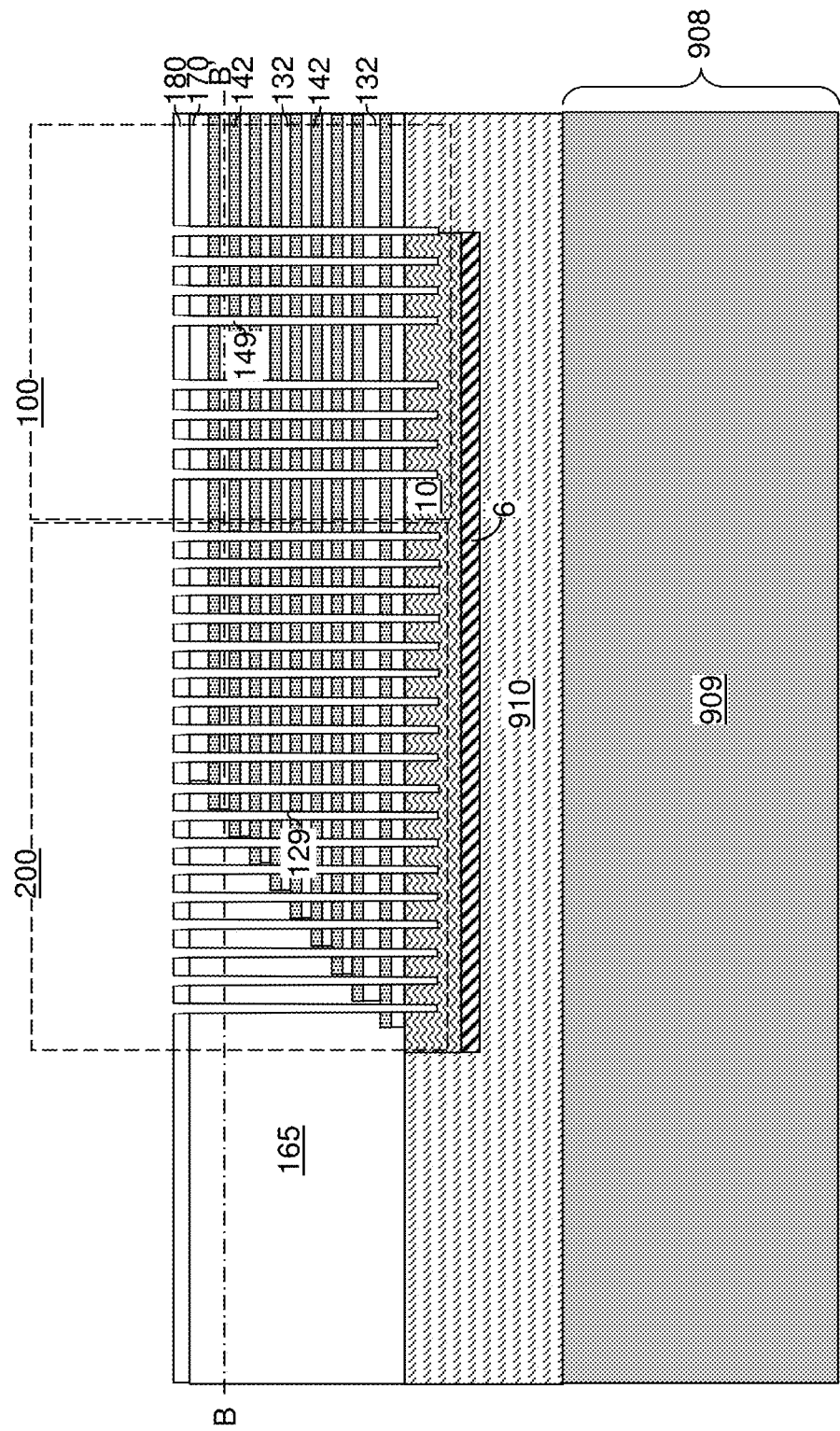
FIG. 4A is a vertical cross-sectional view of the exemplary structure after formation of first-tier memory openings and first-tier support openings according to the first embodiment of the present disclosure.

A three-dimensional memory device may include a three-dimensional array of memory elements and a peripheral circuitry configured to control operation of the three-dimensional array of memory elements. Incorporation of the peripheral circuitry on a same die as the three-dimensional array of memory elements has the adverse effect of degradation of performance of the CMOS devices in the peripheral circuitry due to high temperature processes used to form the three-dimensional array of memory elements.

Embodiments of the present disclosure provide bonding of plural memory die to a support die containing the peripheral circuitry, which prevent or reduce the degradation of performance of the CMOS devices in the peripheral circuitry due to high temperature processes used to form the memory elements. As discussed above, the embodiments of the present disclosure are directed to a bonded assembly including multiple memory dies sharing peripheral circuitry on a support die and methods for forming the same, the various embodiments of which are described herein in detail.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are used merely to identify similar elements, and different ordinals may be used across the specification and the claims of the instant disclosure. The same reference numerals refer to the same element or similar element. Unless otherwise indicated, elements having the same reference numerals are presumed to have the same composition and the same function. Unless otherwise indicated, a "contact" between elements refers to a direct contact between elements that provides an edge or a surface shared by the elements. As used herein, a first element located "on" a second element may be located on the exterior side of a surface of the second element or on the interior side of the second element. As used herein, a first element is located "directly on" a second element if there exist a physical contact between a surface of the first element and a surface of the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

As used herein, a first surface and a second surface are "vertically coincident" with each other if the second surface overlies or underlies the first surface and there exists a vertical plane or a substantially vertical plane that includes the first surface and the second surface. A substantially vertical plane is a plane that extends straight along a direction that deviates from a vertical direction by an angle less than 5 degrees. A vertical plane or a substantially vertical plane is straight along a vertical direction or a substantially vertical direction, and may, or may not, include a curvature along a direction that is perpendicular to the vertical direction or the substantially vertical direction.

As used herein, a "memory level" or a "memory array level" refers to the level corresponding to a general region between a first horizontal plane (i.e., a plane parallel to the top surface of the substrate) including topmost surfaces of an array of memory elements and a second horizontal plane including bottommost surfaces of the array of memory elements. As used herein, a "through-stack" element refers to an element that vertically extends through a memory level.

As used herein, a "semiconducting material" refers to a material having electrical conductivity in the range from $1.0 \times 10^{-5}$ S/m to $1.0 \times 10^5$ S/m. As used herein, a "semiconductor material" refers to a material having electrical conductivity in the range from $1.0 \times 10^{-5}$ S/m to 1.0 S/m in the absence of electrical dopants therein, and is capable of producing a doped material having electrical conductivity in a range from 1.0 S/m to $1.0 \times 10^5$ S/m upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^5$ S/m. As used herein, an "insulator material" or a "dielectric material" refers to a material having electrical conductivity less than $1.0 \times 10^{-5}$ S/m. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to have electrical conductivity greater than $1.0 \times 10^5$ S/m. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-5}$ S/m to $1.0 \times 10^5$ S/m. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material may be semiconducting or conductive depending on the atomic concentration of electrical dopants therein. As used herein, a "metallic material" refers to a conductive material including at least one metallic element therein. All measurements for electrical conductivities are made at the standard condition.

A monolithic three-dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The substrate may include integrated circuits fabricated thereon, such as driver circuits for a memory device The various three-dimensional memory devices of the present disclosure include a monolithic three-dimensional NAND string memory device, and may be fabricated using the various embodiments described herein. The monolithic three-dimensional NAND string may be located in a monolithic, three-dimensional array of NAND strings located over the substrate. At least one memory cell in the first device level of the three-dimensional array of NAND strings is located over another memory cell in the second device level of the three-dimensional array of NAND strings.

Generally, a semiconductor package (or a "package") refers to a unit semiconductor device that may be attached to a circuit board through a set of pins or solder balls. A semiconductor package may include a semiconductor chip (or a "chip") or a plurality of semiconductor chips that are bonded throughout, for example, by flip-chip bonding or another chip-to-chip bonding. A package or a chip may include a single semiconductor die (or a "die") or a plurality of semiconductor dies. A die is the smallest unit that may independently execute external commands or report status. Typically, a package or a chip with multiple dies is capable of simultaneously executing as many external commands as the total number of planes therein. Each die includes one or more planes. Identical concurrent operations may be executed in each plane within a same die, although there may be some restrictions. In case a die is a memory die, i.e., a die including memory elements, concurrent read operations, concurrent write operations, or concurrent erase operations may be performed in each plane within a same memory die. In a memory die, each plane contains a number of memory blocks (or "blocks"), which are the smallest unit that may be erased by in a single erase operation. Each memory block contains a number of pages, which are the smallest units that may be selected for programming. A page is also the smallest unit that may be selected to a read operation.

Referring to FIG. 1, a first exemplary structure according to a first embodiment of the present disclosure is illustrated, which includes an in-process memory die. As used herein, a memory die is a semiconductor die including an array of memory elements. As such, an in-process memory die is a structure that is subsequently modified to form a memory die.

The first exemplary structure may include a substrate 908, which includes a semiconductor substrate layer 909. The substrate 908 may comprise a commercially available semiconductor wafer such as a single crystalline silicon wafer. A source-side dielectric material layer 910 may be formed over the semiconductor substrate layer 909. The source-side dielectric material layer 910 may include a dielectric material such as silicon oxide. The maximum thickness of the source-side dielectric material layer 910 may be in a range from 200 nm to 3,000 nm, although lesser and greater thicknesses may also be used.

An optional metallic plate layer 6 and a source semiconductor layer 10 may be may be formed in the source-side dielectric material layer 910. The optional metallic plate layer 6, if present, provides a high conductivity conduction path for electrical current that flows into, along, and/or out of, the source semiconductor layer 10. The optional metallic plate layer 6 may include a conductive material such as a metal or a heavily doped semiconductor material. The optional metallic plate layer 6, for example, may include a tungsten layer having a thickness in a range from 3 nm to 100 nm, although lesser and greater thicknesses may also be used. A metal nitride layer (not shown) may be provided as a diffusion barrier layer on top of the metallic plate layer 6. The metallic plate layer 6 may function as a component of a source line in a completed die. The thickness of the metallic plate layer 6 may be in a range from 20 nm to 200 nm, although lesser and greater thicknesses may also be used.

The source semiconductor layer 10 may be a doped semiconductor layer having a doping of the opposite conductivity type of the conductivity type of vertical semiconductor channels to be subsequently formed. For example, if vertical semiconductor channels to be subsequently formed have a doping of a first conductivity type, the source semiconductor layer 10 may have a doping of a second conductivity type that is the opposite of the first conductivity type. For example, if the first conductivity type is p-type, the second conductivity type is n-type, and vice versa. The atomic concentration of second conductivity type dopants in the source semiconductor layer 10 may be in a range from $5.0 \times 10^{19}/cm^3$ to $2.0 \times 10^{21}/cm^3$, although lesser and greater atomic concentrations may also be used. The thickness of the source semiconductor layer 10 may be in a range from 100 nm to 600 nm, although lesser and greater thicknesses may also be used.

The source semiconductor layer 10 and the metallic plate layer 6 may be patterned such that the source semiconductor layer 10 and the metallic plate layer 6 extend over at least a portion of a memory array region 100 in which memory stack structures are to be subsequently formed and over a staircase region 200 in which stepped surfaces of electrically conductive layers embodying word lines are to be subsequently formed. A via interconnection region 400 may be provided adjacent to (e.g., surrounding or on a side of) the memory array region 100 and the staircase region 200. In one embodiment, the top surface of the source semiconductor layer 10 may be coplanar with the top surface of the source-side dielectric material layer 910.

Referring to FIG. 2, an alternating stack of first material layers and second material layers may be subsequently formed. Each first material layer may include a first material, and each second material layer may include a second material that is different from the first material. In case at least another alternating stack of material layers is subsequently formed over the alternating stack of the first material layers and the second material layers, the alternating stack is herein referred to as a first-tier alternating stack. The level of the first-tier alternating stack is herein referred to as a first-tier level, and the level of the alternating stack to be subsequently formed immediately above the first-tier level is herein referred to as a second-tier level, etc.

The first-tier alternating stack may include first insulting layers 132 as the first material layers, and first spacer material layers as the second material layers. In one embodiment, the first spacer material layers may be sacrificial material layers that are subsequently replaced with electrically conductive layers. In another embodiment, the first spacer material layers may be electrically conductive layers that are not subsequently replaced with other layers. While the present disclosure is described using embodiments in which sacrificial material layers are replaced with electrically conductive layers, embodiments in which the spacer material layers are formed as electrically conductive layers (thereby obviating the need to perform replacement processes) are expressly contemplated herein.

In one embodiment, the first material layers and the second material layers may be first-tier insulating layers 132 and first-tier sacrificial material layers 142, respectively. In one embodiment, each first-tier insulating layer 132 may include a first insulating material, and each first-tier sacrificial material layer 142 may include a first sacrificial material. An alternating plurality of first-tier insulating layers 132 and first-tier sacrificial material layers 142 is formed over the source semiconductor layer 10. As used herein, a "sacrificial material" refers to a material that is removed during a subsequent processing step.

As used herein, an alternating stack of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness throughout, or may have different thicknesses. The second elements may have the same thickness throughout, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

The first-tier alternating stack (132, 142) may include first-tier insulating layers 132 composed of the first material, and first-tier sacrificial material layers 142 composed of the second material, which is different from the first material. The first material of the first-tier insulating layers 132 may be at least one insulating material. Insulating materials that may be used for the first-tier insulating layers 132 include, but are not limited to silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the first-tier insulating layers 132 may be silicon oxide.

The second material of the first-tier sacrificial material layers 142 may be a sacrificial material that may be removed selective to the first material of the first-tier insulating layers 132. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The first-tier sacrificial material layers 142 may comprise an insulating material, a semiconductor material, or a conductive material. The second material of the first-tier sacrificial material layers 142 may be subsequently replaced with electrically conductive electrodes which may function, for example, as control gate electrodes of a vertical NAND device. In one embodiment, the first-tier sacrificial material layers 142 may be material layers that comprise silicon nitride.

In one embodiment, the first-tier insulating layers 132 may include silicon oxide, and sacrificial material layers may include silicon nitride sacrificial material layers. The first material of the first-tier insulating layers 132 may be deposited, for example, by chemical vapor deposition (CVD). For example, if silicon oxide is used for the first-tier insulating layers 132, tetraethylorthosilicate (TEOS) may be used as the precursor material for the CVD process. The second material of the first-tier sacrificial material layers 142 may be formed, for example, CVD or atomic layer deposition (ALD).

The thicknesses of the first-tier insulating layers 132 and the first-tier sacrificial material layers 142 may be in a range from 20 nm to 50 nm, although lesser and greater thicknesses may be used for each first-tier insulating layer 132 and for each first-tier sacrificial material layer 142. The number of repetitions of the pairs of a first-tier insulating layer 132 and a first-tier sacrificial material layer 142 may be in a range from 2 to 1,024, and typically from 8 to 256, although a greater number of repetitions may also be used. In one embodiment, each first-tier sacrificial material layer 142 in the first-tier alternating stack (132, 142) may have a uniform thickness that is substantially invariant within each respective first-tier sacrificial material layer 142.

A first insulating cap layer 170 may be subsequently formed over the first alternating stack (132, 142). The first insulating cap layer 170 may include a dielectric material, which may be any dielectric material that may be used for the first-tier insulating layers 132. In one embodiment, the first insulating cap layer 170 may include the same dielectric material as the first-tier insulating layers 132. The thickness of the first insulating cap layer 170 may be in a range from 20 nm to 300 nm, although lesser and greater thicknesses may also be used.

Referring to FIG. 3, the first insulating cap layer 170 and the first-tier alternating stack (132, 142) may be patterned to form first stepped surfaces in the staircase region 200. The staircase region 200 may include a respective first stepped area in which first stepped surfaces are formed, and a second stepped area in which additional stepped surfaces are to be subsequently formed in a second-tier structure (to be subsequently formed over a first-tier structure) and/or additional tier structures. The first stepped surfaces may be formed, for example, by forming a mask layer with an opening therein, etching a cavity within the levels of the first insulating cap layer 170, and iteratively expanding the etched area and vertically recessing the cavity by etching each pair of a first-tier insulating layer 132 and a first-tier sacrificial material layer 142 located directly underneath the bottom surface of the etched cavity within the etched area. In one embodiment, top surfaces of the first-tier sacrificial material layers 142 may be physically exposed at the first stepped surfaces. The cavity overlying the first stepped surfaces is herein referred to as a first stepped cavity.

A dielectric fill material (such as undoped silicate glass or doped silicate glass) may be deposited to fill the first stepped cavity. Excess portions of the dielectric fill material may be removed from above the horizontal plane including the top surface of the first insulating cap layer 170. A remaining portion of the dielectric fill material that fills the region overlying the first stepped surfaces constitute a first stepped dielectric material portion 165. As used herein, a "stepped" element refers to an element that has stepped surfaces and a horizontal cross-sectional area that increases monotonically as a function of a vertical distance from a top surface of a substrate on which the element is present. The first-tier alternating stack (132, 142) and the first stepped dielectric material portion 165 may collectively constitute a first-tier structure, which is an in-process structure that is subsequently modified.

An inter-tier dielectric layer 180 may be optionally deposited over the first-tier structure (132, 142, 170, 165). The inter-tier dielectric layer 180 may include a dielectric material such as silicon oxide. In one embodiment, the inter-tier dielectric layer 180 may include a doped silicate glass having a greater etch rate than the material of the first-tier insulating layers 132 (which may include an undoped silicate glass). For example, the inter-tier dielectric layer 180 may include phosphosilicate glass. The thickness of the inter-tier dielectric layer 180 may be in a range from 30 nm to 300 nm, although lesser and greater thicknesses may also be used.

Figure 4B:
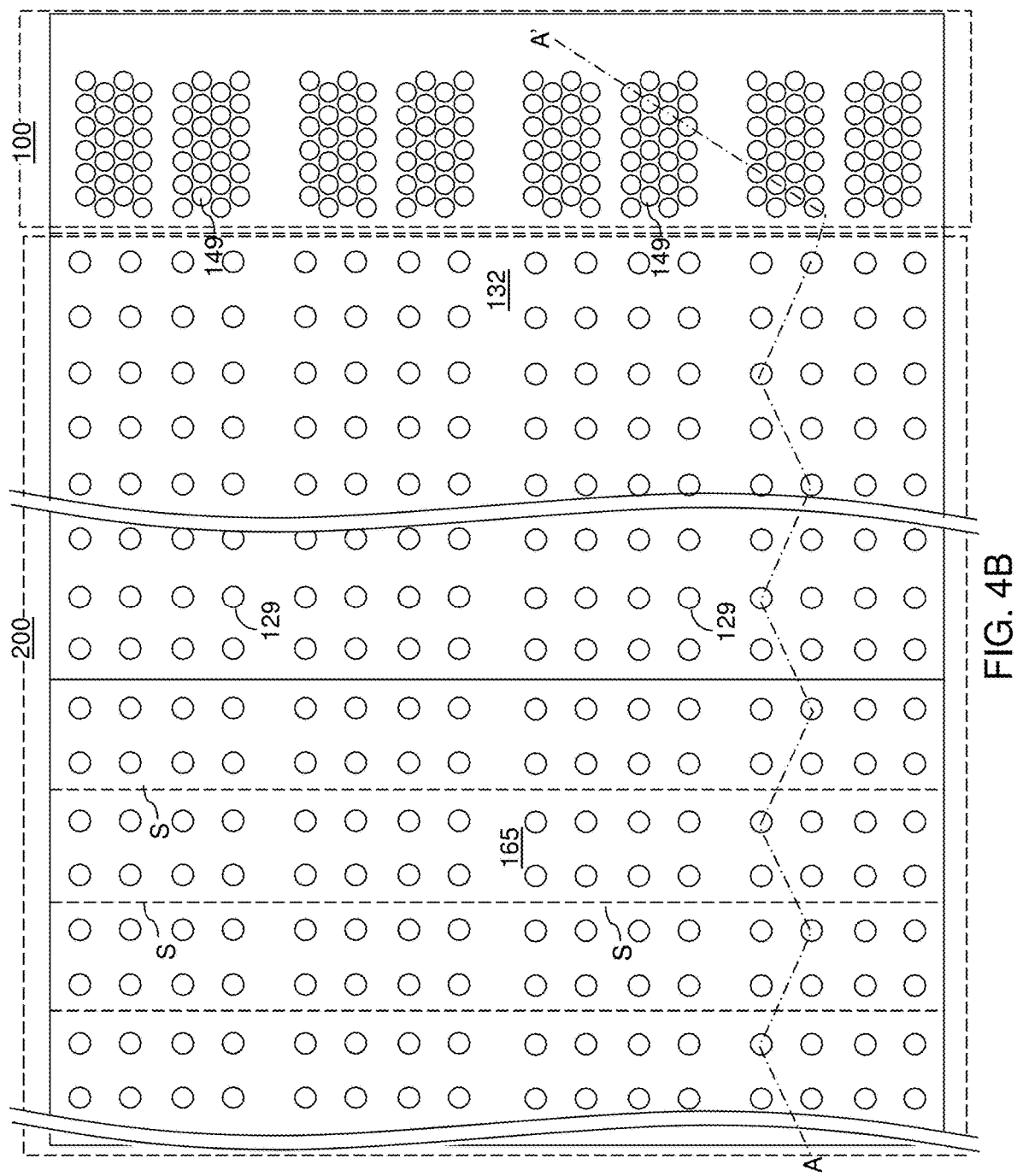
FIG. 4B is a horizontal cross-sectional view of the exemplary structure of FIG. 4A. The hinged vertical plane A-A' corresponds to the plane of the vertical cross-sectional view of FIG. 4A.

Referring to FIGS. 4A and 4B, various first-tier openings (149, 129) may be formed through the inter-tier dielectric layer 180 and the first-tier structure (132, 142, 170, 165) and into the source semiconductor layer 10. A photoresist layer (not shown) may be applied over the inter-tier dielectric layer 180, and may be lithographically patterned to form various openings therethrough. The pattern of openings in the photoresist layer may be transferred through the inter-tier dielectric layer 180 and the first-tier structure (132, 142, 170, 165) and into the source semiconductor layer 10 by a first anisotropic etch process to form the various first-tier openings (149, 129) concurrently, i.e., during the first isotropic etch process. The various first-tier openings (149, 129) may include first-tier memory openings 149 and first-tier support openings 129. Locations of steps S in the first alternating stack (132, 142) are illustrated as dotted lines in FIG. 4B.

The first-tier memory openings 149 may be openings that are formed in the memory array region 100 through each layer within the first alternating stack (132, 142) and may be subsequently used to form memory stack structures therein. The first-tier memory openings 149 may be formed in clusters of first-tier memory openings 149 that are laterally spaced apart along the second horizontal direction hd2. Each cluster of first-tier memory openings 149 may be formed as a two-dimensional array of first-tier memory openings 149.

The first-tier support openings 129 may be openings that are formed in the staircase region 200. A subset of the first-tier support openings 129 that is formed through the first stepped dielectric material portion 165 may be formed through a respective horizontal surface of the first stepped surfaces.

In one embodiment, the first anisotropic etch process may include an initial step in which the materials of the first-tier alternating stack (132, 142) are etched concurrently with the material of the first stepped dielectric material portion 165. The chemistry of the initial etch step may alternate to optimize etching of the first and second materials in the first-tier alternating stack (132, 142) while providing a comparable average etch rate to the material of the first stepped dielectric material portion 165. The first anisotropic etch process may use, for example, a series of reactive ion etch processes or a single reaction etch process (e.g., $CF_4$/$O_2$/Ar etch). The sidewalls of the various first-tier openings (149, 129) may be substantially vertical, or may be tapered. In one embodiment, the terminal portion of the anisotropic etch process may include an overetch step that etches into an upper portion of the source semiconductor layer 10. The photoresist layer may be subsequently removed, for example, by ashing.

Optionally, the portions of the first-tier memory openings 149 and the first-tier support openings 129 at the level of the inter-tier dielectric layer 180 may be laterally expanded by an isotropic etch. In this case, the inter-tier dielectric layer 180 may comprise a dielectric material (such as borosilicate glass) having a greater etch rate than the first-tier insulating layers 132 (that may include undoped silicate glass) in dilute hydrofluoric acid. An isotropic etch (such as a wet etch using HF) may be used to expand the lateral dimensions of the first-tier memory openings 149 at the level of the inter-tier dielectric layer 180. The portions of the first-tier memory openings 149 located at the level of the inter-tier dielectric layer 180 may be optionally widened to provide a larger landing pad for second-tier memory openings to be subsequently formed through a second-tier alternating stack (to be subsequently formed prior to formation of the second-tier memory openings).

Figure 5:
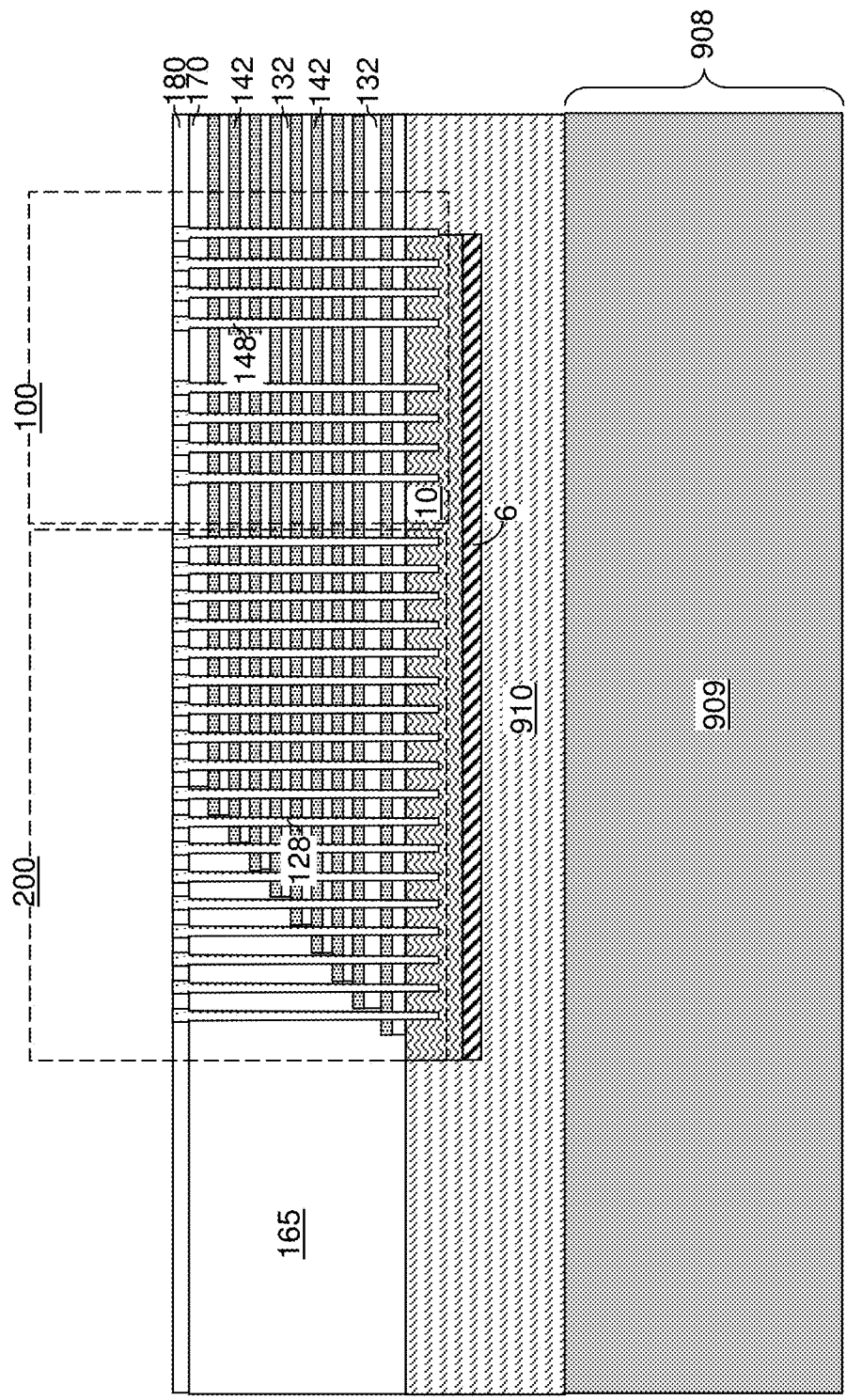
FIG. 5 is a vertical cross-sectional view of the exemplary structure after formation of various sacrificial fill structures according to the first embodiment of the present disclosure.

Referring to FIG. 5, sacrificial first-tier opening fill portions (148, 128) may be formed in the various first-tier openings (149, 129). For example, a sacrificial first-tier fill material is deposited concurrently deposited in each of the first-tier openings (149, 129). The sacrificial first-tier fill material includes a material that may be subsequently removed selective to the materials of the first-tier insulating layers 132 and the first-tier sacrificial material layers 142.

In one embodiment, the sacrificial first-tier fill material may include a semiconductor material such as silicon (e.g., a-Si or polysilicon), a silicon-germanium alloy, germanium, a III-V compound semiconductor material, or a combination thereof. Optionally, a thin etch stop liner (such as a silicon oxide layer or a silicon nitride layer having a thickness in a range from 1 nm to 3 nm) may be used prior to depositing the sacrificial first-tier fill material. The sacrificial first-tier fill material may be formed by a non-conformal deposition or a conformal deposition method.

In another embodiment, the sacrificial first-tier fill material may include a silicon oxide material having a higher etch rate than the materials of the first-tier insulating layers 132, the first insulating cap layer 170, and the inter-tier dielectric layer 180. For example, the sacrificial first-tier fill material may include borosilicate glass or porous or non-porous organosilicate glass having an etch rate that is at least 100 times higher than the etch rate of densified TEOS oxide (i.e., a silicon oxide material formed by decomposition of tetraethylorthosilicate glass in a chemical vapor deposition process and subsequently densified in an anneal process) in a 100:1 dilute hydrofluoric acid. In such embodiments, a thin etch stop liner (such as a silicon nitride layer having a thickness in a range from 1 nm to 3 nm) may be used prior to depositing the sacrificial first-tier fill material. The sacrificial first-tier fill material may be formed by a non-conformal deposition or a conformal deposition method.

In yet another embodiment, the sacrificial first-tier fill material may include amorphous silicon or a carbon-containing material (such as amorphous carbon or diamond-like carbon) that may be subsequently removed by ashing, or a silicon-based polymer that may be subsequently removed selective to the materials of the first alternating stack (132, 142).

Portions of the deposited sacrificial material may be removed from above the topmost layer of the first-tier alternating stack (132, 142), such as from above the inter-tier dielectric layer 180. For example, the sacrificial first-tier fill material may be recessed to a top surface of the inter-tier dielectric layer 180 using a planarization process. The planarization process may include a recess etch, chemical mechanical planarization (CMP), or a combination thereof. The top surface of the inter-tier dielectric layer 180 may be used as an etch stop layer or a planarization stop layer.

Remaining portions of the sacrificial first-tier fill material comprise sacrificial first-tier opening fill portions (148, 128). Specifically, each remaining portion of the sacrificial material in a first-tier memory opening 149 constitutes a sacrificial first-tier memory opening fill portion 148. Each remaining portion of the sacrificial material in a first-tier support opening 129 constitutes a sacrificial first-tier support opening fill portion 128. The various sacrificial first-tier opening fill portions (148, 128) are concurrently formed, i.e., during a same set of processes including the deposition process that deposits the sacrificial first-tier fill material and the planarization process that removes the first-tier deposition process from above the first alternating stack (132, 142) (such as from above the top surface of the inter-tier dielectric layer 180). The top surfaces of the sacrificial first-tier opening fill portions (148, 128) may be coplanar with the top surface of the inter-tier dielectric layer 180. Each of the sacrificial first-tier opening fill portions (148, 128) may, or may not, include cavities therein.

Figure 6:
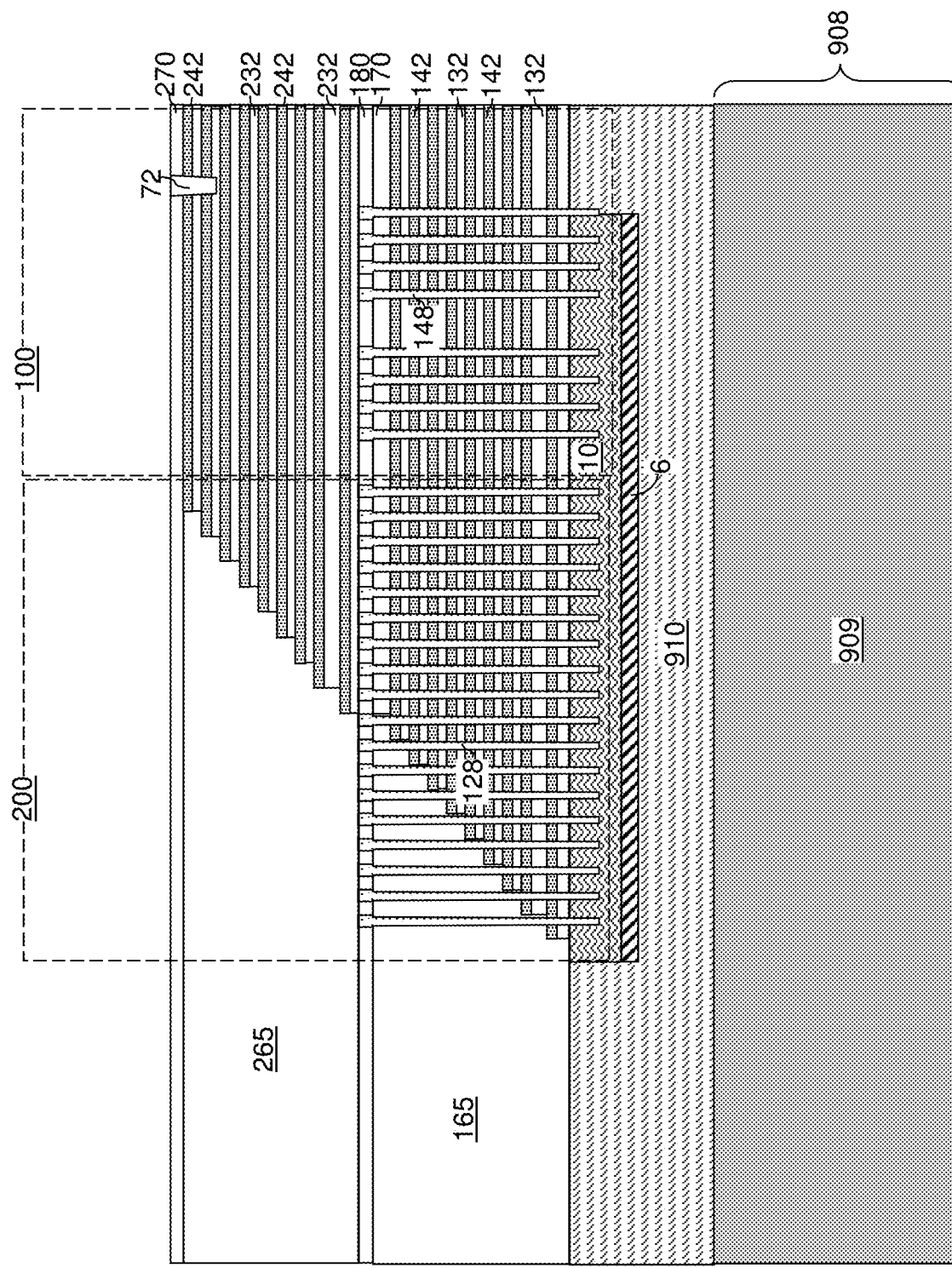
FIG. 6 is a vertical cross-sectional view of the exemplary structure after formation of a second-tier alternating stack of second insulating layers and second spacer material layers, second stepped surfaces, and a second stepped dielectric material portion according to the first embodiment of the present disclosure.

Referring to FIG. 6, a second-tier structure may be formed over the first-tier structure (132, 142, 170, 148). The second-tier structure may include an additional alternating stack of insulating layers and spacer material layers, which may be sacrificial material layers. For example, a second alternating stack (232, 242) of material layers may be subsequently formed on the top surface of the first alternating stack (132, 142). The second alternating stack (232, 242) may include an alternating plurality of third material layers and fourth material layers. Each third material layer may include a third material, and each fourth material layer may include a fourth material that is different from the third material. In one embodiment, the third material may be the same as the first material of the first-tier insulating layer 132, and the fourth material may be the same as the second material of the first-tier sacrificial material layers 142.

In one embodiment, the third material layers may be second-tier insulating layers 232 and the fourth material layers may be second spacer material layers that provide vertical spacing between each vertically neighboring pair of the second-tier insulating layers 232. In one embodiment, the third material layers and the fourth material layers may be second-tier insulating layers 232 and second-tier sacrificial material layers 242, respectively. The third material of the second-tier insulating layers 232 may be at least one insulating material. The fourth material of the second-tier sacrificial material layers 242 may be a sacrificial material that may be removed selective to the third material of the second-tier insulating layers 232. The second-tier sacrificial material layers 242 may comprise an insulating material, a semiconductor material, or a conductive material. The fourth material of the second-tier sacrificial material layers 242 may be subsequently replaced with electrically conductive electrodes which may function, for example, as control gate electrodes of a vertical NAND device.

In one embodiment, each second-tier insulating layer 232 may include a second insulating material, and each second-tier sacrificial material layer 242 may include a second sacrificial material. In this case, the second alternating stack (232, 242) may include an alternating plurality of second-tier insulating layers 232 and second-tier sacrificial material layers 242. The third material of the second-tier insulating layers 232 may be deposited, for example, by chemical vapor deposition (CVD). The fourth material of the second-tier sacrificial material layers 242 may be formed, for example, CVD or atomic layer deposition (ALD).

The third material of the second-tier insulating layers 232 may be at least one insulating material. Insulating materials that may be used for the second-tier insulating layers 232 may be any material that may be used for the first-tier insulating layers 132. The fourth material of the second-tier sacrificial material layers 242 is a sacrificial material that may be removed selective to the third material of the second-tier insulating layers 232. Sacrificial materials that may be used for the second-tier sacrificial material layers 242 may be any material that may be used for the first-tier sacrificial material layers 142. In one embodiment, the second insulating material may be the same as the first insulating material, and the second sacrificial material may be the same as the first sacrificial material.

The thicknesses of the second-tier insulating layers 232 and the second-tier sacrificial material layers 242 may be in a range from 20 nm to 50 nm, although lesser and greater thicknesses may be used for each second-tier insulating layer 232 and for each second-tier sacrificial material layer 242. The number of repetitions of the pairs of a second-tier insulating layer 232 and a second-tier sacrificial material layer 242 may be in a range from 2 to 1,024, and typically from 8 to 256, although a greater number of repetitions may also be used. In one embodiment, each second-tier sacrificial material layer 242 in the second alternating stack (232, 242) may have a uniform thickness that is substantially invariant within each respective second-tier sacrificial material layer 242.

Second stepped surfaces in the second stepped area may be formed in the staircase region 200 using a same set of processing steps as the processing steps used to form the first stepped surfaces in the first stepped area with suitable adjustment to the pattern of at least one masking layer. A second stepped dielectric material portion 265 may be formed over the second stepped surfaces in the staircase region 200.

A second insulating cap layer 270 may be subsequently formed over the second alternating stack (232, 242). The second insulating cap layer 270 includes a dielectric material that is different from the material of the second-tier sacrificial material layers 242. In one embodiment, the second insulating cap layer 270 may include silicon oxide. In one embodiment, the first and second sacrificial material layers (142, 242) may comprise silicon nitride.

Generally speaking, at least one alternating stack of insulating layers (132, 232) and spacer material layers (such as sacrificial material layers (142, 242)) may be formed over the source semiconductor layer 10, and at least one stepped dielectric material portion (165, 265) may be formed over the staircase regions on the at least one alternating stack (132, 142, 232, 242).

Optionally, drain-select-level isolation structures 72 may be formed through a subset of layers in an upper portion of the second-tier alternating stack (232, 242). The second-tier sacrificial material layers 242 that are cut by the drain-select-level isolation structures 72 may correspond to the levels in which drain-select-level electrically conductive layers are subsequently formed. The drain-select-level isolation structures 72 may include a dielectric material such as silicon oxide. The drain-select-level isolation structures 72 may laterally extend along a first horizontal direction hd1, and may be laterally spaced apart along a second horizontal direction hd2 that is perpendicular to the first horizontal direction hd1. The combination of the second alternating stack (232, 242), the second stepped dielectric material portion 265, the second insulating cap layer 270, and the optional drain-select-level isolation structures 72 collectively constitute a second-tier structure (232, 242, 265, 270, 72).

Figure 7A:
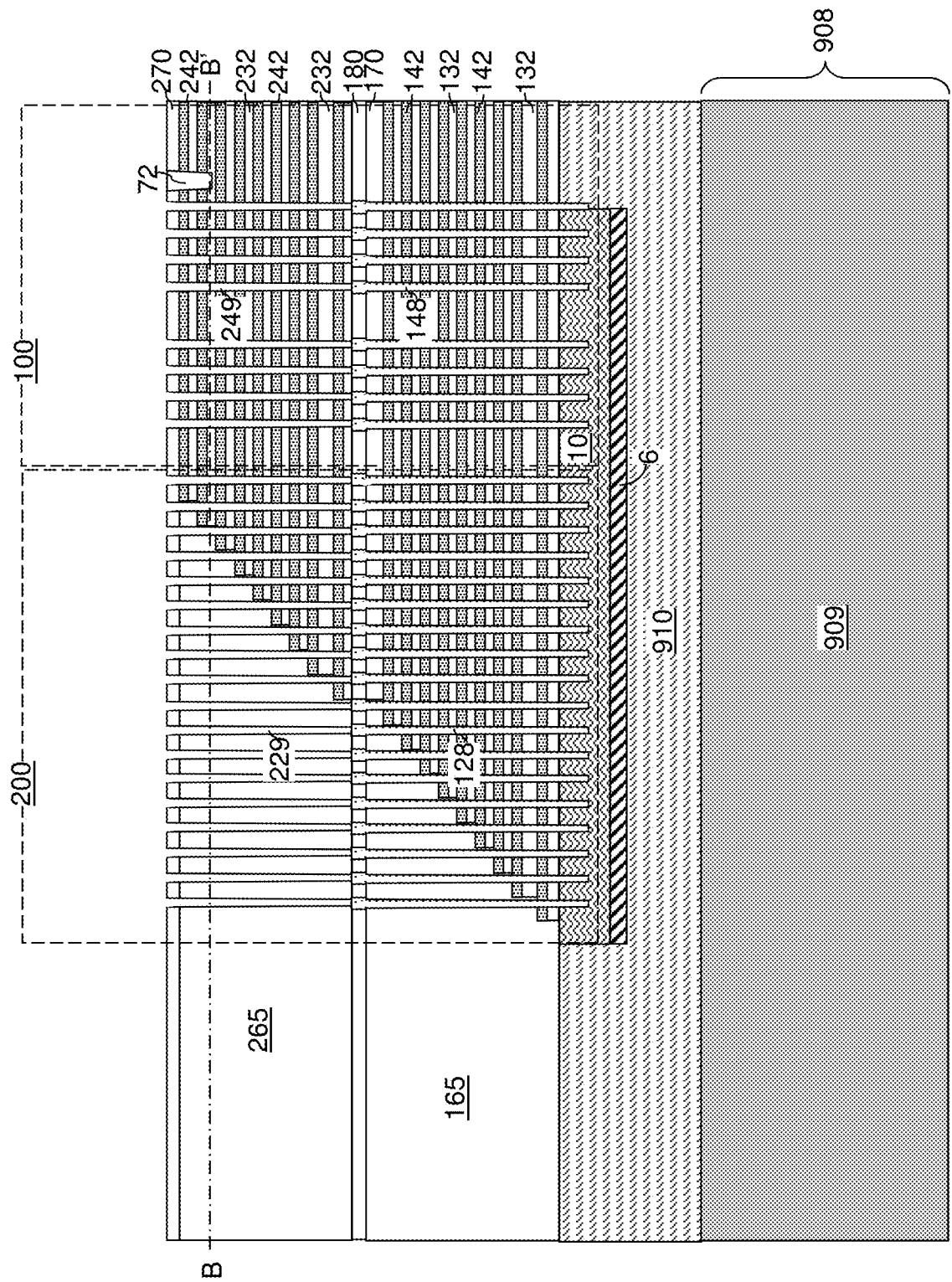
FIG. 7A is a vertical cross-sectional view of the exemplary structure after formation of second-tier memory openings and second-tier support openings according to the first embodiment of the present disclosure.
Figure 7B:
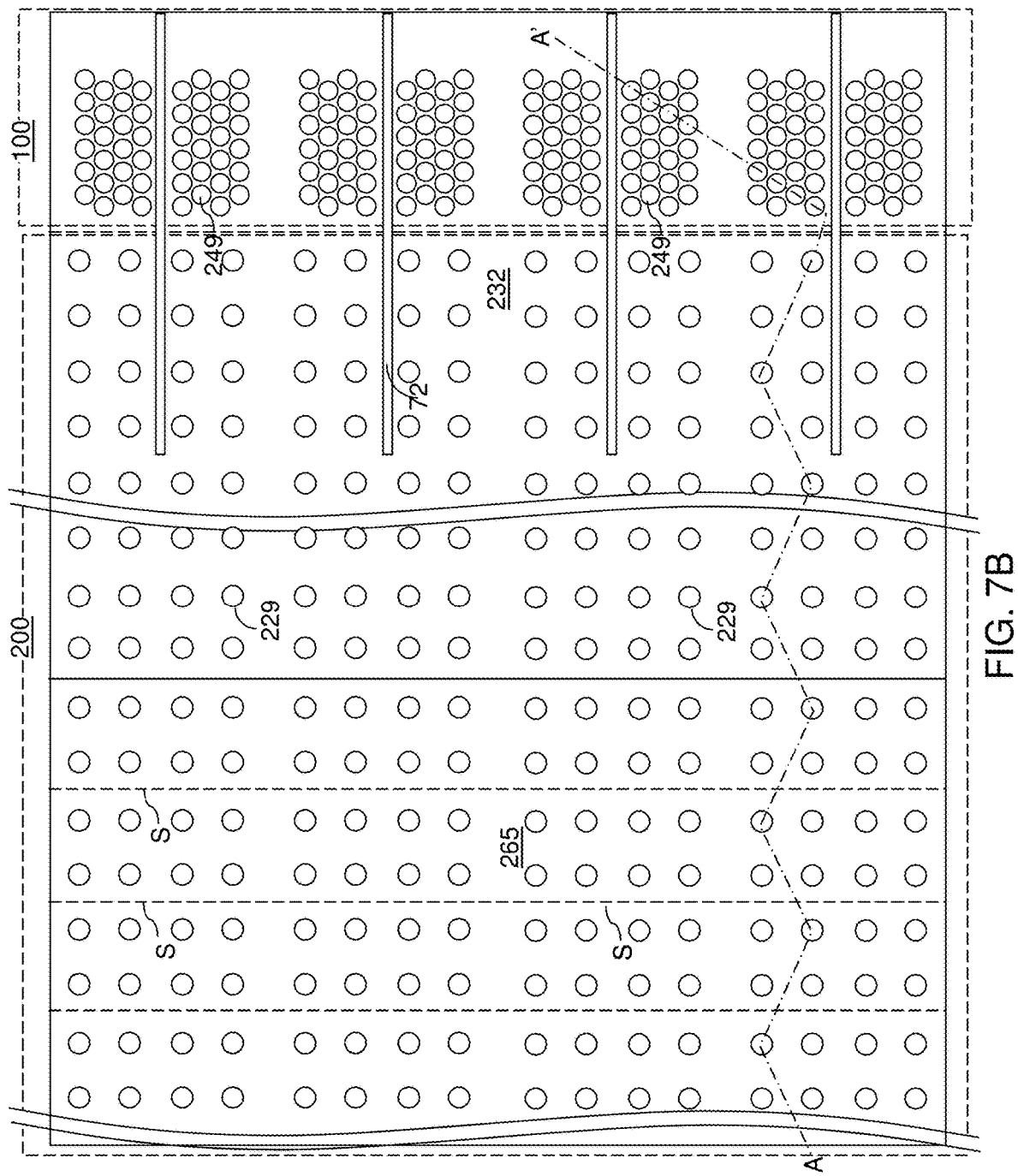
FIG. 7B is a horizontal cross-sectional of the exemplary structure along the horizontal plane B-B' of FIG. 7A. The hinged vertical plane A-A' corresponds to the plane of the vertical cross-sectional view of FIG. 7A.

Referring to FIGS. 7A and 7B, various second-tier openings (249, 229) may be formed through the second-tier structure (232, 242, 265, 270, 72). A photoresist layer (not shown) may be applied over the second insulating cap layer 270, and may be lithographically patterned to form various openings therethrough. The pattern of the openings may be the same as the pattern of the various first-tier openings (149, 129), which is the same as the sacrificial first-tier opening fill portions (148, 128). Thus, the lithographic mask used to pattern the first-tier openings (149, 129) may be used to pattern the photoresist layer.

The pattern of openings in the photoresist layer may be transferred through the second-tier structure (232, 242, 265, 270, 72) by a second anisotropic etch process to form various second-tier openings (249, 229) concurrently, i.e., during the second anisotropic etch process. The various second-tier openings (249, 229) may include second-tier memory openings 249 and second-tier support openings 229.

The second-tier memory openings 249 may be formed directly on a top surface of a respective one of the sacrificial first-tier memory opening fill portions 148. The second-tier support openings 229 are formed directly on a top surface of a respective one of the sacrificial first-tier support opening fill portions 128. Further, each second-tier support openings 229 may be formed through a horizontal surface within the second stepped surfaces, which include the interfacial surfaces between the second alternating stack (232, 242) and the second stepped dielectric material portion 265. Locations of steps S in the first-tier alternating stack (132, 142) and the second-tier alternating stack (232, 242) are illustrated as dotted lines in FIG. 7B.

The second anisotropic etch process may include an etch step in which the materials of the second-tier alternating stack (232, 242) may be etched concurrently with the material of the second stepped dielectric material portion 265. The chemistry of the etch step may alternate to optimize etching of the materials in the second-tier alternating stack (232, 242) while providing a comparable average etch rate to the material of the second stepped dielectric material portion 265. The second anisotropic etch process may use, for example, a series of reactive ion etch processes or a single reaction etch process (e.g., $CF_4/O_2/Ar$ etch). The sidewalls of the various second-tier openings (249, 229) may be substantially vertical, or may be tapered. A bottom periphery of each second-tier opening (249, 229) may be laterally offset, and/or may be located entirely within, a periphery of a top surface of an underlying sacrificial first-tier opening fill portion (148, 128). The photoresist layer may be subsequently removed, for example, by ashing.

Figure 8:
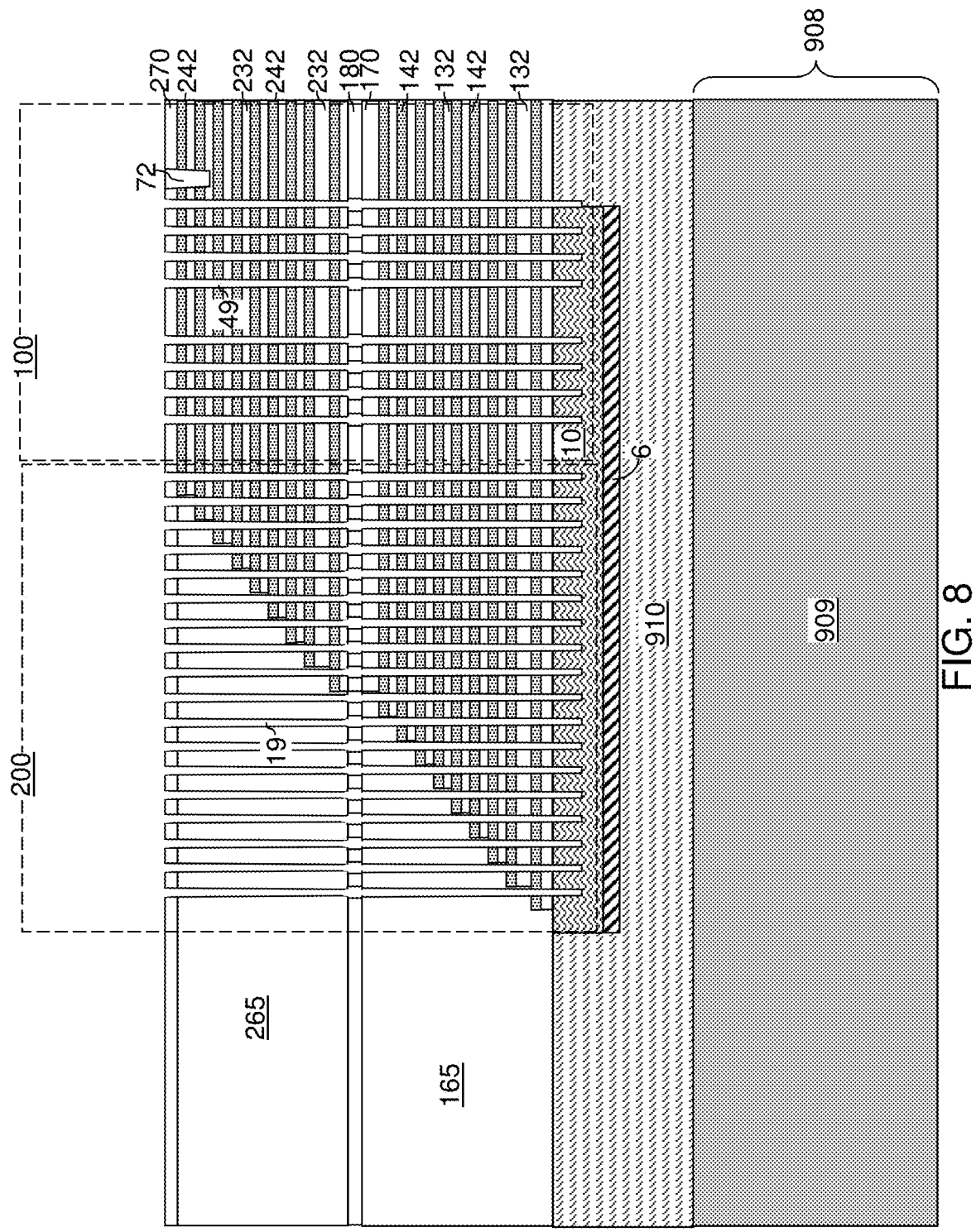
FIG. 8 is a vertical cross-sectional view of the exemplary structure after formation of inter-tier memory openings and inter-tier support openings according to the first embodiment of the present disclosure.

Referring to FIG. 8, the sacrificial first-tier fill material of the sacrificial first-tier opening fill portions (148, 128) may be removed using an etch process that etches the sacrificial first-tier fill material selective to the materials of the first and second insulating layers (132, 232), the first and second sacrificial material layers (142, 242), the first and second insulating cap layers (170, 270), and the inter-tier dielectric layer 180. A memory opening 49, which is also referred to as an inter-tier memory opening 49, may be formed in each combination of a second-tier memory openings 249 and a volume from which a sacrificial first-tier memory opening fill portion 148 is removed. A support opening 19, which is also referred to as an inter-tier support opening 19, is formed in each combination of a second-tier support openings 229 and a volume from which a sacrificial first-tier support opening fill portion 128 is removed.

FIGS. 9A-9D provide sequential cross-sectional views of a memory opening 49 during formation of a memory opening fill structure. The same structural change occurs in each of the memory openings 49 and the support openings 19.

Referring to FIG. 9A, a pedestal channel portion 11 may be formed by a selective semiconductor material deposition process at the bottom of each memory opening 49 and at the bottom of each support opening 19. A doped semiconductor material having a doping of a first conductivity type may be selectively grown from the physically exposed surfaces of the source semiconductor layer 10, while growth of the doped semiconductor material from dielectric surfaces is suppressed during the selective semiconductor material deposition process. A semiconductor precursor gas, a dopant gas including dopants atoms of the first conductivity type, and an etchant may be flowed into a process chamber including the exemplary structure concurrently or alternately. A periphery of a top surface each pedestal channel portion 11 may contact a sidewall of a first-tier insulating layer 132 that overlies, and contacts, a bottommost first-tier sacrificial material layer 142. The atomic concentration of first conductivity type dopants in the pedestal channel portions 11 may be in a range from $1.0\times10^{14}/cm^3$ to $1.0\times10^{18}/cm^3$, although lesser and greater dopant atomic concentrations may also be used. A p-n junction may be formed at each interface between the source semiconductor layer 10 and the pedestal channel portions 11.

Referring to FIG. 9B, a stack of layers including a blocking dielectric layer 52, a charge storage layer 54, a tunneling dielectric layer 56, and a semiconductor channel material layer 60L may be sequentially deposited in the memory openings 49. The blocking dielectric layer 52 may include a single dielectric material layer or a stack of a plurality of dielectric material layers. In one embodiment, the blocking dielectric layer may include a dielectric metal oxide layer consisting essentially of a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the blocking dielectric layer 52 may include a dielectric metal oxide having a dielectric constant greater than 7.9, i.e., having a dielectric constant greater than the dielectric constant of silicon nitride. The thickness of the dielectric metal oxide layer may be in a range from 1 nm to 20 nm, although lesser and greater thicknesses may also be used. The dielectric metal oxide layer may subsequently function as a dielectric material portion that blocks leakage of stored electrical charges to control gate electrodes. In one embodiment, the blocking dielectric layer 52 includes aluminum oxide. Alternatively, or additionally, the blocking dielectric layer 52 may include a dielectric semiconductor compound such as silicon oxide, silicon oxynitride, silicon nitride, or a combination thereof.

Subsequently, the charge storage layer 54 may be formed. In one embodiment, the charge storage layer 54 may be a continuous layer or patterned discrete portions of a charge trapping material including a dielectric charge trapping material, which may be, for example, silicon nitride. Alternatively, the charge storage layer 54 may include a continuous layer or patterned discrete portions of a conductive material such as doped polysilicon or a metallic material that is patterned into multiple electrically isolated portions (e.g., floating gates), for example, by being formed within lateral recesses into sacrificial material layers (142, 242). In one embodiment, the charge storage layer 54 may include a silicon nitride layer. In one embodiment, the sacrificial material layers (142, 242) and the insulating layers (132, 232) may have vertically coincident sidewalls, and the charge storage layer 54 may be formed as a single continuous layer. Alternatively, the sacrificial material layers (142, 242) may be laterally recessed with respect to the sidewalls of the insulating layers (132, 232), and a combination of a deposition process and an anisotropic etch process may be used to form the charge storage layer 54 as a plurality of memory material portions that are vertically spaced apart. The thickness of the charge storage layer 54 may be in a range from 2 nm to 20 nm, although lesser and greater thicknesses may also be used.

The tunneling dielectric layer 56 may include a dielectric material through which charge tunneling may be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 56 may include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 56 may include a stack of a first silicon oxide layer, a silicon oxynitride layer, and a second silicon oxide layer, which is commonly known as an ONO stack. In one embodiment, the tunneling dielectric layer 56 may include a silicon oxide layer that is substantially free of carbon or a silicon oxynitride layer that is substantially free of carbon. The thickness of the tunneling dielectric layer 56 may be in a range from 2 nm to 20 nm, although lesser and greater thicknesses may also be used. The stack of the blocking dielectric layer 52, the charge storage layer 54, and the tunneling dielectric layer 56 constitutes a memory film 50 that stores memory bits.

The semiconductor channel material layer 60L includes a p-doped semiconductor material such as at least one elemental semiconductor material, at least one III-V compound semiconductor material, at least one II-VI compound semiconductor material, at least one organic semiconductor material, or other semiconductor materials known in the art. In one embodiment, the semiconductor channel material layer 60L may having a uniform doping. In one embodiment, the semiconductor channel material layer 60L has a p-type doping in which p-type dopants (such as boron atoms) are present at an atomic concentration in a range from $1.0 \times 10^{12}/cm^3$ to $1.0 \times 10^{18}/cm^3$, such as from $1.0 \times 10^{14}/cm^3$ to $1.0 \times 10^{17}/cm^3$. In one embodiment, the semiconductor channel material layer 60L may include, and/or consist essentially of, boron-doped amorphous silicon or boron-doped polysilicon. In another embodiment, the semiconductor channel material layer 60L may have an n-type doping in which n-type dopants (such as phosphor atoms or arsenic atoms) are present at an atomic concentration in a range from $1.0 \times 10^{15}/cm^3$ to $1.0 \times 10^{19}/cm^3$, such as from $1.0 \times 10^{16}/cm^3$ to $1.0 \times 10^{18}/cm^3$. The semiconductor channel material layer 60L may be formed by a conformal deposition method such as low pressure chemical vapor deposition (LPCVD). The thickness of the semiconductor channel material layer 60L may be in a range from 2 nm to 10 nm, although lesser and greater thicknesses may also be used. A cavity 49' may be formed in the volume of each memory opening 49 that is not filled with the deposited material layers (52, 54, 56, 60L).

Figure 9D:
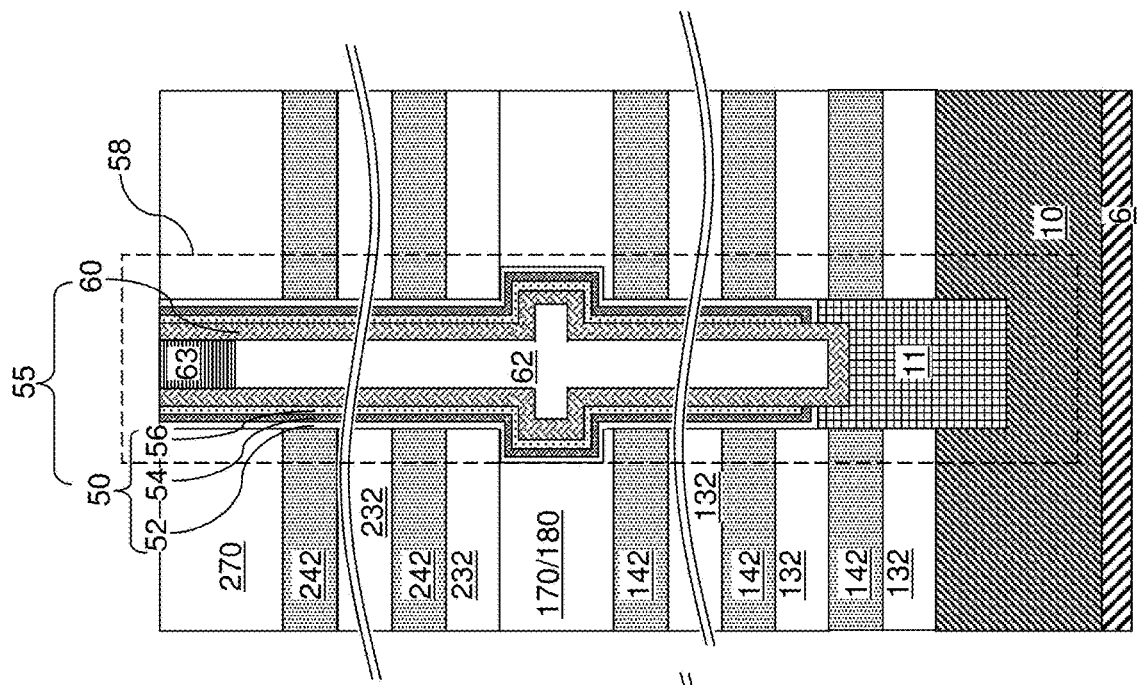
Figure 9C:
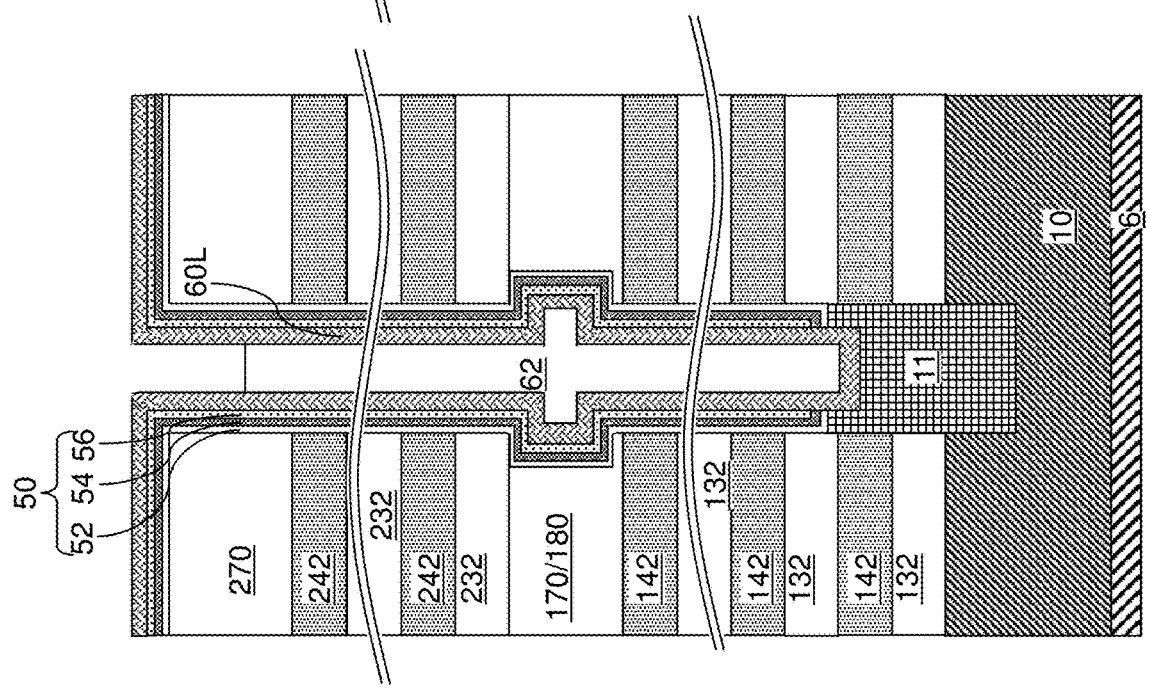

Referring to FIG. 9C, in case the cavity 49' in each memory opening is not completely filled by the semiconductor channel material layer 60L, a dielectric core layer may be deposited in the cavity 49' to fill any remaining portion of the cavity 49' within each memory opening. The dielectric core layer may include a dielectric material such as silicon oxide or organosilicate glass. The dielectric core layer may be deposited by a conformal deposition method such as low pressure chemical vapor deposition (LPCVD), or by a self-planarizing deposition process such as spin coating. The horizontal portion of the dielectric core layer overlying the second insulating cap layer 270 may be removed, for example, by a recess etch. The recess etch continues until top surfaces of the remaining portions of the dielectric core layer are recessed to a height between the top surface of the second insulating cap layer 270 and the bottom surface of the second insulating cap layer 270. Each remaining portion of the dielectric core layer constitutes a dielectric core 62.

Referring to FIG. 9D, a doped semiconductor material may be deposited in cavities overlying the dielectric cores 62. The doped semiconductor material has a doping of the opposite conductivity type of the doping of the semiconductor channel material layer 60L. Thus, the doped semiconductor material has an n-type doping. Portions of the deposited doped semiconductor material, the semiconductor channel material layer 60L, the tunneling dielectric layer 56, the charge storage layer 54, and the blocking dielectric layer 52 that overlie the horizontal plane including the top surface of the second insulating cap layer 270 may be removed by a planarization process such as a chemical mechanical planarization (CMP) process.

Each remaining portion of the n-doped semiconductor material constitutes a drain region 63. The dopant concentration in the drain regions 63 may be in a range from $5.0 \times 10^{19}/cm^3$ to $2.0 \times 10^{21}/cm^3$, although lesser and greater dopant concentrations may also be used. The doped semiconductor material may be, for example, doped polysilicon.

Each remaining portion of the semiconductor channel material layer 60L may constitute a vertical semiconductor channel 60 through which electrical current may flow when a vertical NAND device including the vertical semiconductor channel 60 is turned on. A tunneling dielectric layer 56 may be surrounded by a charge storage layer 54, and laterally surrounds a vertical semiconductor channel 60. Each adjoining set of a blocking dielectric layer 52, a charge storage layer 54, and a tunneling dielectric layer 56 collectively constitute a memory film 50, which may store electrical charges with a macroscopic retention time. In some embodiments, a blocking dielectric layer 52 may not be present in the memory film 50 at this step, and a blocking dielectric layer may be subsequently formed after formation of backside recesses. As used herein, a macroscopic retention time refers to a retention time suitable for operation of a memory device as a permanent memory device such as a retention time in excess of 24 hours.

Each combination of a memory film 50 and a vertical semiconductor channel 60 (which is a vertical semiconductor channel) within a memory opening 49 constitutes a memory stack structure 55. The memory stack structure 55 may be a combination of a vertical semiconductor channel 60, a tunneling dielectric layer 56, a plurality of memory elements comprising portions of the charge storage layer 54, and an optional blocking dielectric layer 52. Each combination of a memory stack structure 55, a dielectric core 62, and a drain region 63 within a memory opening 49 constitutes a memory opening fill structure 58. The source semiconductor layer 10, the first-tier structure (132, 142, 170, 165), the second-tier structure (232, 242, 270, 265, 72), the inter-tier dielectric layer 180, and the memory opening fill structures 58 collectively constitute a memory-level assembly.

Figure 10:
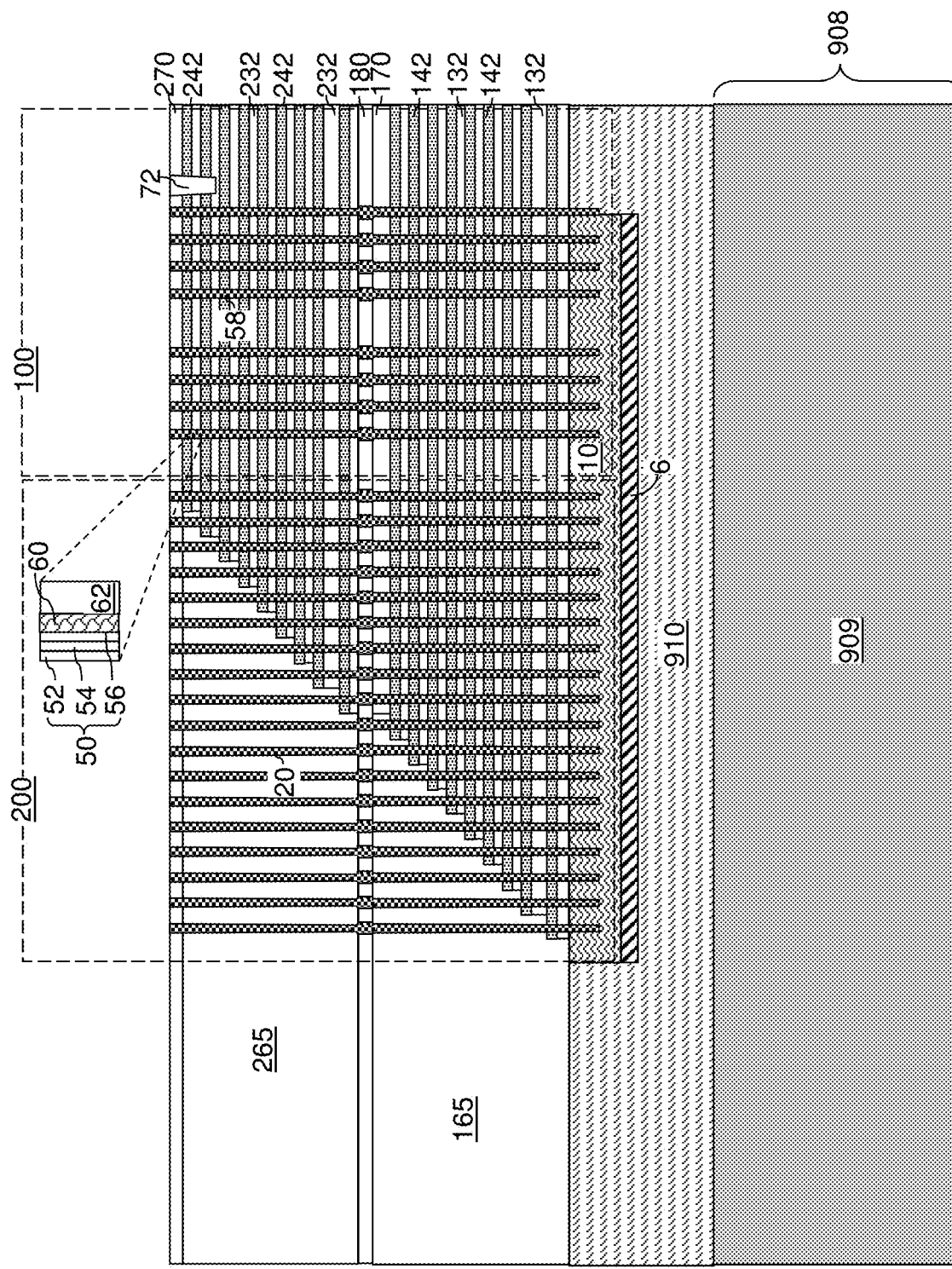
FIG. 10 is a vertical cross-sectional view of the exemplary structure after formation of memory opening fill structures and support pillar structures according to the first embodiment of the present disclosure.

Referring to FIG. 10, the exemplary structure is illustrated after formation of the memory opening fill structures 58. Support pillar structures 20 may be formed in the support openings 19 concurrently with formation of the memory opening fill structures 58. Each support pillar structure 20 may have a same set of components as a memory opening fill structure 58.

Figure 11A:
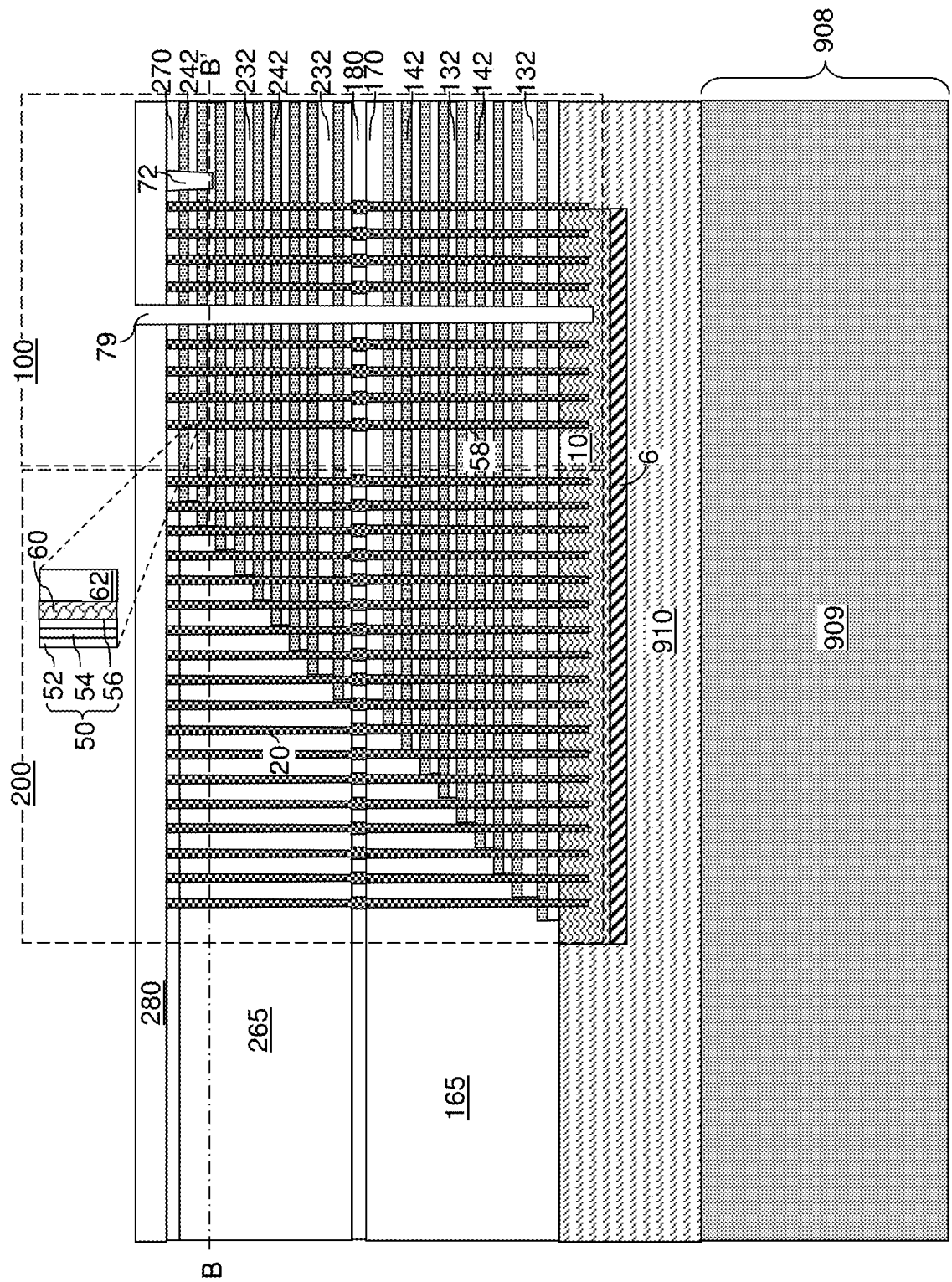
FIG. 11A is a vertical cross-sectional view of the exemplary structure after formation of a first contact-level dielectric layer and backside trenches according to the first embodiment of the present disclosure.
Figure 11B:
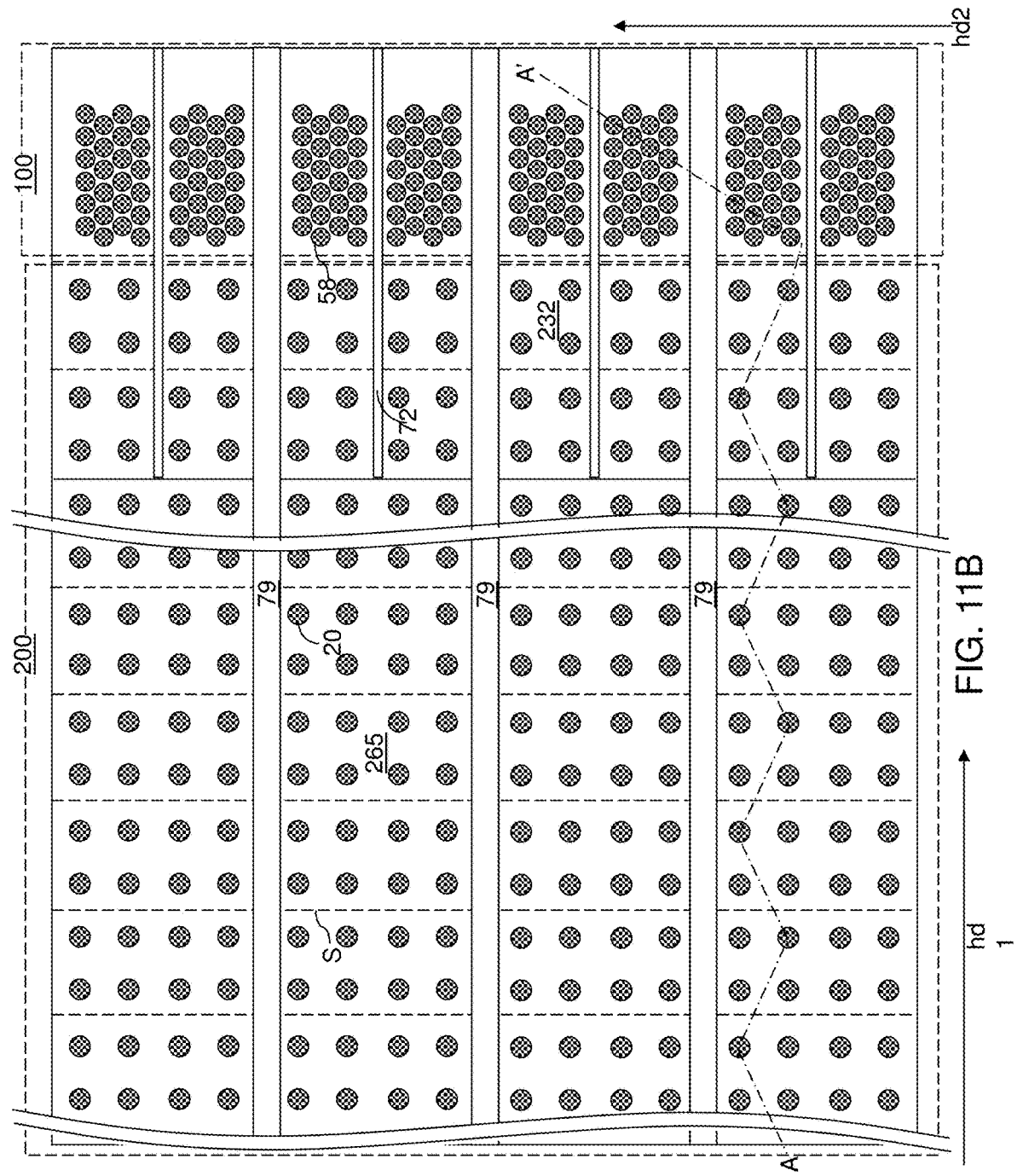
FIG. 11B is a horizontal cross-sectional of the exemplary structure along the horizontal plane B-B' of FIG. 11A. The hinged vertical plane A-A' corresponds to the plane of the vertical cross-sectional view of FIG. 11A.

Referring to FIGS. 11A and 11B, a first contact-level dielectric layer 280 may be formed over the second-tier structure (232, 242, 270, 265, 72). The first contact-level dielectric layer 280 includes a dielectric material such as silicon oxide, and may be formed by a conformal or non-conformal deposition process. For example, the first contact-level dielectric layer 280 may include undoped silicate glass and may have a thickness in a range from 100 nm to 600 nm, although lesser and greater thicknesses may also be used.

A photoresist layer (not shown) may be applied over the first contact-level dielectric layer 280 and may be lithographically patterned to form elongated openings that extend along the first horizontal direction hd1 between clusters of memory opening fill structures 58. Backside trenches 79 may be formed by transferring the pattern in the photoresist layer through the first contact-level dielectric layer 280, the second-tier structure (232, 242, 270, 265, 72), and the first-tier structure (132, 142, 170, 165), and into the source semiconductor layer 10. Portions of the first contact-level dielectric layer 280, the second-tier structure (232, 242, 270, 265, 72), the first-tier structure (132, 142, 170, 165), and the source semiconductor layer 10 that underlie the openings in the photoresist layer may be removed to form the backside trenches 79. In one embodiment, the backside trenches 79 may be formed between clusters of memory stack structures 55. The clusters of the memory stack structures 55 may be laterally spaced apart along the second horizontal direction hd2 by the backside trenches 79. While it may be desirable for the backside trenches 79 to be formed with completely straight sidewalls, the backside trenches 79 are often formed with local width variations with non-straight surfaces due to various effects including local variations of process parameters (such as local variations in gas flow, pressure, electrical field, etc.) and charge density variations within the exemplary structure due to local layout variations of conductive components within the exemplary structure.

Figure 12:
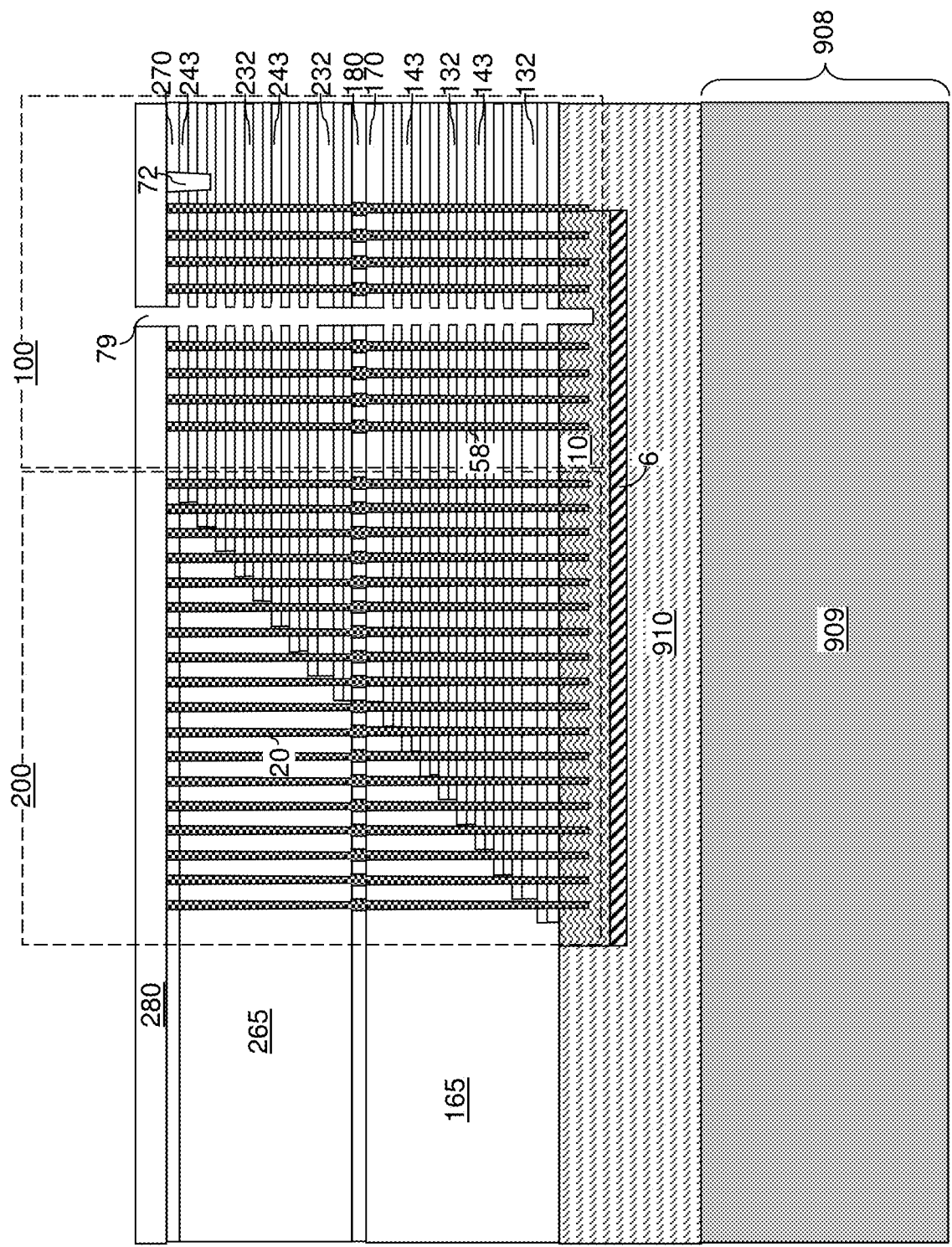
FIG. 12 is a vertical cross-sectional view of the exemplary structure after formation of backside recesses according to the first embodiment of the present disclosure.

Referring to FIG. 12, the sacrificial material layers (142, 242) may be removed selective to the insulating layers (132, 232), the first and second insulating cap layers (170, 270), the first contact-level dielectric layer 280, and the source semiconductor layer 10. For example, an etchant that selectively etches the materials of the sacrificial material layers (142, 242) with respect to the materials of the insulating layers (132, 232), the first and second insulating cap layers (170, 270), the stepped dielectric material portions (165, 265), and the material of the outermost layer of the memory films 50 may be introduced into the backside trenches 79 using an isotropic etch process. For example, the sacrificial material layers (142, 242) may include silicon nitride, the materials of the insulating layers (132, 232), the first and second insulating cap layers (170, 270), the stepped dielectric material portions (165, 265), and the outermost layer of the memory films 50 may include silicon oxide materials.

The isotropic etch process may be a wet etch process using a wet etch solution, or may be a gas phase (dry) etch process in which the etchant is introduced in a vapor phase into the backside trench 79. For example, if the sacrificial material layers (142, 242) include silicon nitride, the etch process may be a wet etch process in which the exemplary structure is immersed within a wet etch tank including phosphoric acid, which etches silicon nitride selective to silicon oxide, silicon, and various other materials used in the art.

Backside recesses (143, 243) may be formed in volumes from which the sacrificial material layers (142, 242) are removed. The backside recesses (143, 243) may include first backside recesses 143 that are formed in volumes from which the first-tier sacrificial material layers 142 are removed and second backside recesses 243 that are formed in volumes from which the second-tier sacrificial material layers 242 are removed. Each of the backside recesses (143, 243) may be a laterally extending cavity having a lateral dimension that is greater than the vertical extent of the cavity. In other words, the lateral dimension of each of the backside recesses (143, 243) may be greater than the height of the respective backside recess (143, 243). A plurality of backside recesses (143, 243) may be formed in the volumes from which the material of the sacrificial material layers (142, 242) is removed. Each of the backside recesses (143, 243) may extend substantially parallel to the top surface of the semiconductor substrate layer 909. A backside recess (143, 243) may be vertically bounded by a top surface of an underlying insulating layer (132, 232) and a bottom surface of an overlying insulating layer (132, 232). In one embodiment, each of the backside recesses (143, 243) may have a uniform height throughout.

Figure 13A:
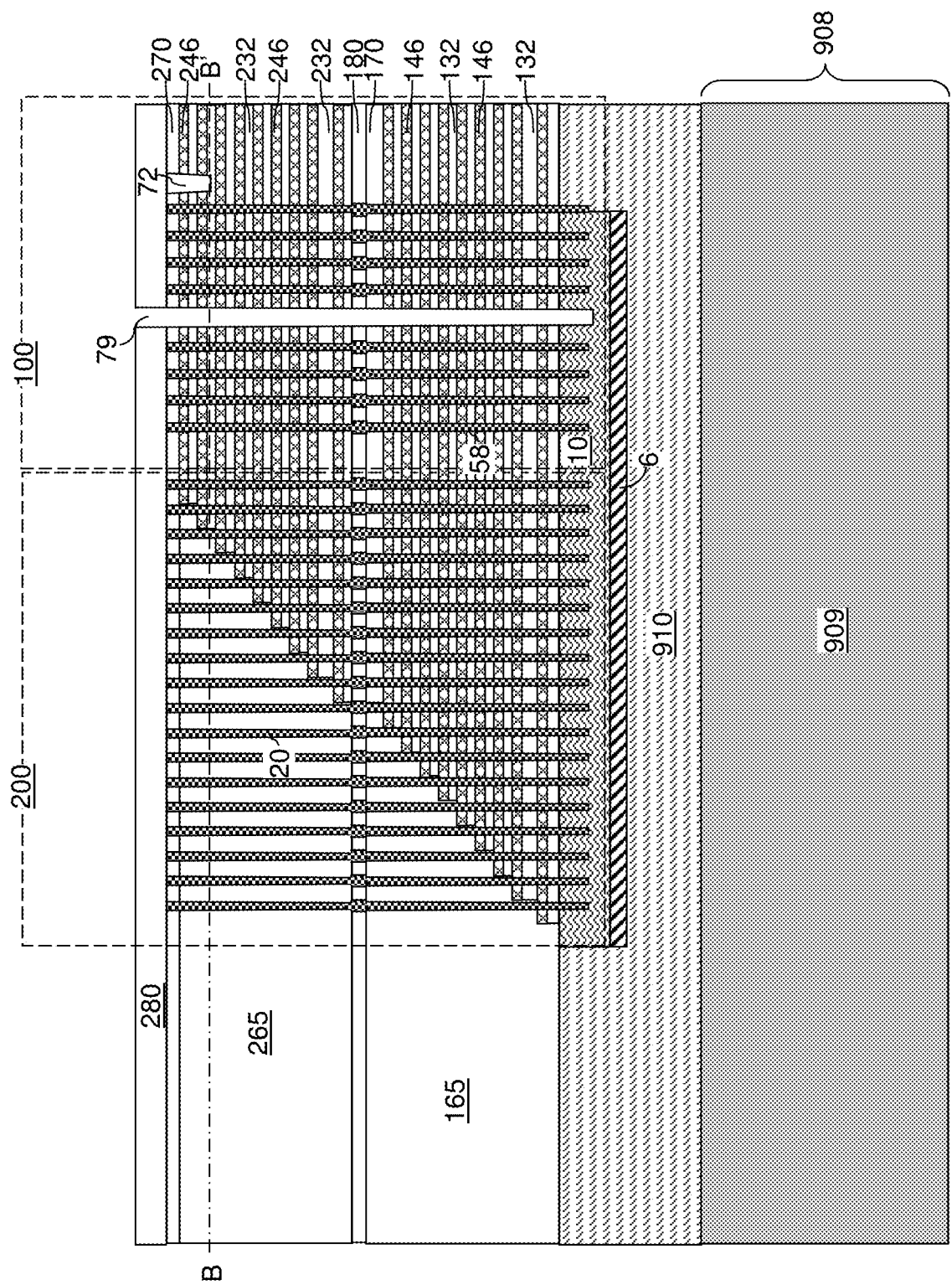
FIG. 13A is a vertical cross-sectional view of the exemplary structure after formation of electrically conductive layers according to the first embodiment of the present disclosure.
Figure 13B:
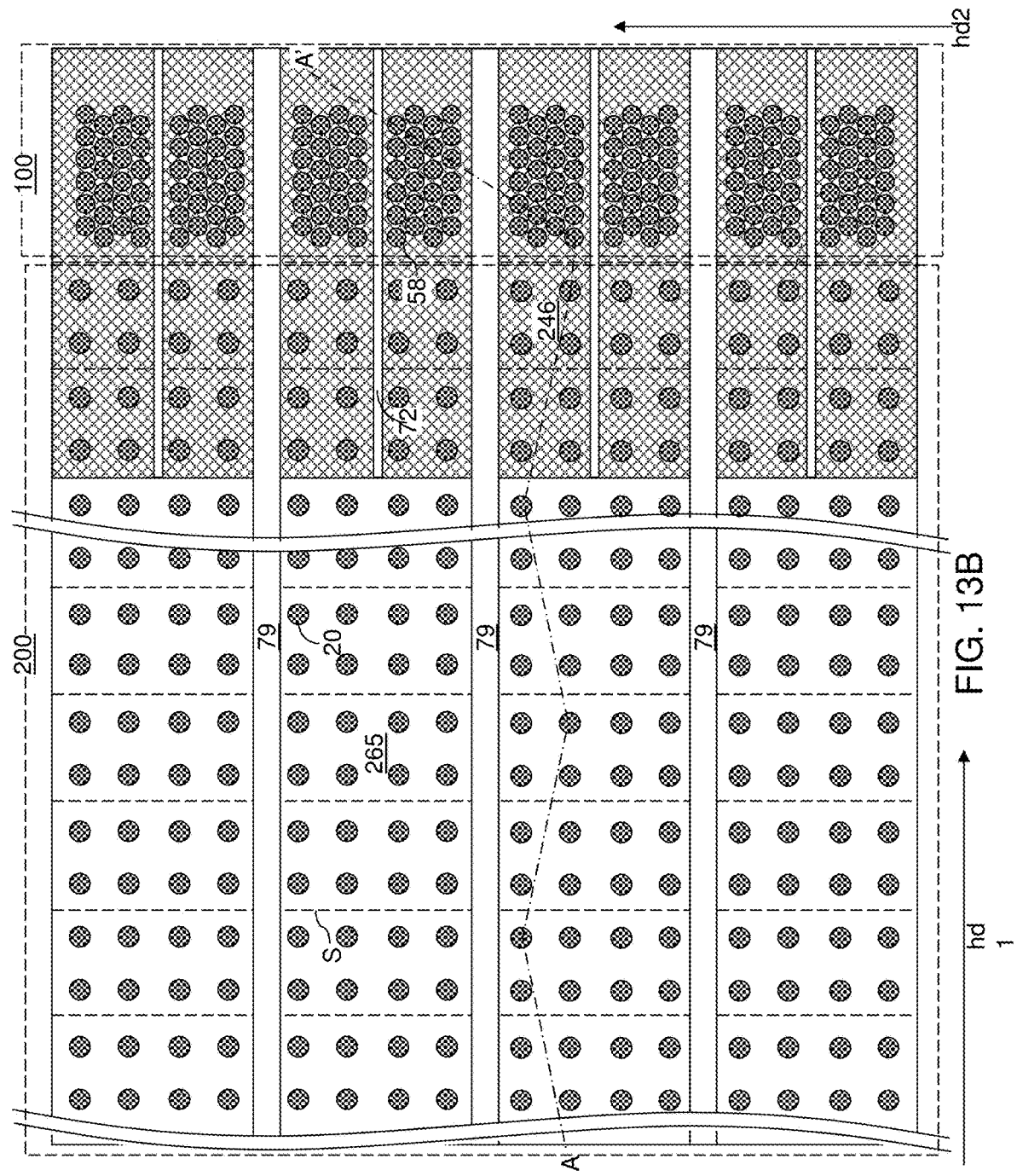
FIG. 13B is a horizontal cross-sectional of the exemplary structure along the horizontal plane B-B' of FIG. 13A. The hinged vertical plane A-A' corresponds to the plane of the vertical cross-sectional view of FIG. 13A.

Referring to FIGS. 13A and 13B, an oxidation process may be performed to oxidize physically exposed portions of the pedestal channel portions 11. Tubular insulating spacers (not expressly illustrated) may be formed around each pedestal channel portion 11. A backside blocking dielectric layer (not shown) may be optionally deposited in the backside recesses (143, 243) and the backside trenches 79 and over the first contact-level dielectric layer 280. The backside blocking dielectric layer may include a dielectric material such as a dielectric metal oxide, silicon oxide, or a combination thereof. For example, the backside blocking dielectric layer may include aluminum oxide. The backside blocking dielectric layer may be formed by a conformal deposition process such as atomic layer deposition or chemical vapor deposition. The thickness of the backside blocking dielectric layer may be in a range from 1 nm to 20 nm, such as from 2 nm to 10 nm, although lesser and greater thicknesses may also be used.

At least one conductive material may be deposited in the plurality of backside recesses (243, 243), on the sidewalls of the backside trenches 79, and over the first contact-level dielectric layer 280. The at least one conductive material may be deposited by a conformal deposition method, which may be, for example, chemical vapor deposition (CVD), atomic layer deposition (ALD), electroless plating, electroplating, or a combination thereof. The at least one conductive material may include an elemental metal, an intermetallic alloy of at least two elemental metals, a conductive nitride of at least one elemental metal, a conductive metal oxide, a conductive doped semiconductor material, a conductive metal-semiconductor alloy such as a metal silicide, alloys thereof, and combinations or stacks thereof.

In one embodiment, the at least one conductive material may include at least one metallic material, i.e., an electrically conductive material that includes at least one metallic element. Non-limiting exemplary metallic materials that may be deposited in the backside recesses (143, 243) include tungsten, tungsten nitride, titanium, titanium nitride, tantalum, tantalum nitride, cobalt, and ruthenium. For example, the at least one conductive material may include a conductive metallic nitride liner that includes a conductive metallic nitride material such as TiN, TaN, WN, or a combination thereof, and a conductive fill material such as W, Co, Ru, Mo, Cu, or combinations thereof. In one embodiment, the at least one conductive material for filling the backside recesses (143, 243) may be a combination of titanium nitride layer and a tungsten fill material.

Electrically conductive layers (146, 246) may be formed in the backside recesses (143, 243) by deposition of the at least one conductive material. A plurality of first-tier electrically conductive layers 146 may be formed in the plurality of first backside recesses 143, a plurality of second-tier electrically conductive layers 246 may be formed in the plurality of second backside recesses 243, and a continuous metallic material layer (not shown) may be formed on the sidewalls of each backside trench 79 and over the first contact-level dielectric layer 280. Each of the first-tier electrically conductive layers 146 and the second-tier electrically conductive layers 246 may include a respective conductive metallic nitride liner and a respective conductive fill material. Thus, the first and second sacrificial material layers (142, 242) may be replaced with the first and second electrically conductive layers (146, 246), respectively. Specifically, each first-tier sacrificial material layer 142 may be replaced with an optional portion of the backside blocking dielectric layer and a first-tier electrically conductive layer 146, and each second-tier sacrificial material layer 242 may be replaced with an optional portion of the backside blocking dielectric layer and a second-tier electrically conductive layer 246. A backside cavity may be present in the portion of each backside trench 79 that is not filled with the continuous metallic material layer.

Residual conductive material may be removed from inside the backside trenches 79. Specifically, the deposited metallic material of the continuous metallic material layer may be etched back from the sidewalls of each backside trench 79 and from above the first contact-level dielectric layer 280, for example, by an anisotropic or isotropic etch. Each remaining portion of the deposited metallic material in the first backside recesses constitutes a first-tier electrically conductive layer 146. Each remaining portion of the deposited metallic material in the second backside recesses constitutes a second-tier electrically conductive layer 246. Sidewalls of the first electrically conductive material layers 146 and the second electrically conductive layers may be physically exposed to a respective backside trench 79. The backside trenches may have a pair of curved sidewalls having a non-periodic width variation along the first horizontal direction hd1 and a non-linear width variation along the vertical direction.

Each electrically conductive layer (146, 246) may be a conductive sheet including openings therein. A first subset of the openings through each electrically conductive layer (146, 246) may be filled with memory opening fill structures 58. A second subset of the openings through each electrically conductive layer (146, 246) may be filled with the support pillar structures 20. Each electrically conductive layer (146, 246) may have a lesser area than any underlying electrically conductive layer (146, 246) because of the first and second stepped surfaces. Each electrically conductive layer (146, 246) may have a greater area than any overlying electrically conductive layer (146, 246) because of the first and second stepped surfaces.

In some embodiment, drain-select-level isolation structures 72 may be provided at topmost levels of the second-tier electrically conductive layers 246. A subset of the second-tier electrically conductive layers 246 located at the levels of the drain-select-level isolation structures 72 constitutes drain select gate electrodes. A subset of the electrically conductive layer (146, 246) located underneath the drain select gate electrodes may function as combinations of a control gate and a word line located at the same level. The control gate electrodes within each electrically conductive layer (146, 246) are the control gate electrodes for a vertical memory device including the memory stack structure 55.

Each of the memory stack structures 55 may comprise a vertical stack of memory elements located at each level of the electrically conductive layers (146, 246). A subset of the electrically conductive layers (146, 246) may comprise word lines for the memory elements. The semiconductor devices in the underlying via interconnection region 400 may comprise word line switch devices configured to control a bias voltage to respective word lines. The memory-level assembly is located over the semiconductor substrate layer 909. The memory-level assembly includes at least one alternating stack (132, 146, 232, 246) and memory stack structures 55 vertically extending through the at least one alternating stack (132, 146, 232, 246).

Figure 14A:
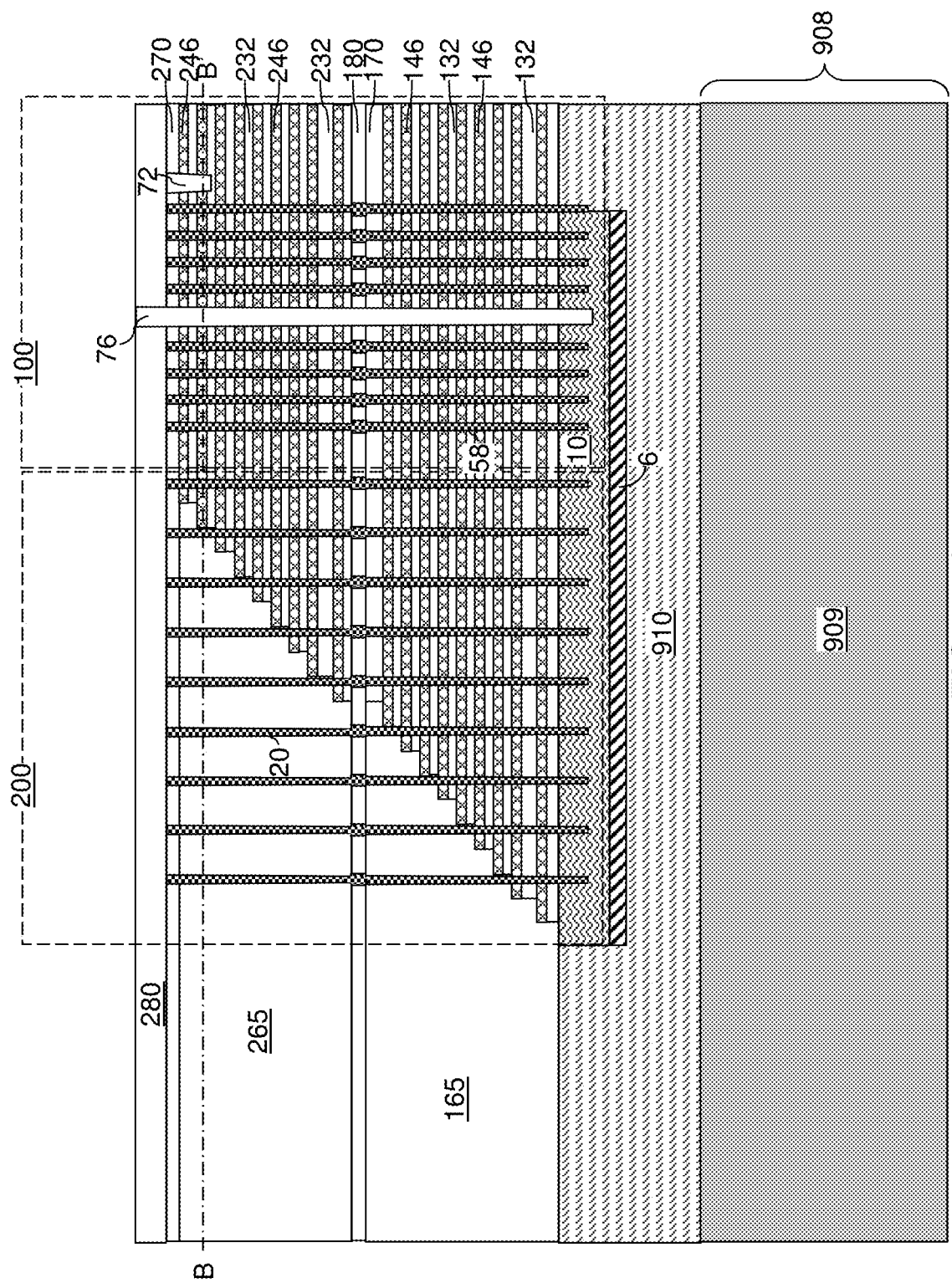
FIG. 14A is a vertical cross-sectional view of the exemplary structure after formation of backside trench fill structures in the backside trenches according to the first embodiment of the present disclosure.
Figure 14B:
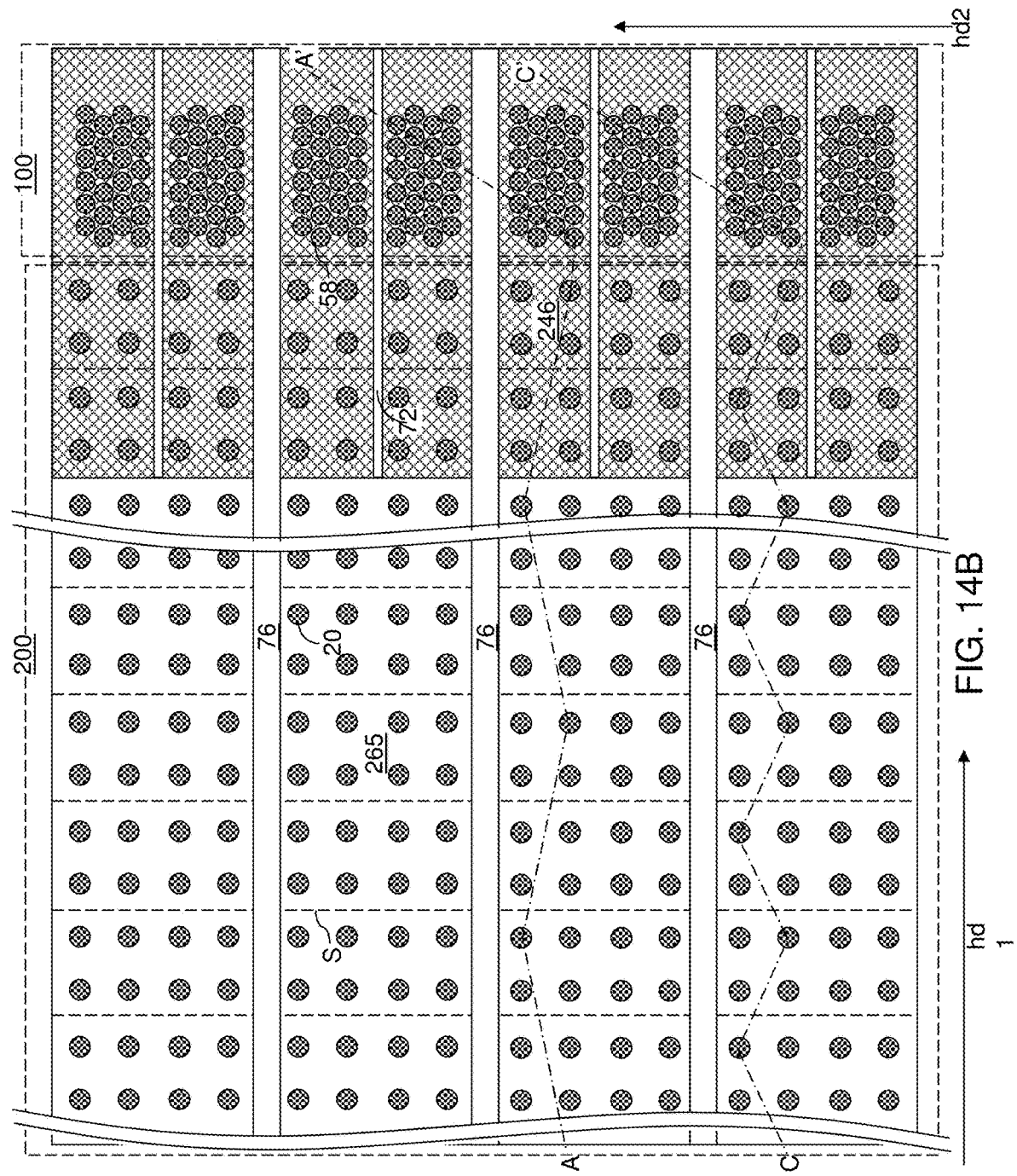
FIG. 14B is a horizontal cross-sectional of the exemplary structure along the horizontal plane B-B' of FIG. 14A. The hinged vertical plane A-A' corresponds to the plane of the vertical cross-sectional view of FIG. 14A.
Figure 14C:
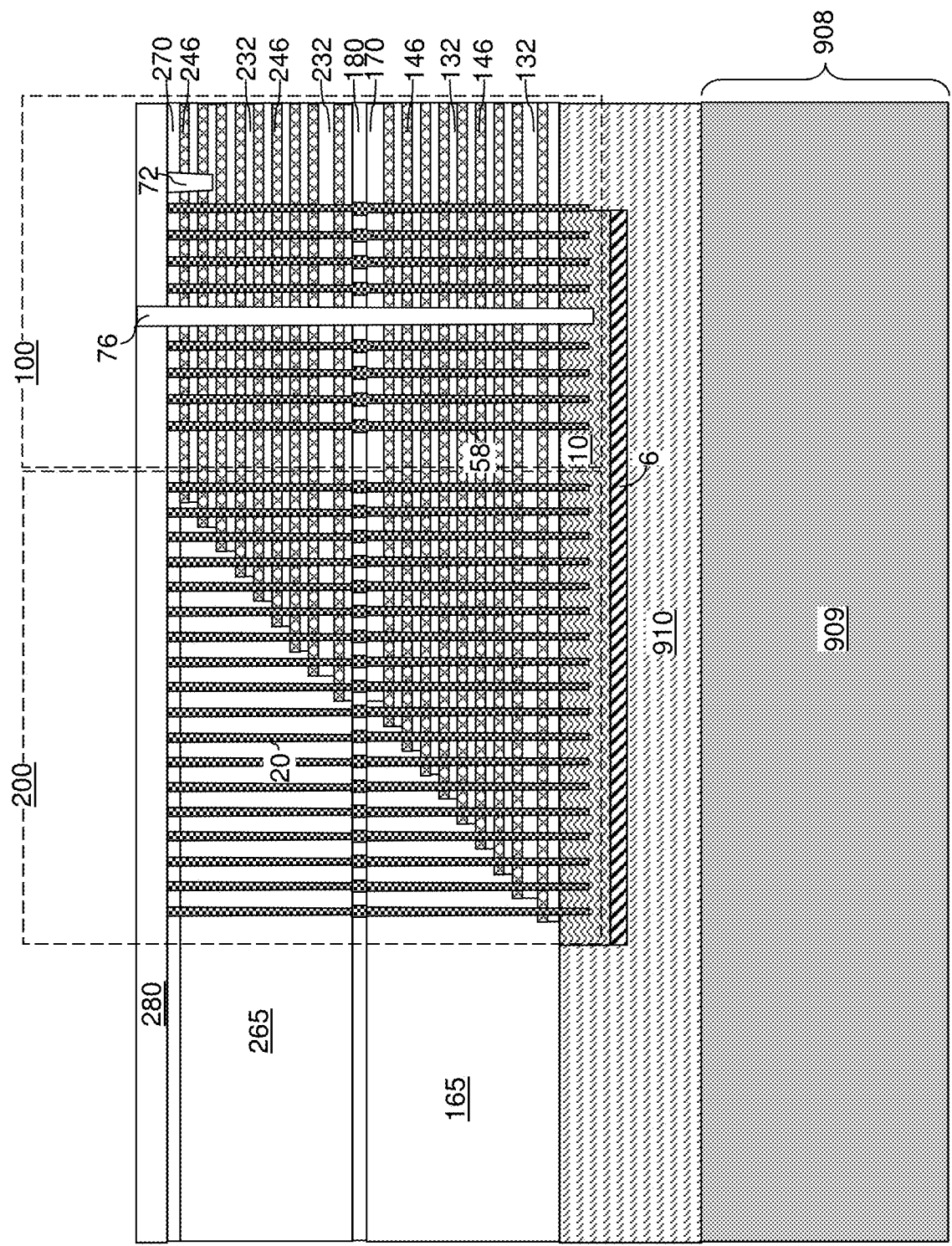
FIG. 14C is a vertical cross-sectional view of the exemplary structure along the vertical plane C-C' of FIG. 14B.

Referring to FIGS. 14A-14C, a backside trench fill structure 76 may be formed within each backside trench 79. Each backside trench fill structure 76 may consist of at least one dielectric fill material such as silicon oxide, silicon nitride, and/or a dielectric metal oxide material. Alternatively, the backside trench fill structure 76 may include a laterally-insulated source contact via structure that includes a conductive via structure contacting the source semiconductor layer 10 and a dielectric spacer that laterally surrounds the conductive via structure.

Figure 15A:
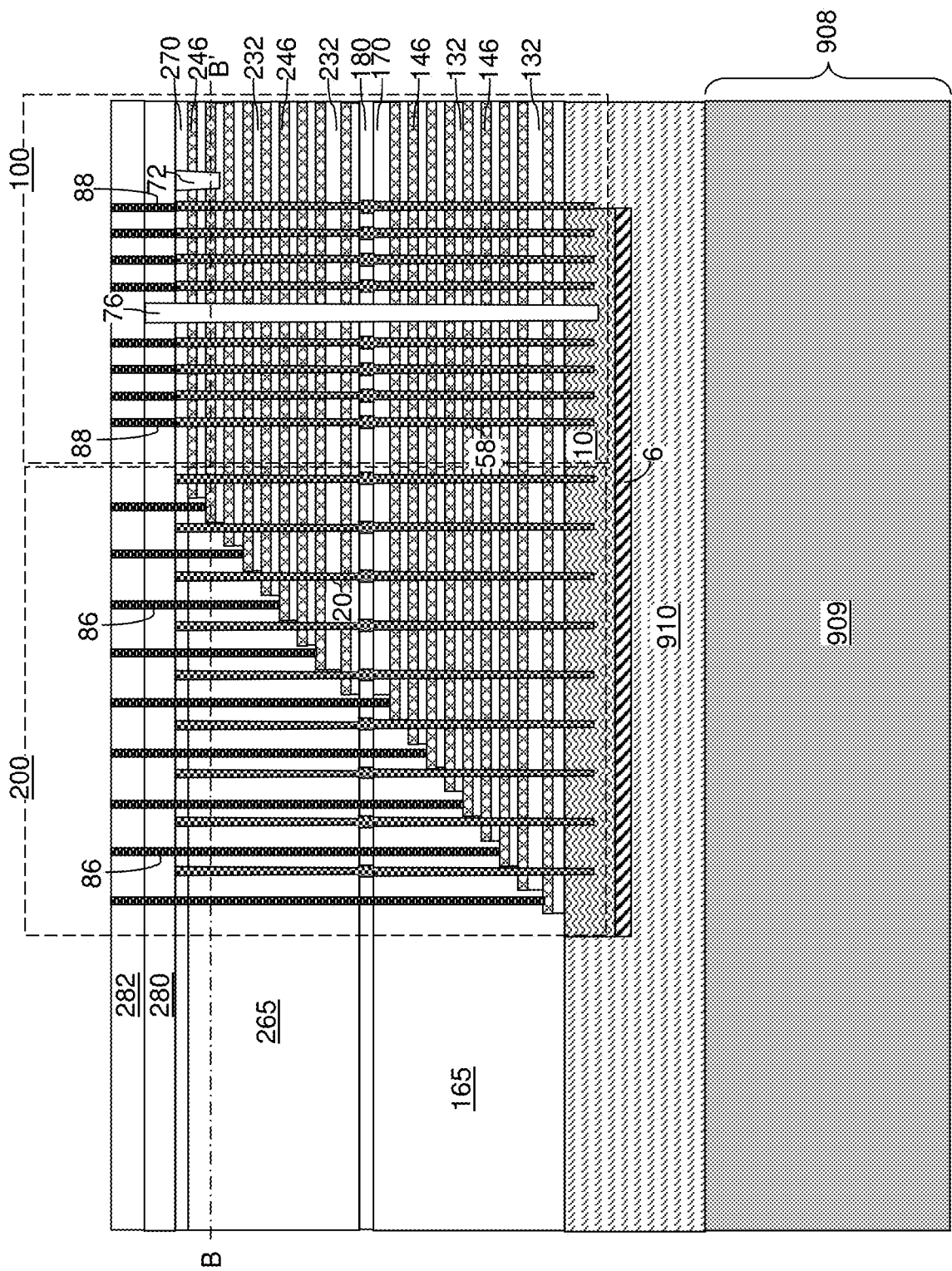
FIG. 15A is a vertical cross-sectional view of the exemplary structure after formation of a second contact-level dielectric layer and various contact via structures according to the first embodiment of the present disclosure.
Figure 15B:
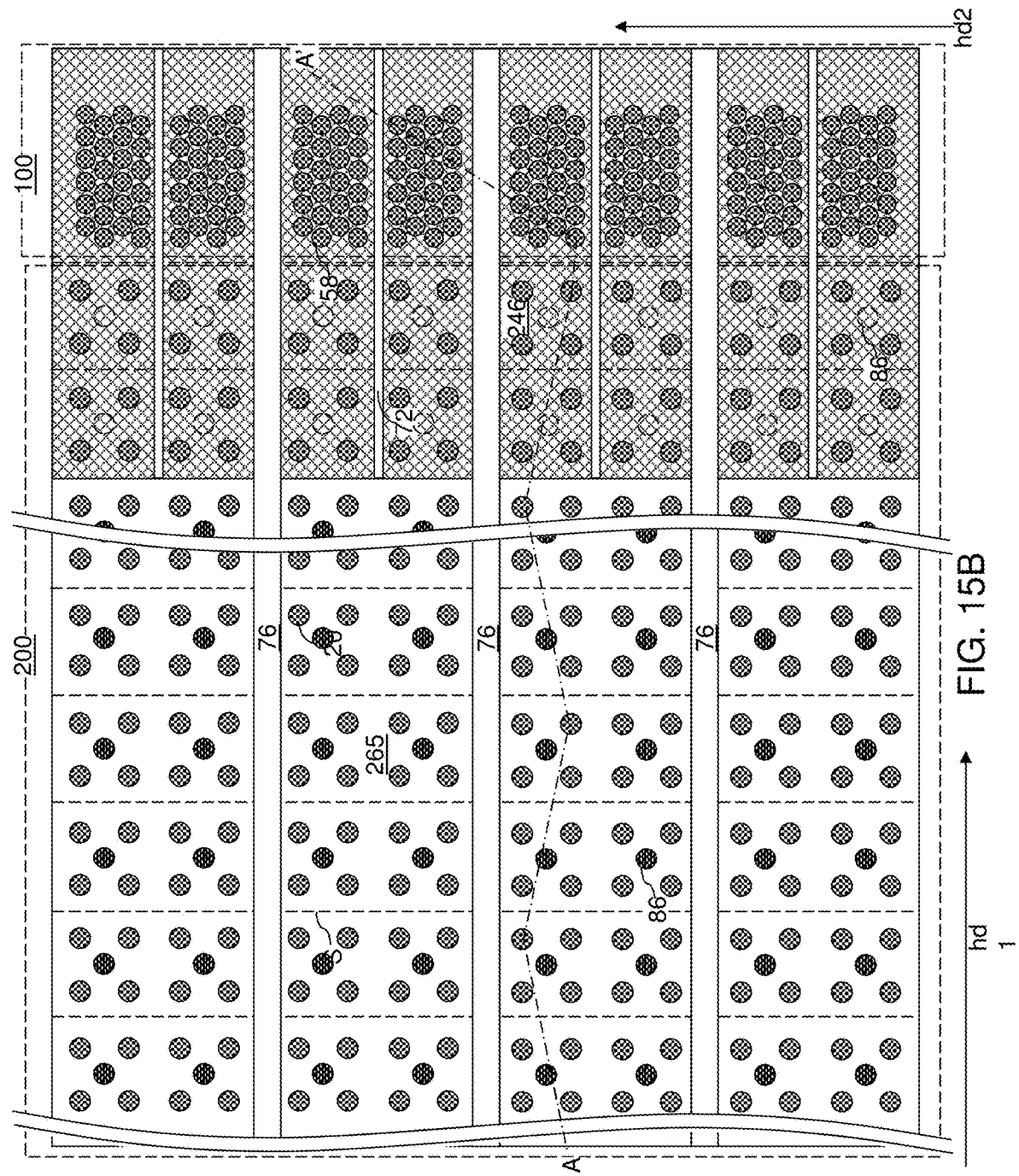
FIG. 15B is a horizontal cross-sectional view of the exemplary structure along the vertical plane B-B' of FIG. 15A. The hinged vertical plane A-A' corresponds to the plane of the vertical cross-sectional view of FIG. 15A.

Referring to FIGS. 15A and 15B, a second contact-level dielectric layer 282 may be formed over the first contact-level dielectric layer 280. The second contact-level dielectric layer 282 includes a dielectric material such as silicon oxide, and may have a thickness in a range from 100 nm to 600 nm, although lesser and greater thicknesses may also be used.

A photoresist layer (not shown) may be applied over the second contact-level dielectric layer 282, and may be lithographically patterned to form various contact via openings. For example, openings for forming drain contact via structures 88 may be formed in the memory array region 100, and openings for forming staircase region contact via structures 86 may be formed in the staircase region 200. An anisotropic etch process may be performed to transfer the pattern in the photoresist layer through the second and first contact-level dielectric layers (282, 280) and underlying dielectric material portions. The drain regions 63 and the electrically conductive layers (146, 246) may be used as etch stop structures. Drain contact via cavities may be formed over each drain region 63, and staircase-region contact via cavities may be formed over each electrically conductive layer (146. 246) at the stepped surfaces underlying the first and second stepped dielectric material portions (165, 265). The photoresist layer may be subsequently removed, for example, by ashing.

Drain contact via structures 88 may be formed in the drain contact via cavities and on a top surface of a respective one of the drain regions 63. Staircase-region contact via structures 86 may be formed in the staircase-region contact via cavities and on a top surface of a respective one of the electrically conductive layers (146, 246). The staircase-region contact via structures 86 may include drain select level contact via structures that contact a subset of the second-tier electrically conductive layers 246 that function as drain select level gate electrodes. Further, the staircase-region contact via structures 86 may include word line contact via structures that contact electrically conductive layers (146, 246) that underlie the drain select level gate electrodes and function as word lines for the memory stack structures 55.

Figure 16:
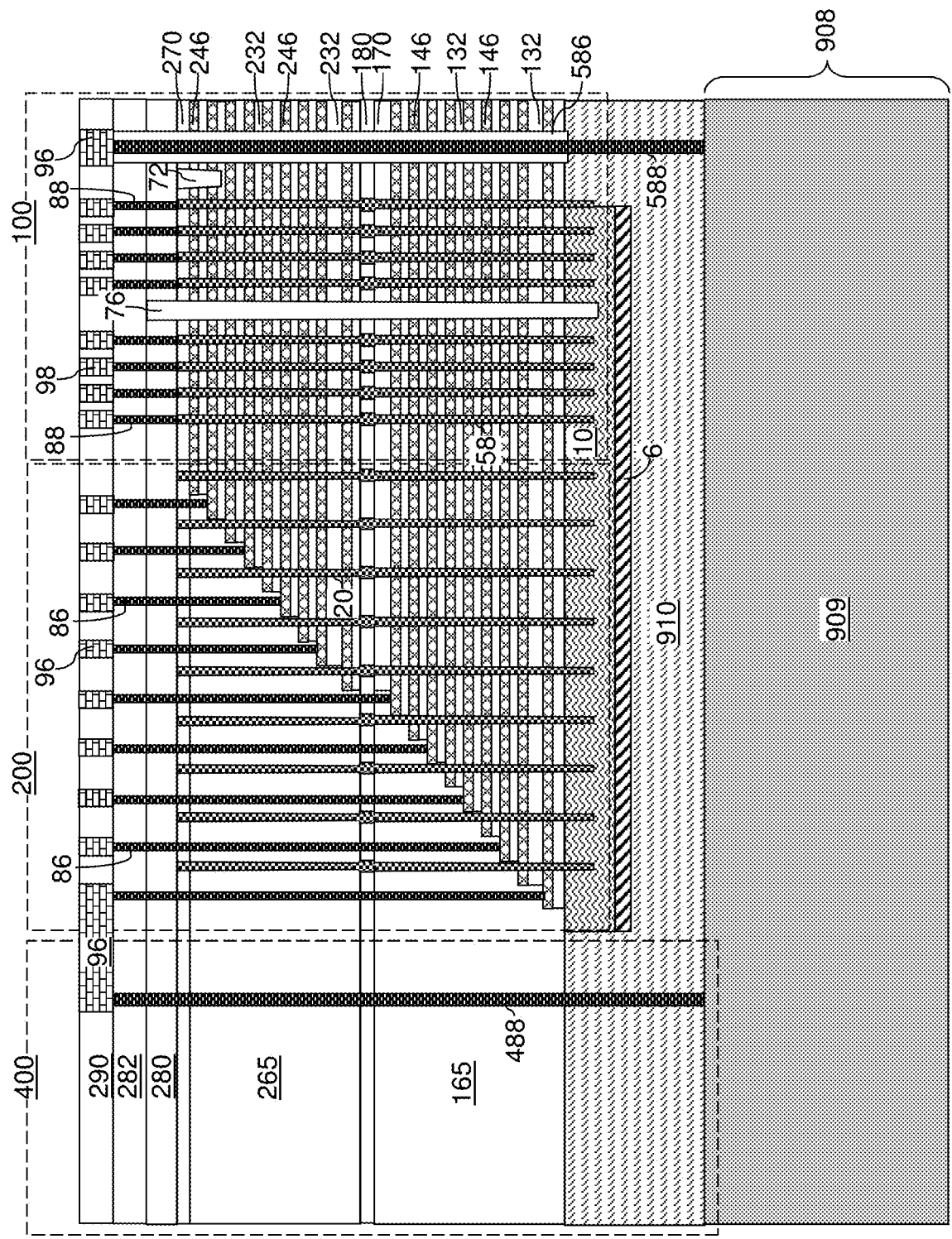
FIG. 16 is a vertical cross-sectional view of the exemplary structure after formation of metal line structures according to the first embodiment of the present disclosure.

Referring to FIG. 16, through-memory-level via cavities may be formed through the second and first contact-level dielectric layers (282, 280), the second and first stepped dielectric material portions (265, 165), and the source-side dielectric material layer 910 to top surfaces of the semiconductor substrate layer 909 in the via interconnection region 400. At least one conductive material may be deposited in the through-memory-level via cavities. Excess portions of the at least one conductive material may be removed from above the horizontal plane including the top surface of the second contact-level dielectric layer 282. Each remaining portion of the at least one conductive material in a through-memory-level via cavity constitutes a first through-memory-level via structure 488 or a second through-memory-level via structure 588. The first through-memory-level via structures 488 may be formed in the via interconnection region 400 through the retro-stepped dielectric material portions (165, 265) and the source-side dielectric material layer 910, and does not require formation of an insulating spacer therearound. The second through-memory-level via structures 588 may be formed in the memory array region 100 through the alternating stack {(132, 146), (232, 246)} of insulating layers (132, 232) and electrically conductive layers (146, 246). An insulating spacer 586 may be formed at a periphery of each through-memory-level via cavity in the memory array region 100 so that the second through-memory-level via structures 588 are electrically isolated from the alternating stack {(132, 146), (232, 246)}.

At least one additional dielectric layer may be formed over the contact-level dielectric layers (280, 282), and additional metal interconnect structures (herein referred to as upper-level metal interconnect structures) may be formed in the at least one additional dielectric layer. For example, the at least one additional dielectric layer may include a line-level dielectric layer 290 that is formed over the contact-level dielectric layers (280, 282). The upper-level metal interconnect structures may include bit lines 98 contacting a respective one of the drain contact via structures 88, and interconnection line structures 96 contacting, and/or electrically connected to, at least one of the staircase-region contact via structures 86 and/or the through-memory-level via structures 488.

In one embodiment, the three-dimensional memory device may comprises a monolithic three-dimensional NAND memory device, the electrically conductive strips (146, 246) comprise, or are electrically connected to, a respective word line of the monolithic three-dimensional NAND memory device, the substrate 908 comprises a silicon substrate, the monolithic three-dimensional NAND memory device comprises an array of monolithic three-dimensional NAND strings over the silicon substrate, and at least one memory cell in a first device level of the array of monolithic three-dimensional NAND strings is located over another memory cell in a second device level of the array of monolithic three-dimensional NAND strings. The silicon substrate may contain an integrated circuit comprising a driver circuit for the memory device located thereon, the electrically conductive strips (146, 246) comprise a plurality of control gate electrodes having a strip shape extending substantially parallel to the top surface of the substrate 908, the plurality of control gate electrodes comprise at least a first control gate electrode located in the first device level and a second control gate electrode located in the second device level. The array of monolithic three-dimensional NAND strings comprises a plurality of semiconductor channels 60, wherein at least one end portion of each of the plurality of semiconductor channels 60 extends substantially perpendicular to a top surface of the substrate 908, and one of the plurality of semiconductor channels including the vertical semiconductor channel 60. The array of monolithic three-dimensional NAND strings comprises a plurality of charge storage elements (comprising portions of the memory films 50), each charge storage element located adjacent to a respective one of the plurality of semiconductor channels 60.

Figure 17:
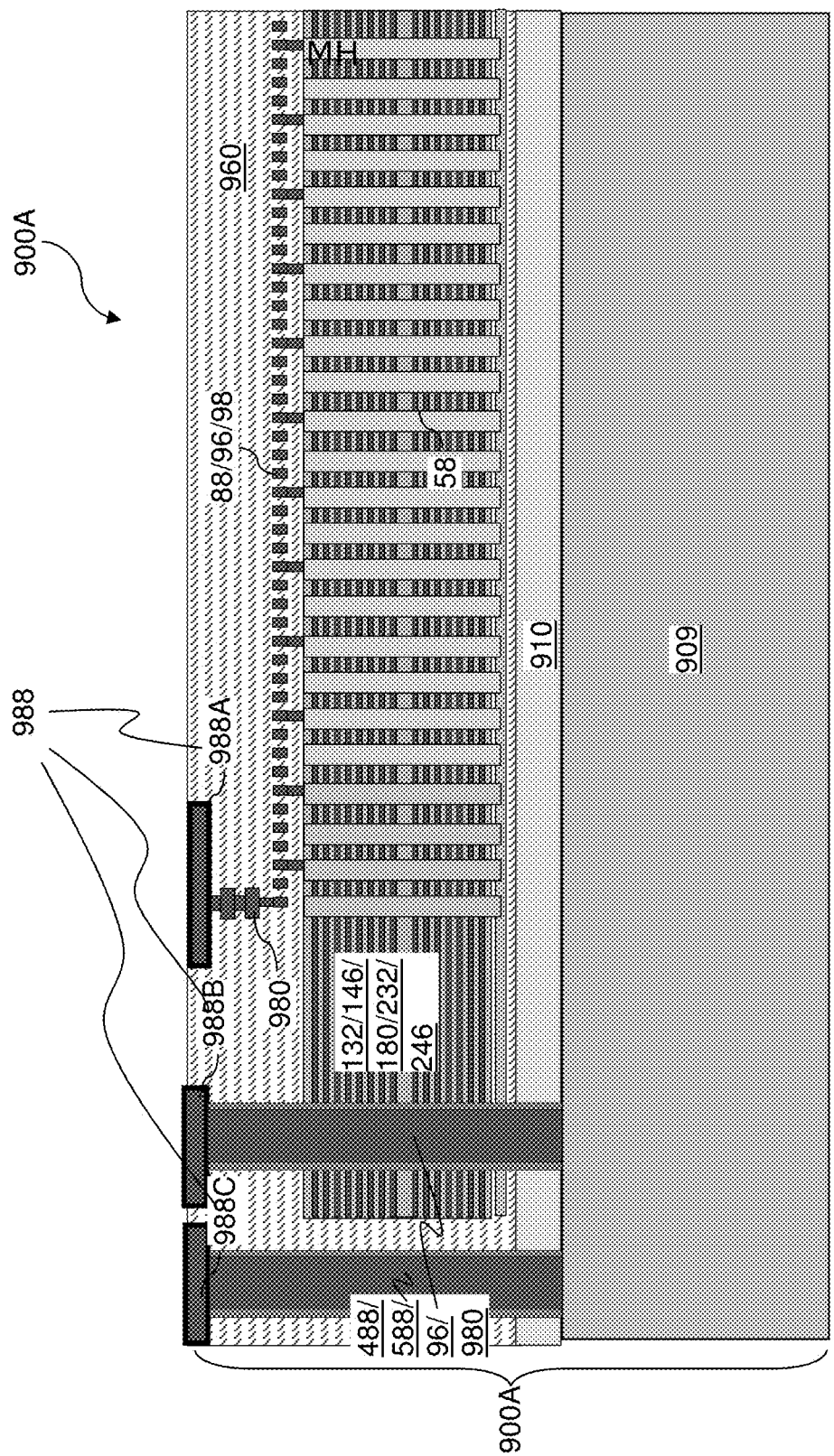
FIG. 17 is a vertical cross-sectional view of the exemplary structure that includes a first memory die after formation of additional interconnect-level dielectric material layers and first-memory-die bonding pads according to the first embodiment of the present disclosure.

Referring to FIG. 17, interconnect-level dielectric material layers 960 may be deposited over the line-level dielectric layer 290. Various additional memory-die metal interconnect structures 980 may be formed in the interconnect-level dielectric material layers 960. Generally, the various metal interconnect structures (88, 86, 98, 96, 980) may be formed in the combination of the first contact-level dielectric layer 280, the second contact-level dielectric layer 282, the line-level dielectric layer 290, and the interconnect-level dielectric material layers 960 with appropriate shifting of metal interconnect levels. The thickness of the interconnect-level dielectric material layers 960 may be in a range from 300 nm to 3,000 nm, although lesser and greater thicknesses may also be used.

Pad cavities may be formed on components of the additional memory-die metal interconnect structures 980 such that a respective one of the memory-die metal interconnect structures 980 is exposed at the bottom of each pad cavity. In one embodiment, the pad cavities may be arranged as a one-dimensional array or as a two-dimensional array, and may have a respective polygonal, circular, elliptical, or generally-curvilinear shape.

A conductive material may be deposited in the pad cavities to form various memory-die bonding pads. The exemplary structure comprises a memory die, which also referred to as a first memory die 900A. The memory-die bonding pads of the first memory die 900A are herein referred to as first-memory-die bonding pads 988. The first memory-side bonding pads 988 may be metal bonding pads that provides metal-to-metal bonding with mating bonding pads on another semiconductor die. In one embodiment, the first memory-side bonding pads 988 may be copper pads for providing copper-to-copper bonding.

Generally, the first memory die 900A includes an array of first memory stack structures extending through a first alternating stack of first insulating layers (132, 232) and first electrically conductive layers (146, 246), first drain regions 63 contacting an end portion of each first vertical semiconductor channel 60 in the first memory stack structures, and first bit lines 98 electrically connected to a respective subset of the first drain regions 63. The first insulating layers (132, 232) may include all of the first-tier insulating layers 132 and the second-tier insulating layers 232 within the first memory die 900A. The first electrically conductive layers (146, 246) may include all of the first-tier electrically conductive layers 146 and the second-tier electrically conductive layers 246.

The first through-memory-level via structures 488 and/or the second through-memory-level via structures 588 may be formed prior to, or after, formation of the line-level dielectric layer 290, and/or after formation of any number of sublayers within the interconnect-level dielectric material layers 960. In some embodiments, at least one intervening first-memory-die metal interconnect structure 980 may be provided between each, or any, of the first through-memory-level via structures 488 and/or the second through-memory-level via structures 588 and a first-memory-die bonding pad 988 of the first memory die 900A that is in electrical contact therewith. In some other embodiments, the first through-memory-level via structures 488 and/or the second through-memory-level via structures 588 may be in direct contact with a respective one of the first-memory-die bonding pads 988 of the first memory die 900A.

The first-memory-die bonding pads 988 of the first memory die 900A may include various types of bonding pads for providing different types of electrically conductive paths between the first memory die 900A and a support die to be subsequently bonded to the first memory die 900A. Specifically, the first-memory-die bonding pads 988 may include first-type first-memory-die bonding pads 988A configured to provide first-type electrically conductive paths between the first memory die 900A and the support die to be subsequently bonded to the first memory die 900A. The first-type first-memory-die bonding pads 988A may be formed in, or on, a first side of the first memory die 900A. The first side of the first memory die 900A may be the side including a physically exposed planar surface of the memory-die metal interconnect structures 980 of the first memory die 900A. The memory-die metal interconnect structures 980 of the first memory die 900A are herein referred to as first-memory-die metal interconnect structures 980. Each of the first-type first-memory-die bonding pads 988A may be electrically connected to, and directly contact, a respective subset of first-memory-die metal interconnect structures 980 embedded in the first memory die 900A.

A first subset of the first-type first-memory-die bonding pads 988A may be bit-line-connection bonding pads that are electrically connected to a respective subset of first-memory-die metal interconnect structures 980 and connected to a respective one of the first bit lines 98 in the first memory die 900A. A second subset of the first-type first-memory-die bonding pads 988A may be word-line-connection bonding pads that are electrically connected to a respective subset of first-memory-die metal interconnect structures 980 and connected to a respective one of the word lines (comprising the electrically conductive layers (146, 246)) in the first memory die 900A. A third subset of the first-type first-memory-die bonding pads 988A may be source-line-connection bonding pads that are electrically connected to a respective subset of first-memory-die metal interconnect structures 980 and connected to a respective one of the source regions in the first memory die 900A.

The first-memory-die bonding pads 988 may include second-type first-memory-die bonding pads 988B configured to provide second-type electrically conductive paths between the support die to be subsequently bonded to the first side of the first memory die 900A and a second memory die to be subsequently bonded to a second side of the first memory die 900A, which is the opposite side of the first side. The second-type first-memory-die bonding pads 988B may be formed in, or on, the first side of the first memory die 900A adjacent to the first-type first-memory-die bonding pads 988A. Each of the second-type first-memory-die bonding pads 988B may be electrically isolated from the first-memory-die metal interconnect structures 980 formed in the first memory die 900A.

The first-memory-die bonding pads 988 may include third-type first-memory-die bonding pads 988C configured to provide third-type electrically conductive paths between the support die to be subsequently bonded to the first side of the first memory die 900A and external bonding pads to be subsequently formed after bonding the second memory die to the second side of the first memory die 900A. The third-type first-memory-die bonding pads 988C may be formed in, or on, the first side of the first memory die 900A adjacent to the first-type first-memory-die bonding pads 988A. Each of the third-type first-memory-die bonding pads 988C may be electrically isolated from the first-memory-die metal interconnect structures 980 formed in the first memory die 900A.

Generally, through-die connection structures (488 or 588, optionally 96, optionally 980) are provided within the first memory die 900A. Each of the through-die connection structures (488 or 588, optionally 96, optionally 980) contacts a planar surface of a respective one of the second-type first-memory-die bonding pads 988B and the third-type first-memory-die bonding pads 988C. Each of the through-die connection structures (488 or 588, optionally 96, optionally 980) may vertically extend through the interconnect-level dielectric material layers 960 of the first memory die 900A, through the alternating stacks {(132, 146), (232, 246)} and/or the retro-stepped dielectric material portions (165, 265) of the first memory die 900A, and at least partially through the source-side dielectric material layer 910 of the first memory die 900A. Generally, each of the through-die connection structures (488 or 588, optionally 96, optionally 980) extends through the first memory die 900A and includes at least one conductive via structure such as a first through-memory-level via structure 488.

In one embodiment, at least one of the through-die connection structures (488 or 588, optionally 96, optionally 980) may consist of a respective one the first through-memory-level via structures 488 and/or the second through-memory-level via structures 588 that directly contacts a respective one of the second-type first-memory-die bonding pads 988 of the first memory die 900A. In one embodiment, at least one of the through-die connection structures (488 or 588, optionally 96, optionally 980) may include a respective one the first through-memory-level via structures 488 and/or the second through-memory-level via structures 588 that is electrically connected to a respective one of the second-type first-memory-die bonding pads 988 of the first memory die 900A, and additionally include a respective subset of the first-memory-die metal interconnect structures 980 formed in the first memory die 900A and directly contacts the respective one of the second-type first-memory-die bonding pads 988. Each through-die connection structure (488 or 588, optionally 96, optionally 980) may directly contact a respective one of the second-type first-memory-die bonding pads 988 in the first memory die 900A.

In one embodiment, at least one of the through-die connection structures (488 or 588, optionally 96, optionally 980) comprises a through-memory-level via structure (such as a second through-memory-level via structure 588) that extends through each first electrically conductive layer (146, 246) within the first alternating stack {(132, 146), (232, 246)} of the first memory die 900A as a single structure having a straight sidewall from a bottom surface thereof to a top surface thereof.

A second memory die (not shown) may be provided by performing the processing steps for forming the first memory die 900A with suitable modifications to the patterns of the memory-die metal interconnect structures 980 and the through-die connection structures (488 or 588, optionally 96, optionally 980). The second memory die includes an array of second memory stack structures 55 extending through a second alternating stack of second insulating layers (132, 232) and second electrically conductive layers (146, 246), second drain regions 63 contacting an end portion of each second vertical semiconductor channel 60 in the second memory stack structures 55, and second bit lines 98 electrically connected to a respective subset of the second drain regions 63.

Figure 18:
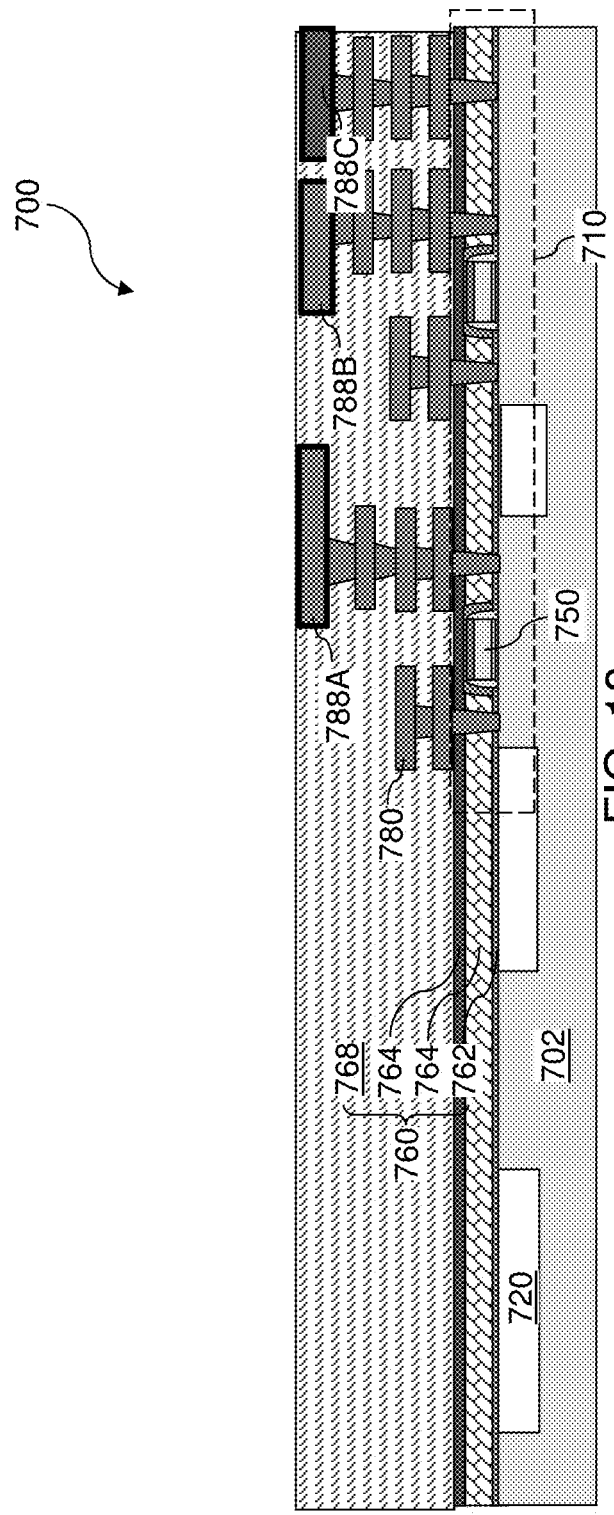
FIG. 18 is a vertical cross-sectional view of a support die including a peripheral circuitry configured to operate the first memory die and a second memory die according to an embodiment of the present disclosure.

Referring to FIG. 18, a support die 700 is illustrated, which includes a peripheral circuitry 710 configured to operate the first memory die 900A and a second memory die. The support die 700 includes a support-die substrate 702, which may be a semiconductor substrate. The peripheral circuitry 710 may include complementary metal-oxide-semiconductor (CMOS) devices that are electrically isolated from one another by shallow trench isolation structures 720 formed in an upper portion of the support-die substrate 702, and interconnected to one another by support-die metal interconnect structures 780. The support-die metal interconnect structures 780 may be formed in the support-die dielectric material layers 760. The support-die dielectric material layers 760 may include, for example, a dielectric diffusion barrier liner 762, a planarization dielectric layer 764 that laterally surrounds the CMOS devices of the peripheral circuitry 710, a dielectric capping layer 766, and interconnect-level dielectric material layers 768 that embed line-level structures and via-level structures of the support-die metal interconnect structures 780. The CMOS devices may include gate structures 750 and source/drain regions formed in the support-die substrate 702. As used herein, source/drain regions collectively refer to source regions and drain regions. The CMOS devices may be electrically isolated from one another by the shallow trench isolation structures 720.

The peripheral circuitry 710 may be configured to operating the array of first memory stack structures 55 in the first memory die 900A and the array of second memory stack structures in the second memory die. The peripheral circuitry 710 comprises a plurality of sense amplifiers. Each of the plurality of sense amplifiers includes an input node connected to a respective first switch transistor configured to connect with a respective one of the first bit lines 98 in the first memory die 900A upon bonding the support die 700 with the first memory die 900A, and connected to a respective second switch transistor configured to connect with a respective one of the second bit lines 98 in the second memory die upon bonding of the second memory die to the first memory die 900A.

In one embodiment, the first switch transistors and the second switch transistors are located on a support-die substrate 702 of the support die 700. The input node of each sense amplifier may be connected to a first source/drain node of the respective first switch transistor, and is connected to a first source/drain node of the respective second switch transistor. The peripheral circuitry 710 may be configured to perform a programming operation, a sense operation, and an erase operation while the first switch transistors and the second switch transistors electrically connect only one set of bit lines selected from the set of the first bit lines 98 in the first memory die 900A and the set of the second bit lines in the second memory die to the plurality of sense amplifiers.

Pad cavities are formed on components of the support-die metal interconnect structures 780 such that a respective one of support-die metal interconnect structures 780 is exposed at the bottom of each pad cavity. In one embodiment, the pad cavities may be arranged as a one-dimensional array or as a two-dimensional array, and may have a respective polygonal, circular, elliptical, or generally-curvilinear shape. A conductive material may be deposited in the pad cavities to form various bonding pads formed in the support-die dielectric material layers 760, which are herein referred to as support-die bonding pads 788. The support-die bonding pads 788 may be metal bonding pads that provides metal-to-metal bonding with mating bonding pads on another semiconductor die. In one embodiment, the support-die bonding pads 788 may be copper pads for providing copper-to-copper bonding.

The support-die bonding pads 788 may include first-type support-die bonding pads 788A configured to mate with the first-type first-memory-die bonding pads 988A of the first memory die 900A, second-type support-die bonding pads 788B configured to mate with the second-type first-memory-die bonding pads 988B of the first memory die 900A, and third-type support-die bonding pads 788C configured to mate with the third-type first-memory-die bonding pads 988C of the first memory die 900A.

Figure 19:
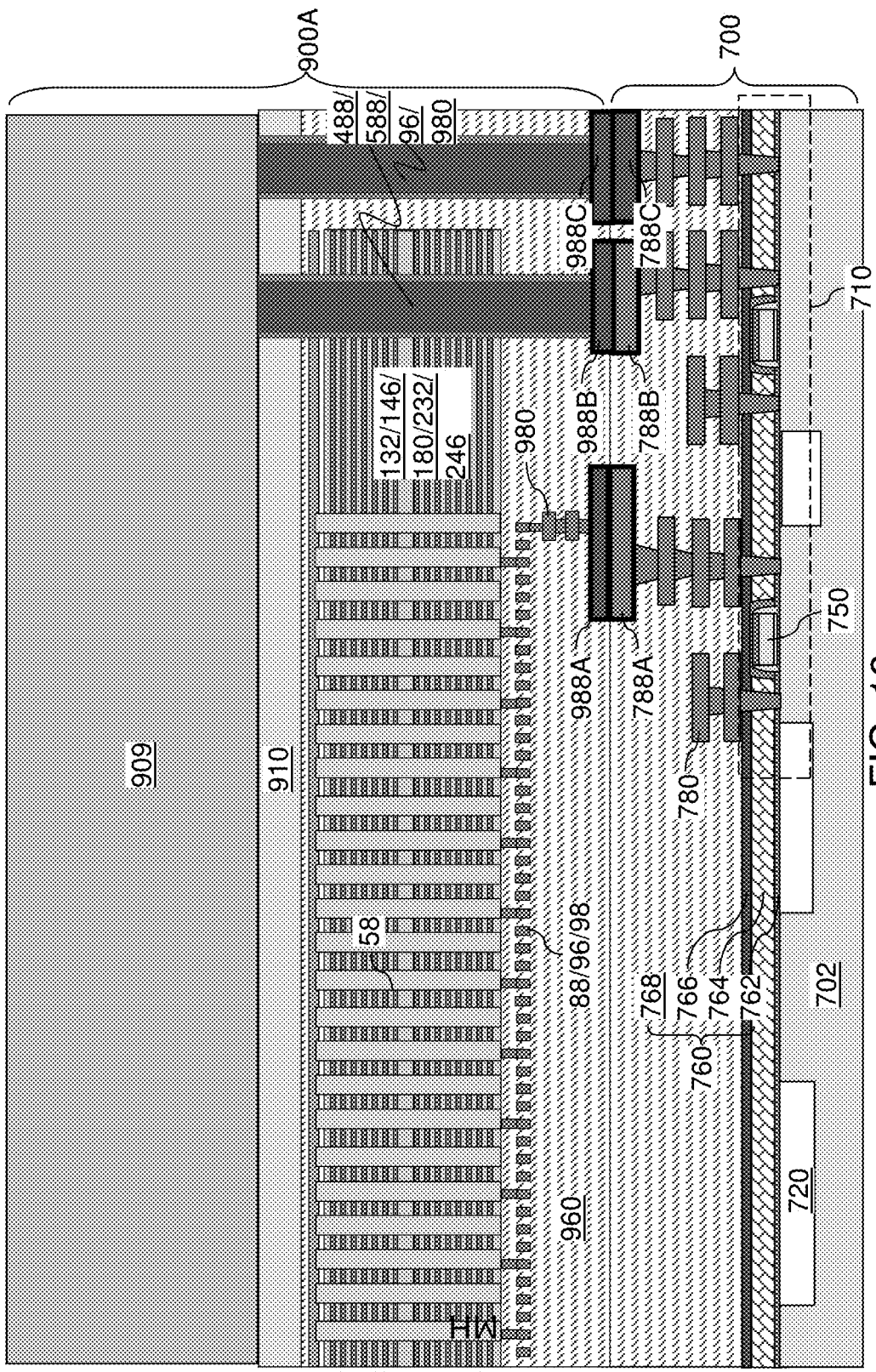
FIG. 19 is a vertical cross-sectional view of an exemplary bonded assembly after bonding the first memory die to the support die according to an embodiment of the present disclosure.

Referring to FIG. 19, the first memory die 900A may be bonded to the support die 700. A physically exposed planar surface of the support-die dielectric material layers 760 may face a physically exposed planar surface of the interconnect-level dielectric material layers 960 of the first memory die 900A. The first-type support-die bonding pads 788A of the support die 700 may be bonded to the first-type first-memory-die bonding pads 988A of the first memory die 900A, the second-type support-die bonding pads 788B of the support die 700 may be bonded to the second-type first-memory-die bonding pads 988B of the first memory die 900A, and the third-type support-die bonding pads 788C of the support die 700 may be bonded to the third-type first-memory-die bonding pads 988C of the first memory die 900A.

Figure 20:
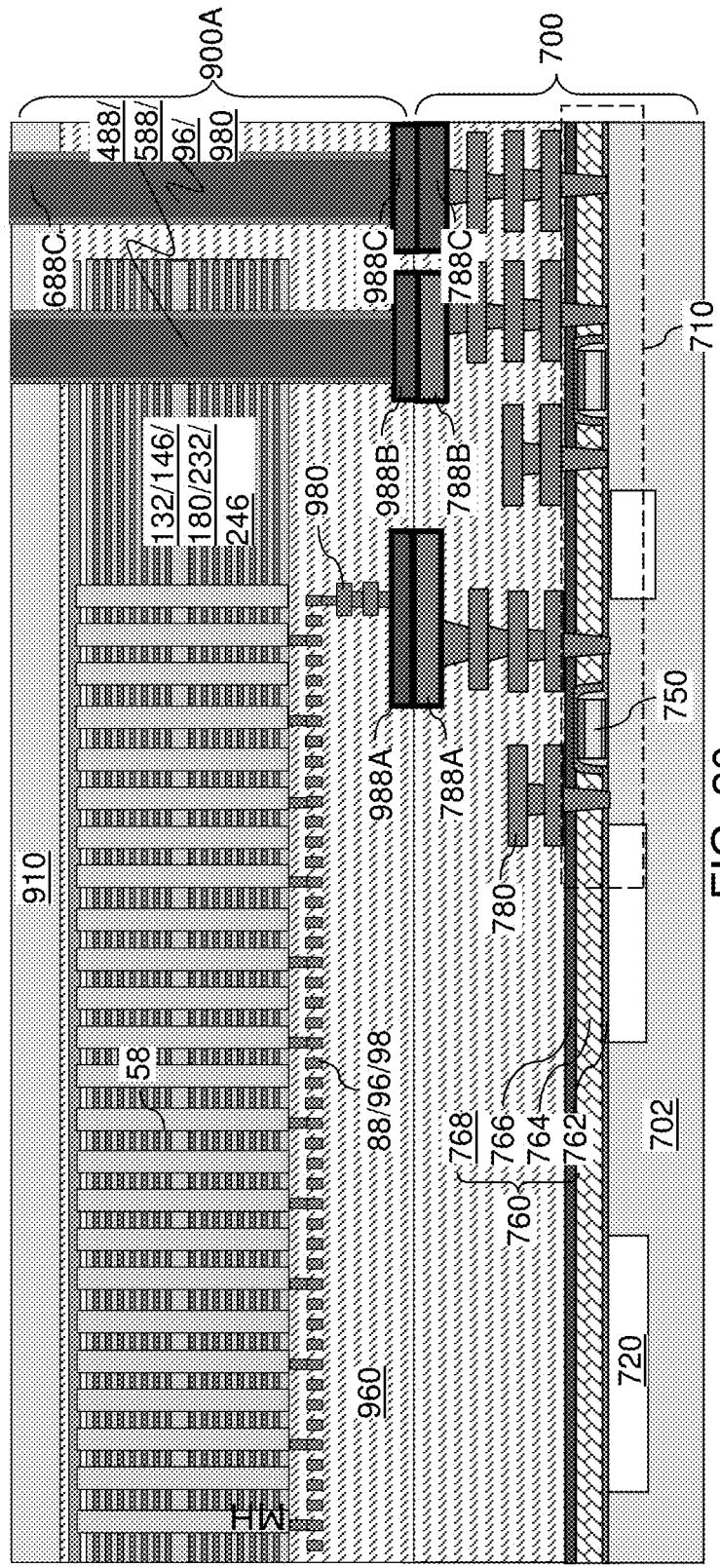
FIG. 20 is a vertical cross-sectional view of the exemplary bonded assembly after removal of a bulk substrate layer of the first memory die according to an embodiment of the present disclosure.

Referring to FIG. 20, the semiconductor substrate layer 909 of the first memory die 900A may be removed by grinding, chemical etching, chemical mechanical polishing, and/or a dry etch process. In one embodiment, removal of the semiconductor substrate layer 909 may be selective to the source-side dielectric material layer 910. In one embodiment, a horizontal surface of at least one of the through-die connection structures (488 or 588, optionally 96, optionally 980) may be physically exposed upon removal of the semiconductor substrate layer 909. In one embodiment, at least one of the through-die connection structures (488 or 588, optionally 96, optionally 980) may be located below a physically exposed horizontal surface of the source-side dielectric material layer 910, and at least one portion of the source-side dielectric material layer 910 may be vertically recessed to physically expose surfaces of the at least one of the through-die connection structures (488 or 588, optionally 96, optionally 980).

Figure 21:
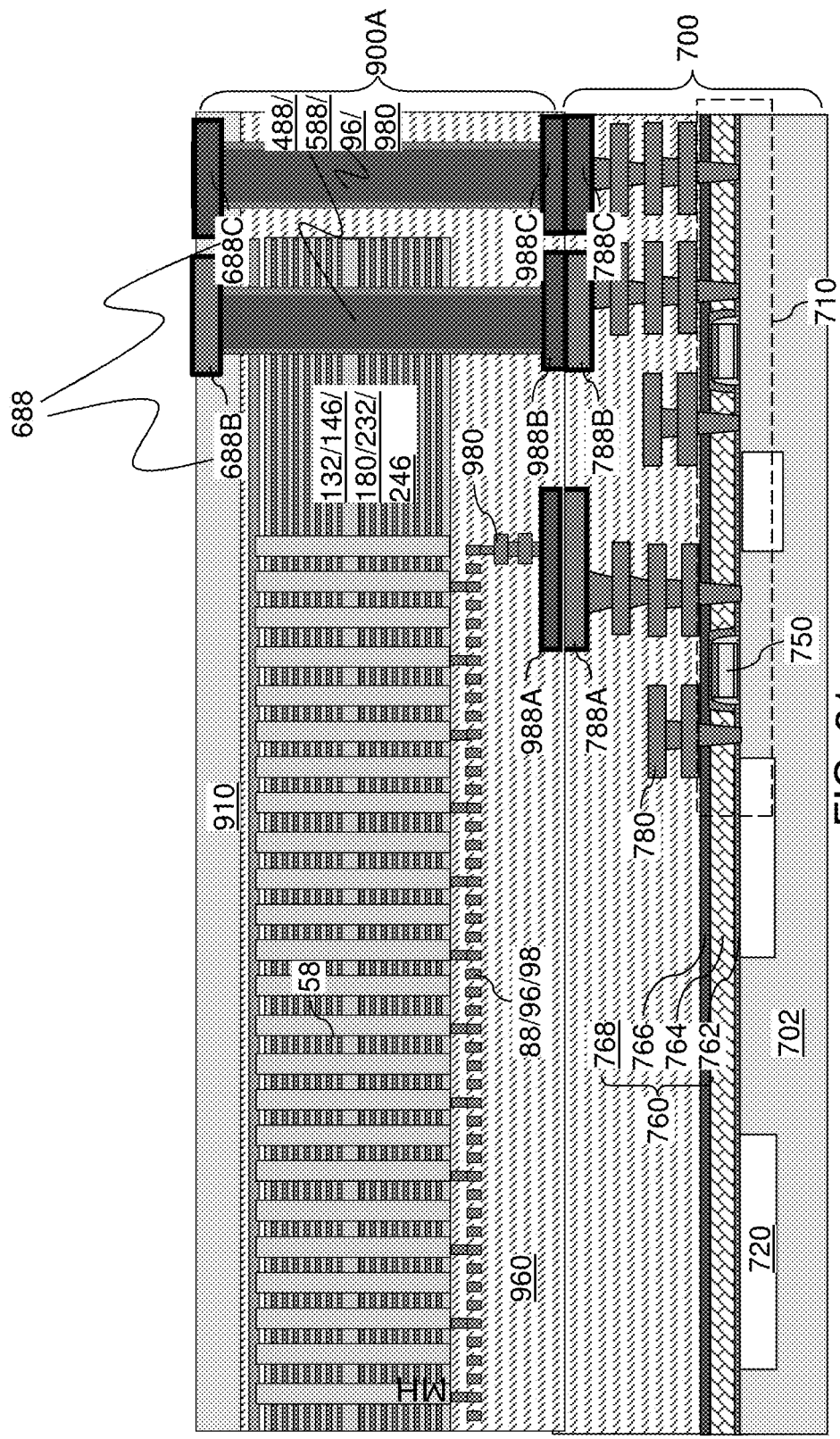
FIG. 21 is a vertical cross-sectional view of the exemplary bonded assembly after formation of backside bonding pads according to an embodiment of the present disclosure.

Referring to FIG. 21, bonding pads may be formed on each of the through-die connection structures (488 or 588, optionally 96, optionally 980). Portions of the source-side dielectric material layer 910 and/or the through-die connection structures (488 or 588, optionally 96, optionally 980) may be optionally recessed. A bonding pad material such as copper may be deposited and patterned into discrete material portions to form the bonding pads, which are herein referred to as first-memory-die backside bonding pads 688. The first-memory-die backside bonding pads 688 may be configured to mate with second-memory-die bonding pads to be provided on the second memory die. The first-memory-die backside bonding pads 688 may include internal-connection backside bonding pads 688B, or first-type backside bonding pads, that are electrically connected to a respective one of the second-type first-memory-die bonding pads 988B. Further, the first-memory-die backside bonding pads 688 may include external-connection backside bonding pads 688C, or second-type backside bonding pads, that are electrically connected to a respective one of the third-type first-memory-die bonding pads 988C. The mating surfaces of the first-memory-die backside bonding pads 688 may be flush with the physically exposed horizontal surface of the source-side dielectric material layer 910, or may protrude above the physically exposed horizontal surface of the source-side dielectric material layer 910.

Figure 22:
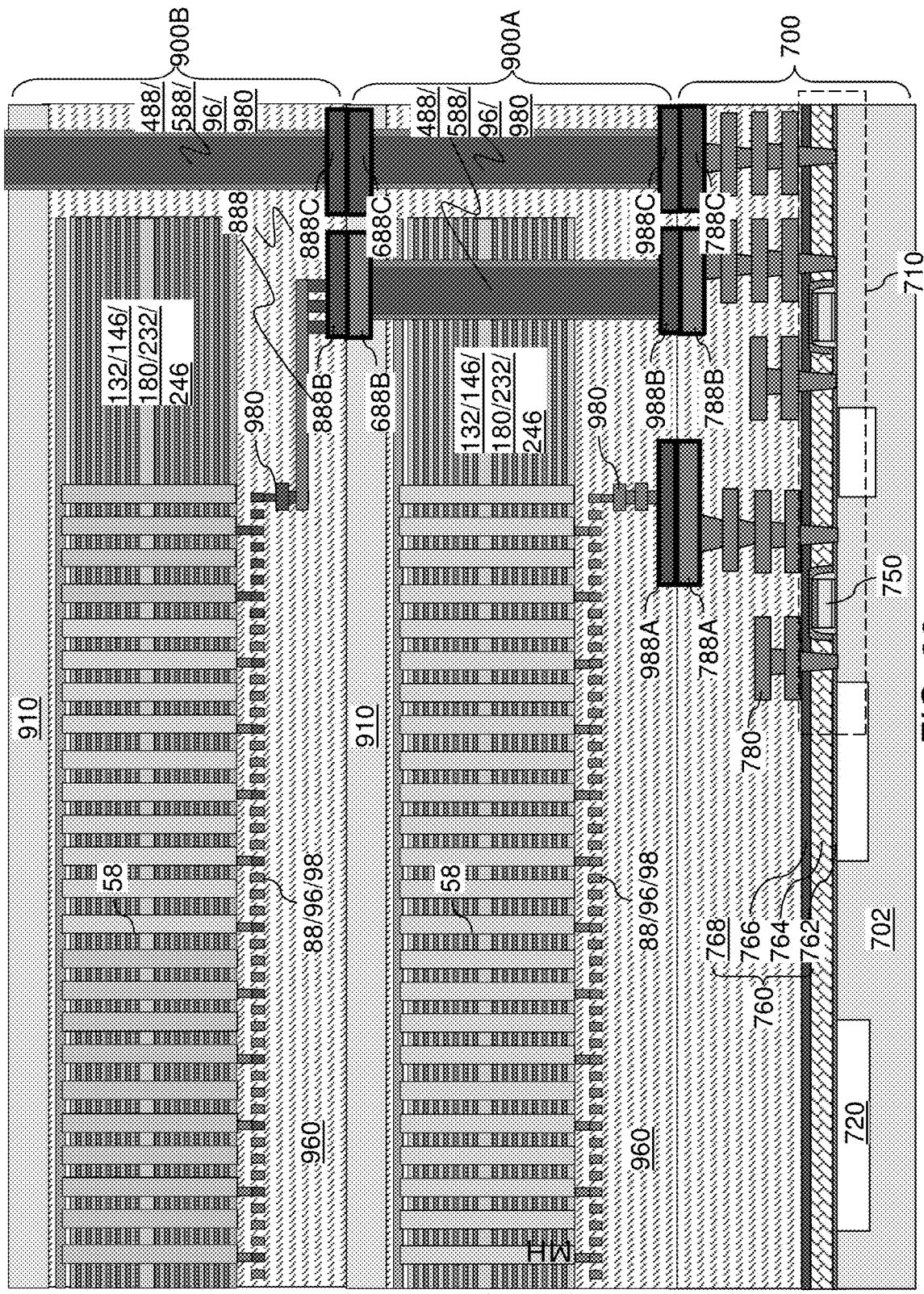
FIG. 22 is a vertical cross-sectional view of the exemplary bonded assembly after bonding a second memory die to the first memory die and removal of the bulk substrate layer of the second memory die according to an embodiment of the present disclosure.

Referring to FIG. 22, a second memory die 900B may be bonded to the first memory die 900A. The second memory die 900B may be provided by performing the processing steps for forming the first memory die 900A with suitable modifications to the patterns of the memory-die metal interconnect structures 980 and the through-die connection structures (488 or 588, optionally 96, optionally 980). The second memory die includes an array of second memory stack structures 55 extending through a second alternating stack of second insulating layers (132, 232) and second electrically conductive layers (146, 246), second drain regions 63 contacting an end portion of each second vertical semiconductor channel 60 in the second memory stack structures 55, and second bit lines 98 electrically connected to a respective subset of the second drain regions 63. The memory-die bonding pads of the second memory die 900B are herein referred to as second-memory-die bonding pads 888.

Second-memory-die metal interconnect structure 980 may be provided between each, or any, of the first through-memory-level via structures 488 and/or the second through-memory-level via structures 588 in the second memory die 900B and a second-memory-die bonding pad 888 of the second memory die 900B that is in electrical contact therewith. In some other embodiments, the first through-memory-level via structures 488 and/or the second through-memory-level via structures 588 in the second memory die 900B may be in direct contact with a respective one of the second-memory-die bonding pads 888 of the second memory die 900B.

The second-memory-die bonding pads 888 of the second memory die 900B may include various types of bonding pads for providing different types of electrically conductive paths between the second memory die 900B and the first memory die 900A. Specifically, the second-memory-die bonding pads 888 may include internal-connection second-memory-die bonding pads 888B (which are also referred to as first-type second-memory-die bonding pads) configured to provide the second-type electrically conductive paths between the support die 700 and the second memory die 900B. The internal-connection second-memory-die bonding pads 888B may be formed in, or on, the first side of the first memory die 900A that includes the second-memory-die metal interconnect structure 980. Each of the internal-connection second-memory-die bonding pads 888B may be electrically connected to, and directly contact, a respective subset of second-memory-die metal interconnect structures 980 formed in the second memory die 900A.

The second-memory-die bonding pads 888 may include external-connection second-memory-die bonding pads 888C configured to provide the third-type electrically conductive paths between the support die 700 and external bonding pads to be subsequently formed after bonding the second memory die 900B. The external-connection second-memory-die bonding pads 888C may be formed in, or on, the first side of the second memory die 900B adjacent to the internal-connection second-memory-die bonding pads 988B. Each of the external-connection second-memory-die bonding pads 888C may be electrically isolated from the second-memory-die metal interconnect structures 980 formed in the second memory die 900B.

Generally, through-die connection structures (488 or 588, optionally 96, optionally 980) are provided within the second memory die 900B. Each of the through-die connection structures (488 or 588, optionally 96, optionally 980) contacts a planar surface of a respective one of the external-connection second-memory-die bonding pads 888C. Each of the through-die connection structures (488 or 588, optionally 96, optionally 980) may vertically extend through the interconnect-level dielectric material layers 960 of the second memory die 900B, through the alternating stacks {(132, 146), (232, 246)} and/or the retro-stepped dielectric material portions (165, 265) of the second memory die 900B, and at least partially through the source-side dielectric material layer 910 of the second memory die 900B. Generally, each of the through-die connection structures (488 or 588, optionally 96, optionally 980) in the second memory die 900B extends through the second memory die 900B and includes at least one conductive via structure such as a first through-memory-level via structure 488.

In one embodiment, at least one of the through-die connection structures (488 or 588, optionally 96, optionally 980) in the second memory die 900B may consist of a respective one the first through-memory-level via structures 488 and/or the second through-memory-level via structures 588 that directly contacts a respective one of the second-type first-memory-die bonding pads 988 of the second memory die 900B. In one embodiment, one, some, or all of the through-die connection structures (488 or 588, optionally 96, optionally 980) in the second memory die 900B may include a respective one the first through-memory-level via structures 488 and/or the second through-memory-level via structures 588 that is electrically connected to a respective one of the second-type first-memory-die bonding pads 988 of the second memory die 900B, and additionally include a respective subset of the first-memory-die metal interconnect structures 980 formed in the second memory die 900B and directly contacts the respective one of the second-type first-memory-die bonding pads 988. Each through-die connection structure (488 or 588, optionally 96, optionally 980) may directly contact a respective one of the second-type first-memory-die bonding pads 988 in the second memory die 900B.

In one embodiment, at least one of the through-die connection structures (488 or 588, optionally 96, optionally 980) comprises a through-memory-level via structure (such as a second through-memory-level via structure 588) that extends through each first electrically conductive layer (146, 246) within the first alternating stack {(132, 146), (232, 246)} of the second memory die 900B as a single structure having a straight sidewall from a bottom surface thereof to a top surface thereof.

The second memory die 900B may be provided with a semiconductor substrate layer 909 prior to bonding with the first memory die 900A. The semiconductor substrate layer 909 may be removed by grinding, chemical etching, chemical mechanical polishing, and/or a dry etch process after bonding the second memory die 900B to the first memory die 900A. In one embodiment, removal of the semiconductor substrate layer 909 may be selective to the source-side dielectric material layer 910 of the second memory die 900B. In one embodiment, a horizontal surface of at least one of the through-die connection structures (488 or 588, optionally 96, optionally 980) may be physically exposed upon removal of the semiconductor substrate layer 909 of the second memory die 900B. In one embodiment, at least one of the through-die connection structures (488 or 588, optionally 96, optionally 980) of the second memory die 900B may be located below a physically exposed horizontal surface of the source-side dielectric material layer 910 of the second memory die 900B, and at least one portion of the source-side dielectric material layer 910 may be vertically recessed to physically expose surfaces of the at least one of the through-die connection structures (488 or 588, optionally 96, optionally 980) of the second memory die 900B.

Figure 23:
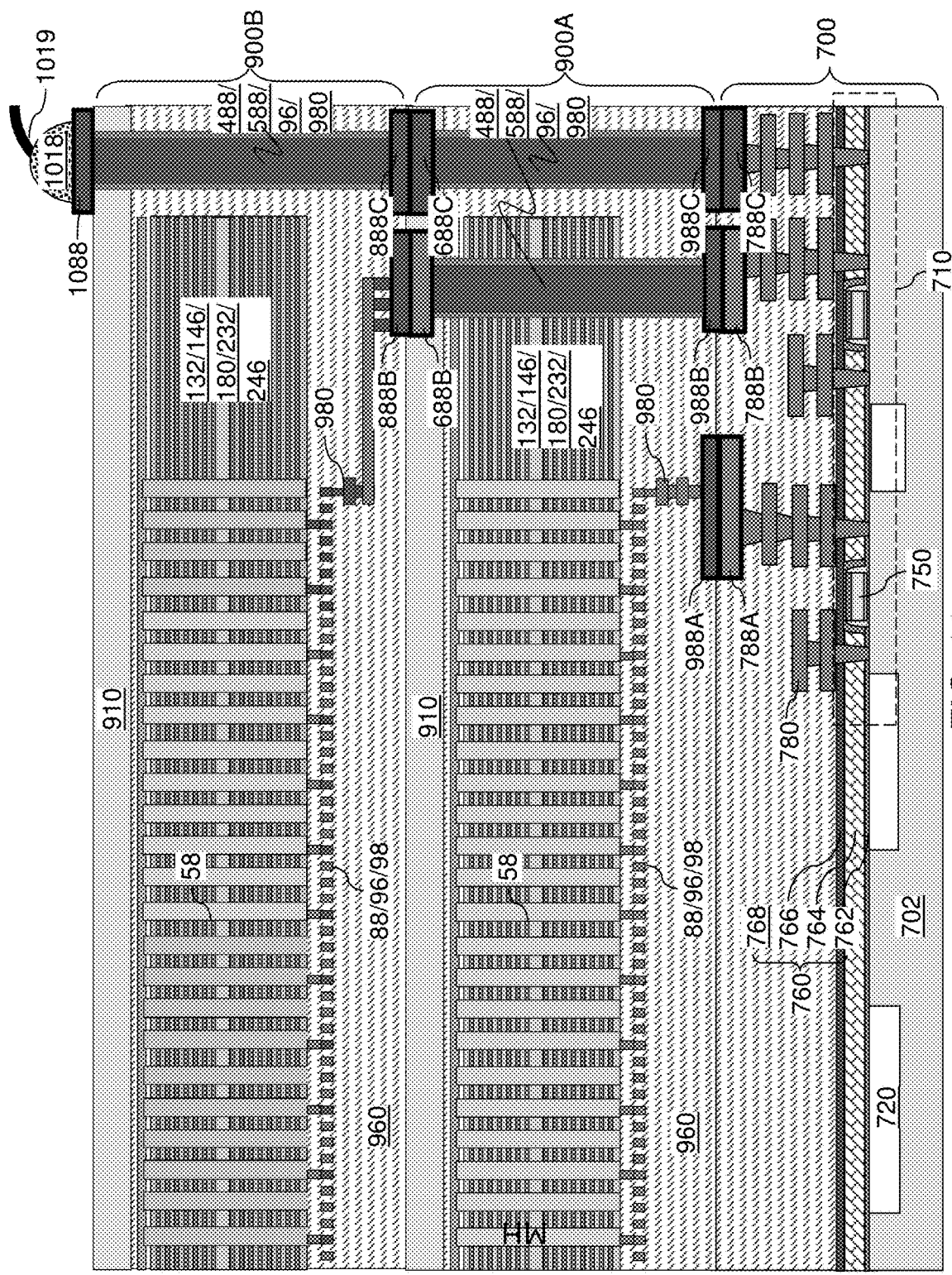
FIG. 23 is a vertical cross-sectional view of the exemplary bonded assembly after formation of external bonding pads and attaching solder balls and bonding wires according to an embodiment of the present disclosure.

Referring to FIG. 23, external bonding pads 1088 may be formed on the backside of the second memory die 900B. The external bonding pads 1088 may include a material stack commonly known as underbump metallurgy (UBM) material stack, on which solder balls 1018 may be subsequently attached. A bonding wire 1019 may be attached to each of the solder balls 1018. An electrically conductive path is provided between an input node or an output node of the peripheral circuitry and a respective one of the external bonding pads 1088.

Figure 24B:
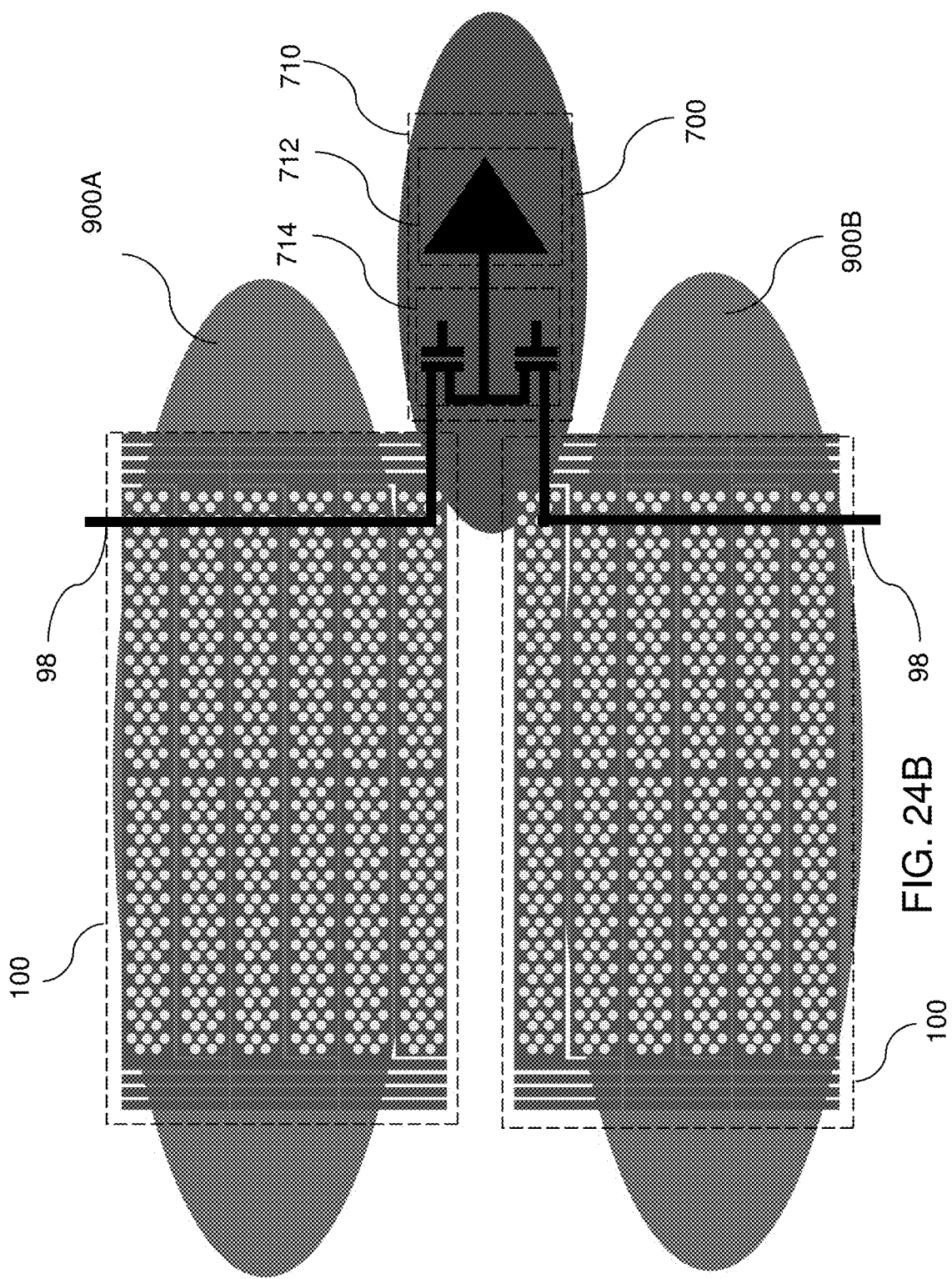
FIG. 24B is another schematic view of electrical connections between the support die, the first memory die, and the second memory die in the exemplary bonded assembly of FIG. 23.

FIGS. 24A and 24B schematically illustrate electrical connections to and from the support die 700, the first memory die 900A, and the second memory die 900B in the exemplary bonded assembly of FIG. 23. The peripheral circuitry 710 may include a plurality of combinations 716 of a sense amplifier 712 and an electronic toggle switch 714 that provides a connection between the peripheral circuitry 710 and one set of bit lines 98 selected from the first bit lines 98 located within the first memory die 900A and the second bit lines 98 located within the second memory die 900B. Each electronic toggle switch 714 includes a first switch transistor SW1 and a second switch transistor SW2.

Referring collectively to all drawings and according to various embodiments of the present disclosure, a bonded assembly is provided, which comprises; a first memory die 900A including an array of first memory stack structures 55 extending through a first alternating stack of first insulating layers (132, 232) and first electrically conductive layers (146, 246), first drain regions 63 contacting an end portion of each first vertical semiconductor channel 60 in the first memory stack structures 55, and first bit lines 98 electrically connected to a respective subset of the first drain regions 63; a second memory die 900B including an array of second memory stack structures 55 extending through a second alternating stack of second insulating layers (132, 232) and second electrically conductive layers (146, 246), second drain regions 63 contacting an end portion of each second vertical semiconductor channel 60 in the second memory stack structures 55, and second bit lines 98 electrically connected to a respective subset of the second drain regions 63; and a support die 700 comprising a peripheral circuitry 710 for operating the array of first memory stack structures 55 and the array of second memory stack structures 55, wherein the peripheral circuitry 710 comprises a plurality of sense amplifiers, wherein each of the plurality of sense amplifiers includes an input node connected to a respective first switch transistor SW1 configured to connect with a respective one of the first bit lines 98 in the first memory die 900A and connected to a respective second switch transistor SW2 configured to connect with a respective one of the second bit lines 98 in the second memory die 900B, wherein the first memory die 900A is bonded to the support die 700, and the second memory die 900B is bonded to the first memory die 900A.

In one embodiment, the first switch transistors sw1 and the second switch transistors SW2 are located on a support-die substrate 702 of the support die 700. In one embodiment, the input node of each sense amplifier 712 is connected to a first source/drain node of the respective first switch transistor SW1, and is connected to a first source/drain node of the respective second switch transistor SW2.

In one embodiment, a second source/drain node of the respective first switch transistor SW1 is connected to the respective one of the first bit lines 98 in the first memory die 900A by a first electrically conductive path (780, 788A, 988A, 980); and a second source/drain node of the respective second switch transistor SW2 is connected to the respective one of the second bit lines 98 in the second memory die 900B by a second electrically conductive path (780, 788B, 988B, 980, 488 or 588, optionally 96, optionally 980, 688B, 888B, 980).

In one embodiment, the first electrically conductive path (780, 788A, 988A, 980) comprises: a first subset of support-die metal interconnect structures 780 formed in the support die 700; a first support-die bonding pad (i.e., a first-type support-die bonding pads 788A) connected to the first subset of support-die metal interconnect structures 780; a first-memory-die bonding pad (i.e., a first-type first-memory-die bonding pad 988A) located in, or on, the first memory die 900A and bonded to the first support-die bonding pad; and a subset of first-memory-die metal interconnect structures 980 formed in the first memory die 900A and contacting the respective one of the first bit lines 98.

In one embodiment, the second electrically conductive path (780, 788B, 988B, 980, 96, 98, 488, 588, 688B, 888B, 980) comprises: a second subset of support-die metal interconnect structures 780 formed in the support die 700; a second support-die bonding pad (i.e., a second-type support-die bonding pads 788B) connected to the second subset of metal interconnect structures 780; an additional first-memory-die bonding pad (i.e., a second-type first-memory-die bonding pad 988B) located in, or on, the first memory die 900A and bonded to the second support-die bonding pad; a through-die connection structures (488 or 588, optionally 96, optionally 980) contacting the second-memory-die bonding pad, extending through the first memory die 900A, and including at least one conductive via structure (488 or 588); a first-memory-die backside bonding pad (i.e., an internal-connection backside bonding pad 688B) located in, or on, the first memory die 900A and contacting the through-die connection structure (488 or 588, optionally 96, optionally 980); a second-memory-die bonding pad (i.e., an internal-connection second-memory-die bonding pad 888B) located in, or on, the second memory die 900B and bonded to the first-memory-die backside bonding pad; and a subset of second-memory-die metal interconnect structures 980 formed in the second memory die 900B and contacting the respective one of the second bit lines 98.

In one embodiment, the at least one conductive via structure (488 or 588) of the through-die connection structure (488 or 588, optionally 96, optionally 980) comprises a through-memory-level via structure 588 that extends through each first electrically conductive layer (146, 246) within the first alternating stack {(132, 146), (232, 246)} as a single structure having a straight sidewall from a bottom surface to a top surface.

In one embodiment, the bonded assembly comprises: an external bonding pad 1088 located on a backside of the second memory die 900B; and an electrically conductive path (780, 788C, 988C, 488, 588, 980, 96, 688C, 888C) between an input node or an output node of the peripheral circuitry 710 and the external bonding pad 1088, wherein the electrically conductive path (780, 788C, 988C, 488, 588, 980, 96, 688C, 888C) extends through the first memory die 900A and the second memory die 900B.

In one embodiment, the electrically conductive path (780, 788C, 988C, 488, 588, 980, 96, 688C, 888C) between the peripheral circuitry 710 and the external bonding pad 1088 comprises: a subset of support-die metal interconnect structures 780 formed in the support die 700; a support-die bonding pad (i.e., a third-type support-die bonding pad 788C) connected to the subset of support-die metal interconnect structures 780; a first-memory-die bonding pad (i.e., a third-type first-memory-die bonding pad 988C) located in, or on, the first memory die 900A and bonded to the support-die bonding pad; a first through-die connection structure (488 or 588, optionally 96, optionally 980) contacting the first-memory-die bonding pad, extending through the first memory die 900A, and including at least one first conductive via structure (488 or 588, optionally 980); a first-memory-die backside bonding pad (i.e., an external-connection backside bonding pad 688C) located in, or on, the first memory die 900A and contacting the first through-die connection structure (488 or 588, optionally 96, optionally 980); a second-memory-die bonding pad (i.e., an external-connection second-memory-die bonding pads 888C) located in, or on, the second memory die 900B and bonded to the first-memory-die backside bonding pad; and a second through-die connection structure (488 or 588, optionally 96, optionally 980) contacting the second-memory-die bonding pad, extending through the second memory die 900B, and including at least one second conductive via structure (488 or 588, optionally 980), and contacting the external bonding pad 1088.

In one embodiment, the array of first memory stack structures 55 comprises a two-dimensional array of first memory stack structures 55, wherein each of the first memory stack structures 55 comprises a respective first vertical semiconductor channel 60 and a respective first vertical stack of first memory elements (such as portions of the charge storage layer 54) located at each level of the first electrically conductive layers (146, 246); and the array of second memory stack structures 55 comprises a two-dimensional array of second memory stack structures 55, wherein each of the second memory stack structures 55 comprises a respective second vertical semiconductor channel 60 and a respective second vertical stack of first memory elements (such as portions of the charge storage layer 54) located at each level of the second electrically conductive layers (146, 246).

In one embodiment, the respective first switch transistor SW1 and the respective second switch transistor SW2 are configured such that only one of the respective first switch transistor SW1 and the respective second switch transistor SW2 is turned on during operation of a respective sense amplifier 712 to which the respective first switch transistor SW1 and the respective second switch transistor SW2 are connected to.

In one embodiment, the first switch transistors SW1 and the second switch transistors SW2 are configured to electrically connect only one set of bit lines 98 selected from a set of the first bit lines 98 in the first memory die 900A and a set of the second bit lines 98 to the plurality of sense amplifiers 712 during operation of the plurality of sense amplifiers 712.

The peripheral circuitry 710 may be configured to perform a programming operation, a sense operation, and an erase operation while the first switch transistors SW1 and the second switch transistors SW2 electrically connect only one set of bit lines 98 selected from the set of the first bit lines 98 in the first memory die 900A and the set of the second bit lines 98 to the plurality of sense amplifiers 712.

In one embodiment, the bonded assembly of the present disclosure may be operated by: turning on a set of transistor switches selected from a first set of the first switch transistors SW1 and a second set of the second switch transistors SW2, wherein one set of bit lines 98 selected from a set of the first bit lines 98 in the first memory die 900A and a set of the second bit lines 98 in the second memory die 900B is electrically connected to the plurality of sense amplifiers 712; and performing an operation selected from a programming operation, a sense operation, and an erase operation to memory elements accessed by the selected set of bit lines 98.

Figure 25:
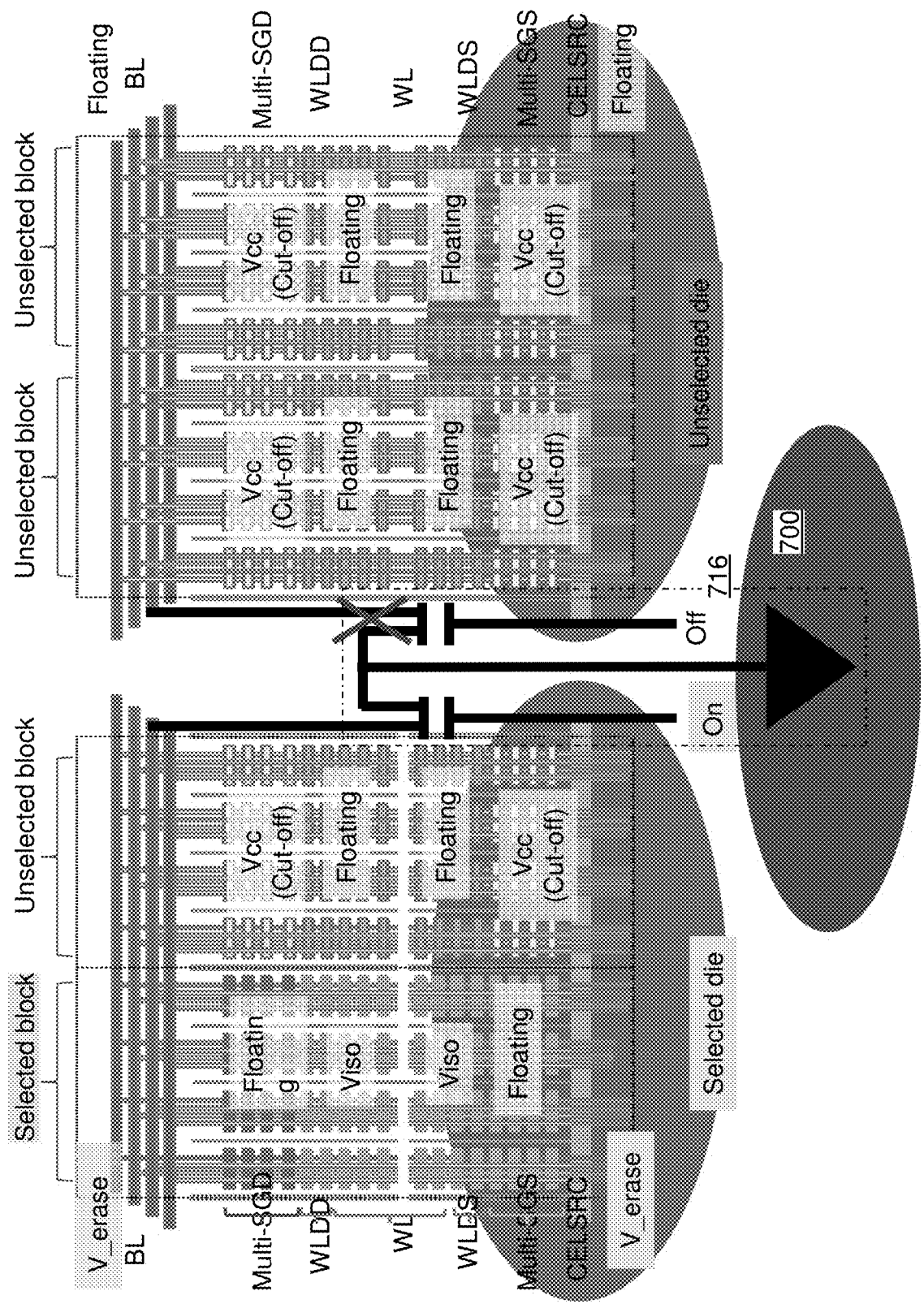
FIG. 25 is a schematic biasing scheme during an erase operation according to an embodiment of the present disclosure.

FIG. 25 is a schematic biasing scheme during an erase operation according to an embodiment of the present disclosure. During the erase operation, one memory die may be selected (e.g., a memory plane on the selected memory die) from the first memory die 900A and the second memory die 900B by turning on the switch transistors for the selected memory die within each combination 716 of a sense amplifier 712 and an electronic toggle switch 714. The other memory die remains unselected (e.g., a memory plane on the unselected memory die remains unselected). Within the selected memory die (e.g., within the selected memory plane on the selected memory die), one block may be selected for the erase operation. An erase voltage V_erase may be applied to the bit lines 98 of the selected memory die. The bit lines of the unselected die may be electrically floating. Select gate electrodes of the selected block may be electrically floating, while a select gate electrode cut-off voltage Vcc is applied to the select gate electrodes of the unselected blocks to prevent flow of electrical current thorough the semiconductor channels of the unselected blocks of the selected memory die. The select gate electrodes may include source-side select gate electrodes (labeled as Multi-SGS) and drain-side select gate electrodes (labeled as Multi-SGD). The word lines (labeled as WL, WLDD, and WLDS) for the selected block may be electrically biased at the isolation voltage Viso to provide the erase operation on the selected block. The word lines for the unselected blocks may be electrically floating. The source lines (labeled as CELSRC) for the selected memory die may be biased at the erase voltage V_erase. The source lines for the unselected memory die may be electrically floating.

Figure 26:
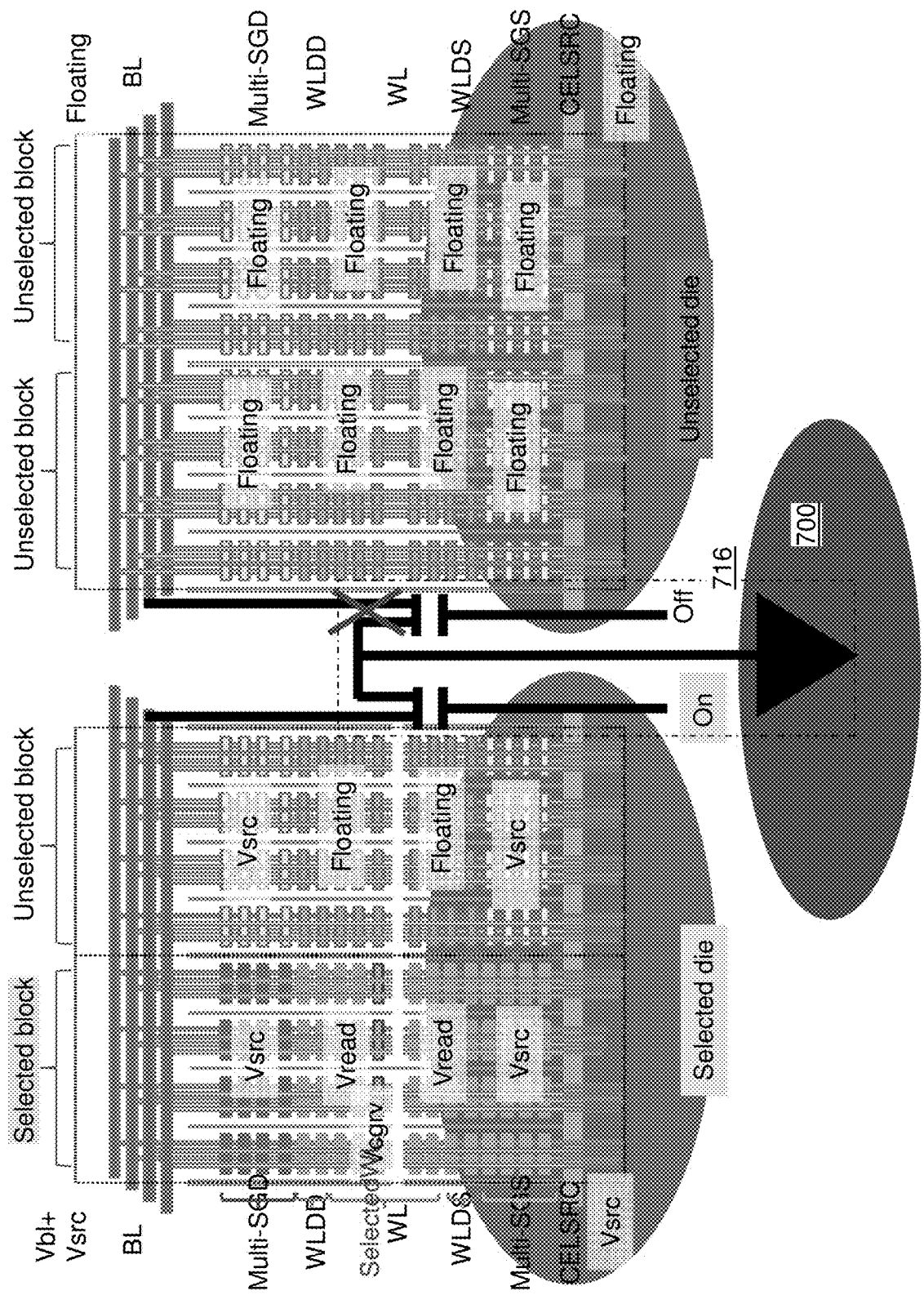
FIG. 26 is a schematic biasing scheme during a read (sense) operation according to an embodiment of the present disclosure.

FIG. 26 is a schematic biasing scheme during a read (sense) operation according to an embodiment of the present disclosure. During the read (sense) operation, one memory die may be selected (e.g., a memory plane on a selected memory die) from the first memory die 900A and the second memory die 900B by turning on the switch transistors for the selected memory die within each combination 716 of a sense amplifier 712 and an electronic toggle switch 714. Within the selected memory die (e.g., one memory plane on the selected memory die), one block may be selected for the read operation. A bit line read voltage (Vbl+Vsrc) may be applied to the bit lines 98 of the selected memory die. The bit line read voltage (Vbl+Vsrc) may be higher than the source voltage Vsrc. The bit lines of the unselected die may be electrically floating. Select gate electrodes of the selected memory die may be at the source voltage Vsrc, while the select gate electrodes of the unselected memory die are electrically floating. The select gate electrodes may include source-side select gate electrodes (labeled as Multi-SGS) and drain-side select gate electrodes (labeled as Multi-SGD). The word lines (labeled as WL, WLDD, and WLDS) for the selected block may be electrically biased at the read voltage Vread to provide the read operation on the selected block. The word lines for the unselected blocks may be electrically floating. The source lines (labeled as CELSRC) for the selected memory die may be biased at the source voltage Vsrc. The source lines for the unselected memory die may be electrically floating.

Figure 27:
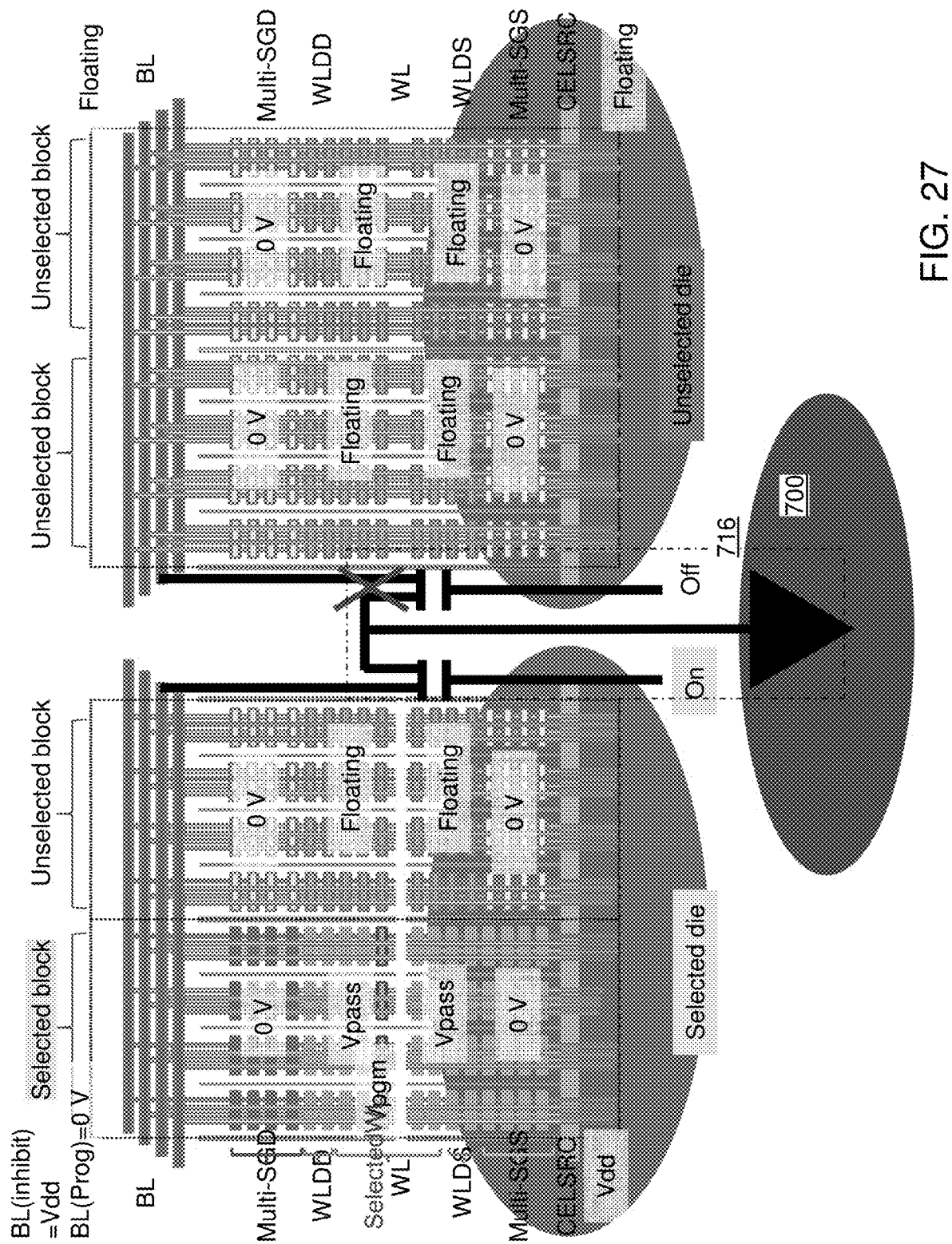
FIG. 27 is a schematic biasing scheme during a programming operation according to an embodiment of the present disclosure.

FIG. 27 is a schematic biasing scheme during a programming operation according to an embodiment of the present disclosure. During the programming operation, one memory die (e.g., a memory plane on a selected memory die) may be selected between the first memory die 900A and the second memory die 900B by turning on the switch transistors for the selected memory die within each combination 716 of a sense amplifier 712 and an electronic toggle switch 714. Within the selected memory die (e.g., selected memory plane on the selected memory die), one block may be selected for the programming operation. The bit lines connected to the selected block may be individually inhibited by applying a bit line inhibit voltage (which may be the same as the power supply voltage Vdd), or may be individually activated for programming by applying a bit line programming voltage (which may be 0 V). The bit lines of the unselected die may be electrically floating. Select gate electrodes may be electrically grounded (i.e., applied with the bias voltage of 0 V). The select gate electrodes may include source-side select gate electrodes (labeled as Multi-SGS) and drain-side select gate electrodes (labeled as Multi-SGD). A selected word line selected from the word lines (labeled as WL, WLDD, and WLDS) for the selected block may be electrically biased at a suitable voltage depending on the data bit to be encoded into the selected memory element. Unselected word lines that are not selected from the word lines for the selected block may be electrically biased at pass gate voltage Vpass to provide current flow through respective levels of the vertical semiconductor channels 60. The word lines for the unselected blocks may be electrically floating. The source lines (labeled as CELSRC) for the selected memory die may be biased at a power supply voltage Vdd. The source lines for the unselected memory die may be electrically floating.

The various embodiments of the present disclosure enable sharing of sense amplifiers 712 between two memory dies (900A, 900B) bonded to a same support die 700. A plurality of combinations 716 of a sense amplifier 712 and an electronic toggle switch 714 provide a switchable connection between the peripheral circuitry 710 and one set of bit lines 98 selected from the first bit lines 98 located within the first memory die 900A and the second bit lines 98 located within the second memory die 900B. The bonded assembly of the present disclosure provide effective usage of the peripheral circuitry 710 of the support die 700. Further, use of the through-die connection structures (488 or 588, optionally 96, optionally 980) allows for the sequential bonding of the first memory die 900A to the support die 700 and of the second memory die 900B to the first memory die 900A with minimal number of additional processing steps. By sharing sense amplifiers 712 between plural memory dies, e.g., two memory dies (900A, 900B), bonded to a same support die 700, half of the height needed for the sense amplifiers may be omitted. In various embodiments, only one set of sense amplifiers and data latches are used for two memory dies. This may result in significant area savings. In addition, the area for the shared circuit blocks, which drive the sense amplifiers and bit lines may be reduced by at least half. Moreover, the signals may be reduced to realize stronger power signals, which may result in an improvement of overall bonded assembly performance.

Although the foregoing refers to particular embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment using a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A bonded assembly comprising:
a first memory die comprising:
an array of first memory stack structures extending through a first alternating stack of first insulating layers and first electrically conductive layers;
first drain regions contacting an end portion of each first vertical semiconductor channel in the first memory stack structures; and
first bit lines electrically connected to a respective subset of the first drain regions;
a second memory die bonded to the first memory die, the second memory die comprising:
an array of second memory stack structures extending through a second alternating stack of second insulating layers and second electrically conductive layers;
second drain regions contacting an end portion of each second vertical semiconductor channel in the second memory stack structures; and
second bit lines electrically connected to a respective subset of the second drain regions; and
a support die bonded to the first memory die, the support die comprising:
a peripheral circuitry for operating the array of first memory stack structures and the array of second memory stack structures, wherein the peripheral circuitry comprises a plurality of sense amplifiers, wherein each of the plurality of sense amplifiers includes an input node connected to a respective first switch transistor configured to connect with a respective one of the first bit lines in the first memory die and connected to a respective second switch transistor configured to connect with a respective one of the second bit lines in the second memory die.

2. The bonded assembly of claim 1, wherein the first switch transistors and the second switch transistors are located on a support-die substrate of the support die.

3. The bonded assembly of claim 2, wherein the input node of each sense amplifier is connected to a first source/drain node of the respective first switch transistor, and is connected to a first source/drain node of the respective second switch transistor.

4. The bonded assembly of claim 3, wherein:
a second source/drain node of the respective first switch transistor is connected to the respective one of the first bit lines by a first electrically conductive path; and
a second source/drain node of the respective second switch transistor is connected to the respective one of the second bit lines by a second electrically conductive path.

5. The bonded assembly of claim 4, wherein the first electrically conductive path comprises:
a first subset of support-die metal interconnect structures formed in the support die;
a first support-die bonding pad connected to the first subset of support-die metal interconnect structures;
a first-memory-die bonding pad located in, or on, the first memory die and bonded to the first support-die bonding pad; and
a subset of first-memory-die metal interconnect structures formed in the first memory die and contacting the respective one of the first bit lines.

6. The bonded assembly of claim 5, wherein the second electrically conductive path comprises:
a second subset of support-die metal interconnect structures formed in the support die;
a second support-die bonding pad connected to the second subset of metal interconnect structures;
an additional first-memory-die bonding pad located in, or on, the first memory die and bonded to the second support-die bonding pad;

a through-die connection structure contacting the second-memory-die bonding pad, extending through the first memory die, and including at least one conductive via structure;

a first-memory-die backside bonding pad located in, or on, the first memory die and contacting the through-die connection structure;

a second-memory-die bonding pad located in, or on, the second memory die and bonded to the first-memory-die backside bonding pad; and a subset of second-memory-die metal interconnect structures formed in the second memory die and contacting the respective one of the second bit lines.

7. The bonded assembly of claim 6, wherein the at least one conductive via structure of the through-die connection structure comprises a through-memory-level via structure that extends through each first electrically conductive layer within the first alternating stack as a single structure having a straight sidewall from a bottom surface to a top surface.

8. The bonded assembly of claim 1, further comprising:
an external bonding pad located on a backside of the second memory die; and
an electrically conductive path between an input node or an output node of the peripheral circuitry and the external bonding pad, wherein the electrically conductive path extends through the first memory die and the second memory die.

9. The bonded assembly of claim 8, wherein the electrically conductive path comprises:
a subset of support-die metal interconnect structures formed in the support die;
a support-die bonding pad connected to the subset of support-die metal interconnect structures;
a first-memory-die bonding pad located in, or on, the first memory die and bonded to the support-die bonding pad;
a first through-die connection structure contacting the first-memory-die bonding pad, extending through the first memory die, and including at least one first conductive via structure;
a first-memory-die backside bonding pad located in, or on, the first memory die and contacting the first through-die connection structure;
a second-memory-die bonding pad located in, or on, the second memory die and bonded to the first-memory-die backside bonding pad; and
a second through-die connection structure contacting the second-memory-die bonding pad, extending through the second memory die, and including at least one second conductive via structure, and contacting the external bonding pad.

10. The bonded assembly of claim 1, wherein:
the array of first memory stack structures comprises a two-dimensional array of first memory stack structures, wherein each of the first memory stack structures comprises a respective first vertical semiconductor channel and a respective first vertical stack of first memory elements located at each level of the first electrically conductive layers; and
the array of second memory stack structures comprises a two-dimensional array of second memory stack structures, wherein each of the second memory stack structures comprises a respective second vertical semiconductor channel and a respective second vertical stack of first memory elements located at each level of the second electrically conductive layers.

11. The bonded assembly of claim 1, wherein the respective first switch transistor and the respective second switch transistor are configured such that only one of the respective first switch transistor and the respective second switch transistor is turned on during operation of a respective sense amplifier to which the respective first switch transistor and the respective second switch transistor are connected.

12. The bonded assembly of claim 1, wherein the first switch transistors and the second switch transistors are configured to electrically connect only one set of bit lines selected from a set of the first bit lines and a set of the second bit lines to the plurality of sense amplifiers during operation of the plurality of sense amplifiers.

13. The bonded assembly of claim 12, wherein the peripheral circuitry is configured to perform a programming operation, a sense operation, and an erase operation while the first switch transistors and the second switch transistors electrically connect only one set of bit lines selected from the set of the first bit lines and the set of the second bit lines to the plurality of sense amplifiers.

14. A method of operating the bonded assembly of claim 1, comprising:
turning on a set of transistor switches selected from a first set of the first switch transistors and a second set of the second switch transistors, wherein one set of bit lines selected from a set of the first bit lines and a set of the second bit lines is electrically connected to the plurality of sense amplifiers; and
performing an operation selected from a programming operation, a sense operation, and an erase operation to memory elements accessed by the selected set of bit lines.

* * * * *